US009312820B2

(12) United States Patent
Mostov et al.

(10) Patent No.: US 9,312,820 B2
(45) Date of Patent: Apr. 12, 2016

(54) CMOS BASED TX/RX SWITCH

(71) Applicant: DSP Group, LTD., Herzeliya (IL)

(72) Inventors: Alexander Mostov, Rishon Letzion (IL); Yaron Hasson, Elad (IL); Ron Pongratz, Tel Aviv (IL); Sharon Betzalel, Ashkelon (IL)

(73) Assignee: DSP GROUP LTD., Herzeliya (IL)

( * ) Notice: Subject to any disclaimer, the term of this patent is extended or adjusted under 35 U.S.C. 154(b) by 8 days.

(21) Appl. No.: 14/034,175

(22) Filed: Sep. 23, 2013

(65) Prior Publication Data

US 2014/0087673 A1 Mar. 27, 2014

Related U.S. Application Data

(60) Provisional application No. 61/704,510, filed on Sep. 23, 2012, provisional application No. 61/705,150, filed on Sep. 25, 2012, provisional application No. 61/720,001, filed on Oct. 30, 2012, provisional application No. 61/726,699, filed on Nov. 15, 2012, provisional application No. 61/726,717, filed on Nov. 15, 2012, provisional application No. 61/727,120, filed on Nov. 16, 2012, provisional application No. 61/727,121, filed on Nov. 16, 2012.

(51) Int. Cl.
*H04B 1/44* (2006.01)
*H04B 1/00* (2006.01)
*H04B 1/38* (2015.01)
(Continued)

(52) U.S. Cl.
CPC .............. *H03F 1/565* (2013.01); *H01F 19/04* (2013.01); *H01F 27/2804* (2013.01); *H01F 27/29* (2013.01); *H01F 38/00* (2013.01); *H01F 38/14* (2013.01); *H02M 3/04* (2013.01); *H03F 1/0227* (2013.01); *H03F 1/0261* (2013.01); *H03F 3/19* (2013.01); *H03F 3/193* (2013.01); *H03F 3/195* (2013.01); *H03F 3/21* (2013.01); *H03F 3/211* (2013.01); *H03F 3/213* (2013.01); *H03F 3/45179* (2013.01); *H03F 3/68* (2013.01); *H04B 1/44* (2013.01); *H03F 2200/102* (2013.01); *H03F 2200/105* (2013.01); *H03F 2200/387* (2013.01); *H03F 2200/451* (2013.01); *H03F 2200/534* (2013.01); *H03F 2200/537* (2013.01);
(Continued)

(58) Field of Classification Search
USPC .................................... 455/78, 82, 83, 550.1
See application file for complete search history.

(56) References Cited

U.S. PATENT DOCUMENTS 5,917,362 A 6/1999 Kohama
5,945,867 A 8/1999 Uda et al.
(Continued)

FOREIGN PATENT DOCUMENTS

CN 101090280 12/2007
CN 101414852 4/2009
(Continued)

*Primary Examiner* — Andrew Wendell
(74) *Attorney, Agent, or Firm* — Reches Patents

(57) ABSTRACT

A novel and useful radio frequency (RF) front end module (FEM) circuit that provides high linearity and power efficiency and meets the requirements of modern wireless communication standards such as 802.11 WLAN, 3G and 4G cellular standards, Bluetooth, ZigBee, etc. The configuration of the FEM circuit permits the use of common, relatively low cost semiconductor fabrication techniques such as standard CMOS processes. The FEM circuit includes a power amplifier made up of one or more sub-amplifiers having high and low power circuits and whose outputs are combined to yield the total desired power gain. An integrated multi-tap transformer having primary and secondary windings arranged in a novel configuration provide efficient power combining and transfer to the antenna of the power generated by the individual sub-amplifiers.

18 Claims, 51 Drawing Sheets

(51) Int. Cl.
*H03F 1/56* (2006.01)
*H01F 38/14* (2006.01)
*H03F 3/213* (2006.01)
*H03F 3/195* (2006.01)
*H02M 3/04* (2006.01)
*H01F 27/28* (2006.01)
*H01F 27/29* (2006.01)
*H01F 38/00* (2006.01)
*H03F 3/19* (2006.01)
*H03F 3/21* (2006.01)
*H03F 3/68* (2006.01)
*H03F 3/193* (2006.01)
*H01F 19/04* (2006.01)
*H03F 1/02* (2006.01)
*H03F 3/45* (2006.01)

(52) U.S. Cl.
CPC ........... *H03F 2200/541* (2013.01); *Y02B 60/50* (2013.01)

(56) References Cited

U.S. PATENT DOCUMENTS

| | | | |
|---|---|---|---|
| 6,281,762 B1* | 8/2001 | Nakao et al. | 333/103 |
| 6,560,443 B1 | 5/2003 | Vaisanen et al. | |
| 7,512,388 B2 | 3/2009 | Snider | |
| 7,590,390 B2 | 9/2009 | Weber et al. | |
| 7,848,712 B2 | 12/2010 | Fu et al. | |
| 8,787,964 B2 | 7/2014 | Soman | |
| 8,886,136 B1* | 11/2014 | Signoff et al. | 455/78 |
| 2003/0190895 A1* | 10/2003 | Mostov et al. | 455/78 |
| 2004/0085118 A1 | 5/2004 | Numata | |
| 2005/0107043 A1* | 5/2005 | Avasarala et al. | 455/78 |
| 2005/0233706 A1* | 10/2005 | Takeda | 455/78 |
| 2005/0239415 A1* | 10/2005 | Sagae et al. | 455/78 |
| 2006/0035614 A1* | 2/2006 | Inui et al. | 455/307 |
| 2006/0073792 A1* | 4/2006 | Schoning et al. | 455/83 |
| 2006/0079275 A1 | 4/2006 | Ella et al. | |
| 2006/0189286 A1 | 8/2006 | Kyu et al. | |
| 2006/0195162 A1 | 8/2006 | Arx et al. | |
| 2006/0217078 A1* | 9/2006 | Glass et al. | 455/78 |
| 2007/0066345 A1 | 3/2007 | Hwang et al. | |
| 2007/0117523 A1 | 5/2007 | Weber et al. | |
| 2007/0190954 A1 | 8/2007 | Murakami et al. | |
| 2008/0129642 A1 | 6/2008 | Ahn et al. | |
| 2008/0160929 A1 | 7/2008 | Lee | |
| 2009/0298443 A1 | 12/2009 | Ta et al. | |
| 2010/0026906 A1 | 2/2010 | Okanobu | |
| 2010/0109796 A1* | 5/2010 | Park et al. | 333/103 |
| 2011/0002257 A1 | 1/2011 | Behzad et al. | |
| 2011/0084374 A1* | 4/2011 | Chen | 257/690 |
| 2011/0319042 A1 | 12/2011 | Soman et al. | |
| 2013/0244595 A1 | 9/2013 | Hasson et al. | |
| 2013/0252562 A1 | 9/2013 | Hasson et al. | |
| 2014/0327495 A1* | 11/2014 | He et al. | 333/103 |

FOREIGN PATENT DOCUMENTS

| | | |
|---|---|---|
| CN | 201409119 | 2/2010 |
| CN | 101714852 | 5/2010 |
| CN | 101807883 | 8/2010 |
| CN | 201571031 | 9/2010 |
| CN | 101895265 | 11/2010 |
| CN | 101931387 | 12/2010 |
| CN | 102096079 | 6/2011 |
| CN | 201887738 | 6/2011 |
| CN | 102340288 | 2/2012 |
| CN | 102611394 | 7/2012 |
| CN | 102684616 | 9/2012 |
| WO | WO2011154860 | 12/2011 |

* cited by examiner

CMOS BASED TX/RX SWITCH

REFERENCE TO PRIORITY APPLICATIONS

This application claims priority to U.S. Application Ser. No. 61/704,510, filed Sep. 23, 2012, entitled "An Integrated Transformer," U.S. Application Ser. No. 61/705,150, filed Sep. 25, 2012, entitled "A Method and System for Noise Reduction in Wireless Communication," U.S. Application Ser. No. 61/720,001, filed Oct. 30, 2012, entitled "System and Method for Radio Frequency Signal Amplification," U.S. Application Ser. No. 61/726,699, filed Nov. 15, 2012, entitled "DC DC Converter with Fast Output Voltage Transitions," U.S. Application Ser. No. 61/726,717, filed Nov. 15, 2012, entitled "High-Efficiency Envelop Tracking Method and System Utilizing DC-DC Converter With Fast Output Voltage Transitions," U.S. Application Ser. No. 61/727,120, filed Nov. 16, 2012, entitled "A Method and Device for Self Aligned PA and LNA VSWR Out/In Improvement, Dynamically Adjust to Antenna," U.S. Application Ser. No. 61/727,121, filed Nov. 16, 2012, entitled "A Method and Device for Self Aligned Linearity Driven LNA Improvement," all of which are incorporated herein by reference in their entirety.

FIELD OF THE INVENTION

The present invention relates to the field of radio frequency (RF) circuits, and more particularly relates to an RF front end module (FEM) circuit having a high linearity and efficient power amplifier.

BACKGROUND OF THE INVENTION

Currently, wireless communications systems find application in many contexts involving the transfer of information transfer from one point to another, and there exists a wide range of modalities suited to meet the particular needs of each. These systems include cellular telephones and two-way radios for distant voice communications, as well as shorter-range data networks for computer systems, among many others. Generally, wireless communications involve a radio frequency (RF) carrier signal that is modulated to represent data and the modulation, transmission, receipt and demodulation of the signal conforming to a set of standards. For wireless data networks, example standards include Wireless LAN (IEEE 802.11), Bluetooth (IEEE 802.15.1), and ZigBee (IEEE 802.15.4), which are generally time domain duplex systems where a bidirectional link is emulated on a time divided communications channel.

A fundamental component of a wireless communications system is the transceiver which includes the transmitter and receiver circuitry. The transceiver, with its digital baseband subsystem, encodes the digital data to a baseband signal and modulates the baseband signal with an RF carrier signal. The modulation utilized for WLAN includes orthogonal frequency division multiplexing (OFDM), quadrature phase shift keying (QPSK) and quadrature amplitude modulation (16 QAM, 64 QAM); for WLAN includes GFSK and 4/8-DQPSK; and for Zigbee includes BPSK and OQPSK (or MSK).

Upon receipt of the signal from the antenna, the transceiver downconverts the RF signal, demodulates the baseband signal and decodes the digital data represented by the baseband signal. The antenna connected to the transceiver converts the electrical signal to electromagnetic waves, and vice versa. Depending upon the particular configuration, the transceiver may include a dedicated transmit (TX) line and a dedicated receive (RX) line or the transceiver may have a combined transmit/receive line. In the case of separate TX and RX lines, the transmit line and the receive line are typically tied to a single antenna, particularly for low-cost and/or small-size applications.

The circuitry between the transceiver and the antenna is commonly referred to as the front end module (FEM). The FEM includes an RF power amplifier (PA) which generates output transmit signals by amplifying weaker input signals in wireless devices, such as cellular telephone handsets. Many of these communication devices are configured to operate in different frequency bands for different communication systems. For example, third generation (3G) cellular communication systems, 4G cellular (LTE) systems, 802.11 WLAN systems, etc.

It is thus desirable to have a front end module capable of meeting the performance requirements of modern wireless standards such as 802.11, 3G and 4G cellular systems while reducing manufacturing complexities, size and cost.

SUMMARY OF THE INVENTION

The present invention is a novel and useful radio frequency (RF) front end module (FEM) circuit that provides high linearity and power efficiency and meets the requirements of modern wireless communication standards such as 802.11 WLAN, 3G and 4G cellular standards, Bluetooth, ZigBee, etc. The configuration of the FEM circuit permits the use of common, relatively low cost semiconductor fabrication techniques such as standard CMOS processes. The FEM circuit includes a dual mode power amplifier that is made up of one or more sub-amplifiers whose outputs are combined to yield the total desired power gain. A multi-tap transformer having primary and secondary windings arranged in a novel configuration provide efficient power combining and transfer to the antenna of the power generated by the individual sub-amplifiers.

There is thus provided in accordance with the invention, a semiconductor antenna switch, comprising a first antenna port for coupling to a first antenna, a second antenna port for coupling to a second antenna, a transmit/receive port for coupling to either said first antenna or said second antenna, a matching network coupled to said transmit/receive port, a first switch coupled in series between said first antenna port and said matching network, and a second switch coupled in series between said second antenna port and said matching network.

There is also provided in accordance with the invention, a semiconductor antenna switch, comprising a first antenna port for coupling to a first antenna, a second antenna port for coupling to a second antenna, a transmit/receive port for coupling a transmit RF signal to and a receive RF signal from either said first antenna or said second antenna, a first field effect transistor (FET) switch having source, drain and gate terminals, the drain terminal coupled to said first antenna port, the source coupled to said transmit/receive port, the gate terminal operative to receive a first enable signal for controlling said first FET switch, and a second field effect transistor (FET) switch having source, drain and gate terminals, the drain terminal coupled to said second antenna port, the source coupled to said transmit/receive port, the gate terminal operative to receive a second enable signal for controlling said second FET switch.

BRIEF DESCRIPTION OF THE DRAWINGS

The invention is herein described, by way of example only, with reference to the accompanying drawings, wherein.

DETAILED DESCRIPTION OF THE INVENTION

Figure 1:
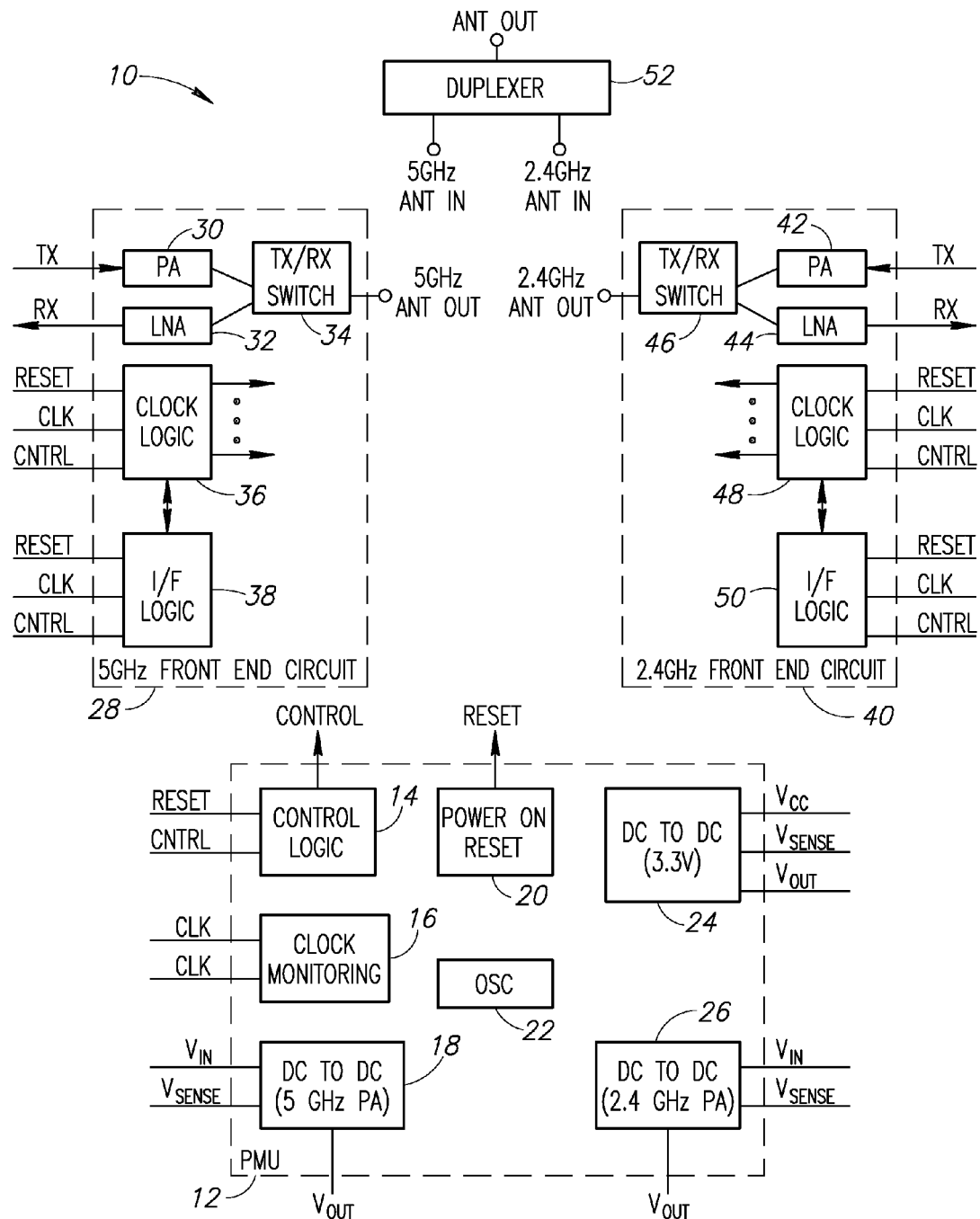
FIG. 1 is a block diagram illustrating an example dual-band multi-chip front end module (FEM) constructed in accordance with the present invention.

RF circuitry such as the transceiver is typically fabricated as integrated circuits typically using complementary metal-oxide semiconductor (CMOS) technology due to the miniature device size and lower cost. Small geometry CMOS devices have reduced current draw and require lower battery voltages thus being suitable for portable applications that have substantial power consumption limitations. Wireless communication links must be reliable and have high data throughput over wide distances which necessitate higher power levels at the antenna output. For instance, the aforementioned Wireless LAN and Bluetooth typically require power levels of 20 dBm (i.e. 100 mW) or more.

Higher power output, however, requires higher current and voltage levels in the RF circuitry. Many CMOS devices are currently produced with a 0.18-micron process with advanced systems utilizing 130 nm, 90 nm, 65 nm, and 45 nm processes. The resulting integrated circuits have operating voltages in the range of 1.8 V to lower than 1.2 V because of the reduced break down voltages of the semiconductor devices therein. Power levels of +20 dBm at 1.8 V have been difficult to achieve particularly for signals having envelope variations which is the case with OFDM, QPSK, QAM, etc. Increasing power requirements typically leads to decreased efficiency because of a greater proportion of power being lost as heat with subsequent decreased battery life. In addition, the impedance is lowered for the same power level with increased current. Considering that most RF circuits are designed to have 50 Ohm impedance the design of matching circuits for decreased impedance is also problematic due to increased power losses.

Conventional transceivers for cellular, WLAN, Bluetooth, ZigBee, etc. typically do not generate sufficient power or have sufficient RX sensitivity necessary for reliable communications in many scenarios. Current integrated circuit transceiver devices have transmit power levels of below 0 dBm, though there are some devices that have power levels of 10 or 20 dBm, which is still less than the desired 20-25 dBm. Accordingly, additional conditioning of the RF signal is necessary.

The circuitry between the transceiver and the antenna is commonly referred to as the front end module or FEM. The FEM includes a power amplifier for increased transmission power and a low noise amplifier (LNA) for increased reception sensitivity. Various filter circuits such as band pass filters may also be included to provide a clean transmission signal at the antenna and to protect the reception circuitry from external blocking signals reaching the antenna. The FEM also includes an RF switch to rapidly switch between receive and transmit functions and to prevent interference during the transitions between transmission and reception. The RF switch can be controlled by a general purpose input/output line of the transceiver and/or via a control protocol agreed upon a priori. The RF switch is understood to be a single pole, double throw switch connecting a single antenna to either the input of the low noise amplifier or the output of the power amplifier. Transceivers with a shared transmit and receive line such as those used in connection with Bluetooth and ZigBee systems generally include a second RF switch at the input of the power amplifier and the output of the low noise amplifier for the proper control of transmit and receive lines at the transceiver end. The second RF switch, which enhances TX/RX isolation, can be controlled by the same general purpose input/output line of the transceiver that controls the first RF switch. The power amplifier may also be turned on or off by an enable output from the transceiver. The enable line may have varying voltages to control gain or setting the power amplifier bias current.

Interrelated performance, fabrication, and cost issues have necessitated the fabrication of the RF switch on a different substrate than the substrate of the power amplifier and the low noise amplifier. Power amplifiers are typically fabricated on a gallium arsenide (GaAs) substrate which provides high breakdown voltages and reliability. Other substrates such as silicon germanium (SiGe) may also be utilized. In addition, the power amplifier can utilize hetero-junction bipolar transistors (HBT), metal-semiconductor field effect transistors (MESFET) or high electron mobility transistors (HEMT) with the HBT being the least costly to fabricate. The low noise amplifier may also be fabricated on a GaAs substrate with HBT transistors. Due to high insertion loss or low isolation, however, an RF switch using HBT transistors suffers from poor performance characteristics.

One solution to the above issues comprises using a multi-die configuration in which the power amplifier and the low noise amplifier are fabricated on one die using HBT transistors while the RF switch is fabricated on another die using, e.g., HEMT transistors. Both of the dies are then encapsulated in a single package. The added costs associated with the GaAs substrate as compared to conventional silicon substrates and the complex packaging process further elevates the cost of the front end module circuit. Another solution is directed to a composite GaAs substrate having both HBT and HEMT transistors for the power amplifier and the low noise amplifier and the RF switch. Such integrated circuits are, however, costly to manufacture. Alternatively, a silicon substrate can be used for the low noise amplifier, the power amplifier and the RF switch. Because of poor isolation associated with silicon substrates, however, higher cost solutions such as silicon on insulator (SOI) may be used. These integrated circuits typically require a negative voltage generator, which results in a larger die for the bias circuitry. In addition, spurious signals over a wide frequency range emitted by a charge pump for the negative voltage generator necessitates a physical separation that further increases die size.

The present invention provides an FEM circuit that addresses the issues identified above. The FEM circuit of the present invention provides high linearity and power efficiency and meets the requirements of modern wireless communication standards such as 802.11 WLAN, 3G and 4G cellular standards, etc. In addition, the configuration of the FEM circuit permits the use of common, relatively low cost semiconductor fabrication techniques such as commercially available CMOS processes.

A block diagram illustrating an example dual-band multi-chip front end module (FEM) constructed in accordance with the present invention is shown in FIG. 1. The dual band FEM module, generally referenced 10, comprises four modules including a duplexer 52, 2.4 GHz FEM circuit module 40, 5 GHz FEM circuit module 28 and power management unit (PMU) module 12. The 2.4 GHz FEM circuit 28 is operative to receive and transmit signals in the 2.4 GHz ISM band while the 5 GHz FEM circuit is operative to receive and transmit signals in the 5 GHz ISM band. Each of the modules may be constructed on individual integrated circuits with printed or wire bond connections between the chips. Alternatively, the FEM module may comprise a single integrated circuit and/or may handle a single frequency band.

The duplexer 52 functions to couple one or more antennas to the 2.4 and 5 GHz antenna ports. The PMU 12, which is optional in the circuit, may comprise part or all the following: a DC-DC converter 24 (e.g., 3.3V), power on reset circuit 20, oscillator circuit 22 for generating clock signals, biasing circuits and RF power ramp-up control, DC-DC converter circuit 26 for the 2.4 GHz power amplifier (PA), DC-DC converter circuit 18 for the 5 GHz PA, clock monitoring circuit 18 and control logic 14.

The 2.4 GHz FEM circuit module 40 comprises a TX/RX switch 46, power amplifier circuit 42, low noise amplifier (LNA) circuit 44, control logic 48 and interface (I/F) logic 50. The PA 42 functions to amplify the TX signal output of the baseband circuit for broadcast through the antenna. The LNA 44 functions to amplify the receive signal received from the antenna and output an RX signal for demodulating and decoding by the baseband circuit.

Similarly, the 5 GHz FEM circuit module 28 comprises a TX/RX switch 34, power amplifier circuit 30, low noise amplifier (LNA) circuit 32, control logic 36 and interface (I/F) logic 38. The PA 30 functions to amplify the TX signal output of the baseband circuit for broadcast through the antenna. The LNA 32 functions to amplify the receive signal received from the antenna and output an RX signal for demodulating and decoding by the baseband circuit.

Figure 2:
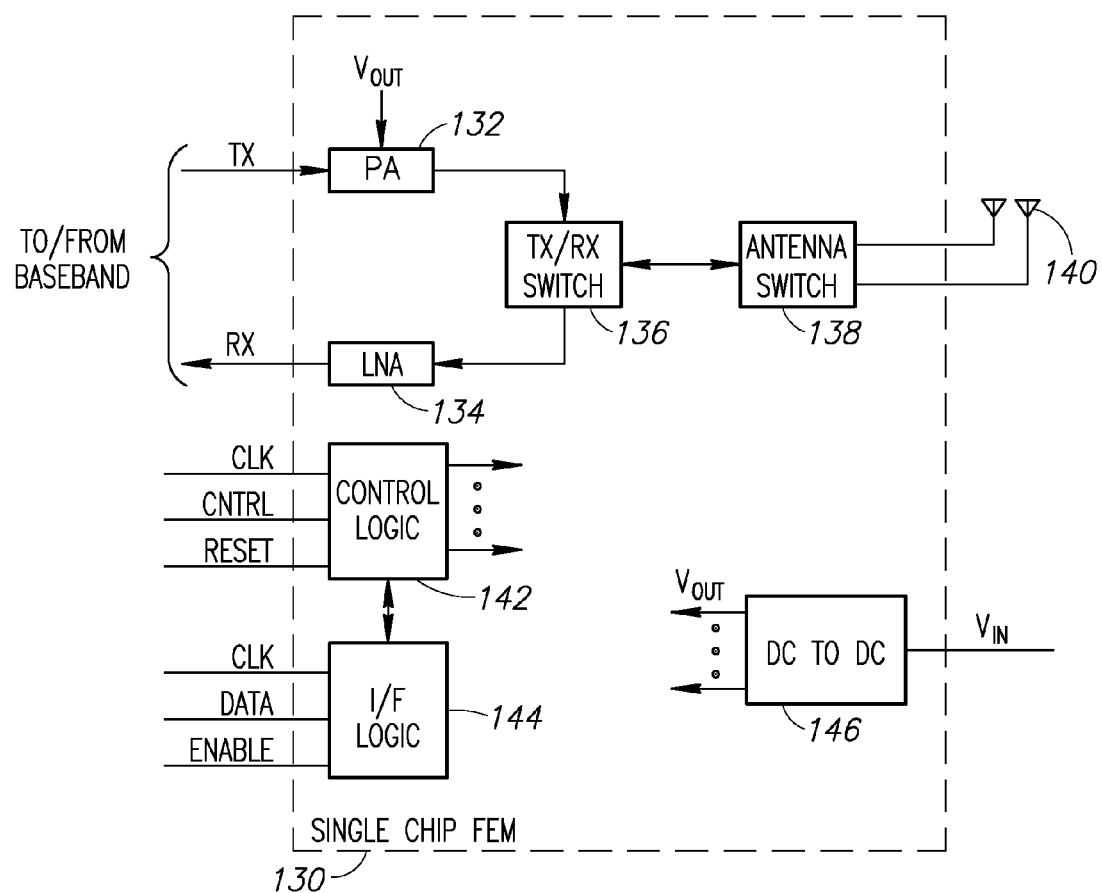
FIG. 2 is a block diagram illustrating an example single chip FEM circuit constructed in accordance with the present invention.

A block diagram illustrating an example single chip FEM circuit constructed in accordance with the present invention is shown in FIG. 2. The single chip FEM circuit, generally referenced 130, comprises a PA circuit 132 for amplifying a TX signal from the baseband circuit for broadcast through one or more antennas 140, an LNA circuit 134 for amplifying the received signal from one or more of the antennas and output an RX signal for demodulation and decoding by the baseband circuit, a TX/RX switch 136 for coupling either the PA or the LNA to the antenna, optional antenna switch 138 for coupling the TX/RX switch to one or more antennas 140, control logic 142, I/F logic 144 and DC-DC converter circuit 146.

Multiple antennas 140 may be used in a system employing spatial diversity for example. In a MIMO system, multiple antennas are employed but each antenna has its own associated FEM circuit where the combining of the multiple receive signals and generating of multiple transmit signals is performed via signal processing in the baseband circuit.

Figure 3:
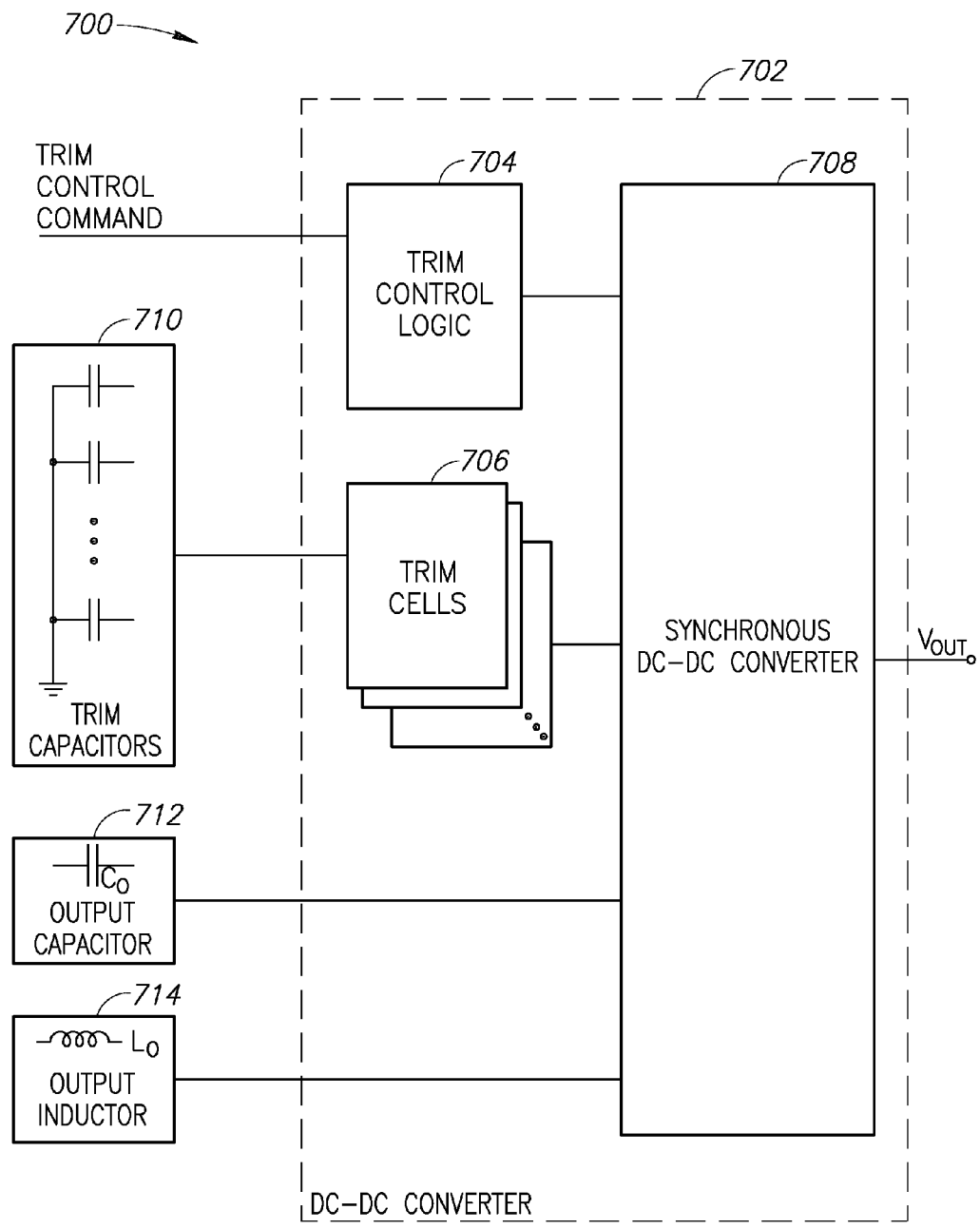
FIG. 3 is a block diagram illustrating an example DC-DC converter constructed in accordance with the present invention.

A block diagram illustrating an example DC-DC converter constructed in accordance with the present invention shown in FIG. 3. The DC-DC converter circuit, generally referenced 700, comprises a synchronous DC-DC converter 708, trim control logic 704, one or more trim cells 706, one or more trim capacitors 710, one or more output capacitors 712 and one or more output inductors 714. The function of the DC-DC converter circuit is to generate an output voltage in accordance with a trim control command signal input to the trim control logic. An envelope detector (not shown) can be used to generate the trim control command such that the output voltage generated tracks the RF input signal. The operation of the DC-DC converter circuit is described in more detail infra.

Figure 4:
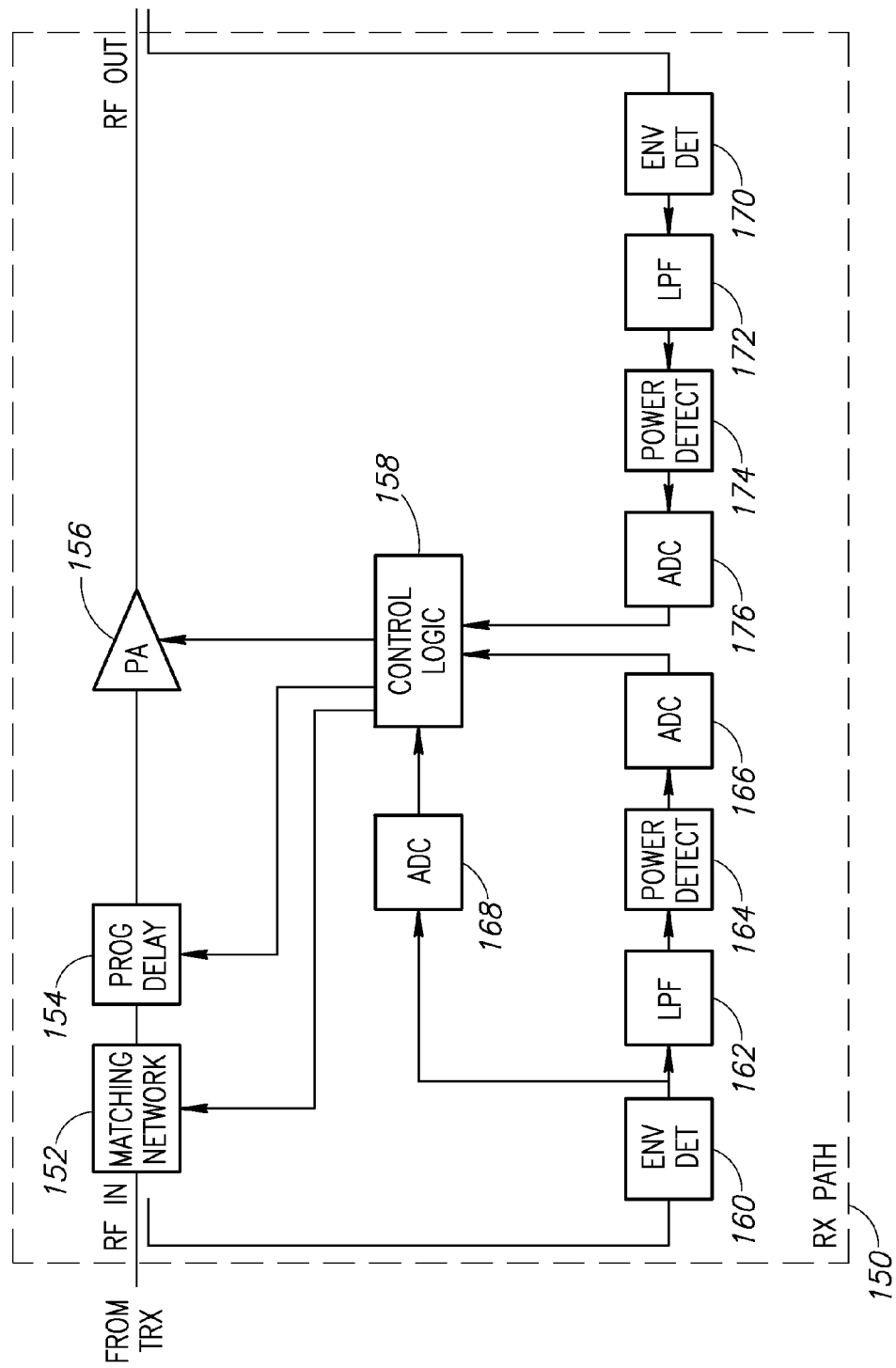
FIG. 4 is a block diagram illustrating an example RX path portion of the FEM circuit constructed in accordance with the present invention.

A block diagram illustrating an example TX path portion of the FEM circuit constructed in accordance with the present invention is shown in FIG. 4. The TX path circuit, generally referenced 150, comprises a matching network 152 that receives the RF input signal from the transmitter or transceiver (TRX), a programmable delay 154, PA 156 for generating an RF output, control logic block 158, envelope detectors 160, 170, low pass filters (LPF) 162, 172, power detectors 164, 174, and analog to digital converters (ADC) 166, 176.

In this example embodiment, envelope detection is used on both the RF input and the RF output to optimize the operation of the PA. The RF input signal is tracked and the gain and optionally other parameters of the PA are adjusted (via control logic block 158) to maximize linearity and minimize power consumption of the circuit.

Figure 5:
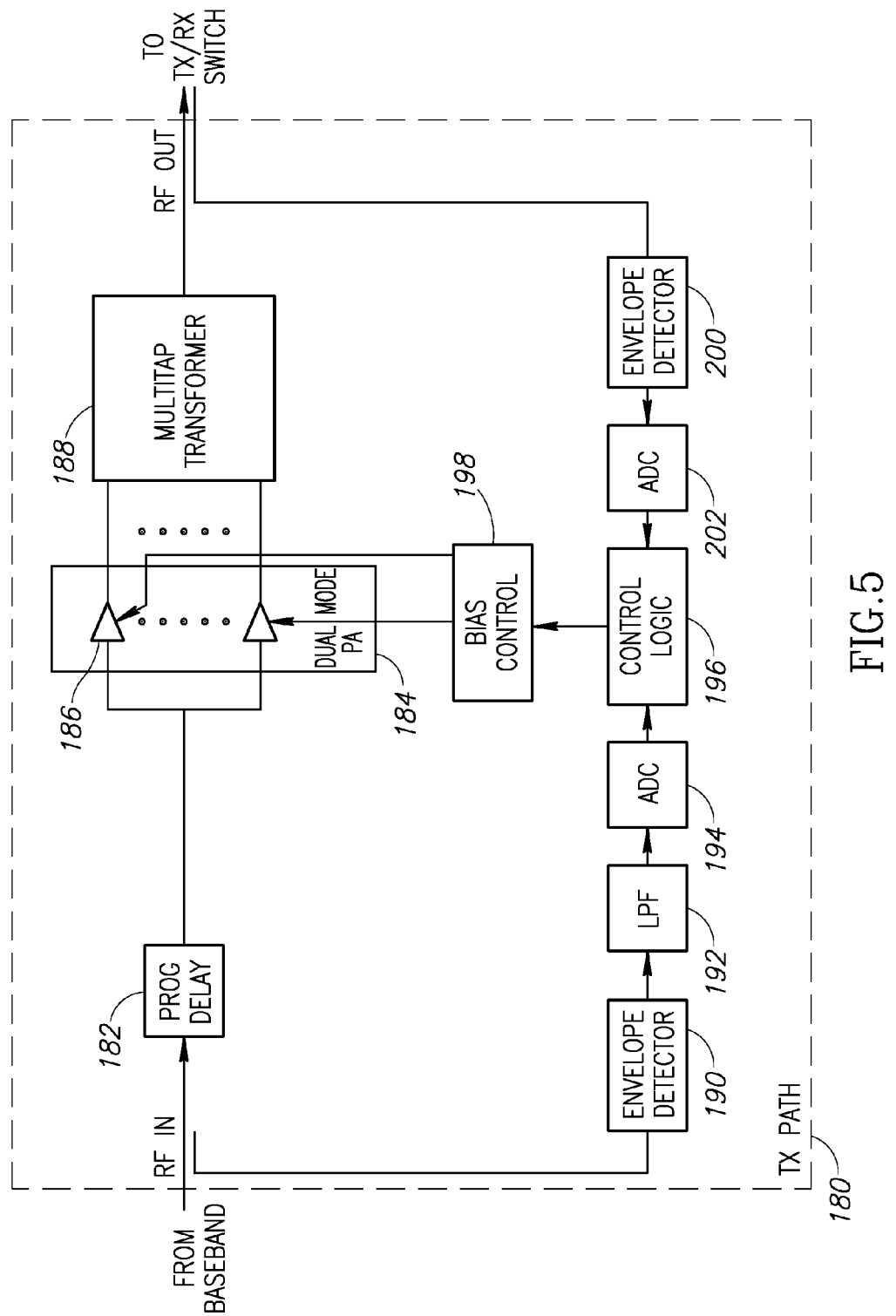
FIG. 5 is a block diagram illustrating a first example TX path portion of the FEM circuit.

A block diagram illustrating a first example TX path portion of the FEM circuit is shown in FIG. 5. The TX path, generally referenced 180, comprises a programmable delay 182, dual mode power amplifier circuit 184, multi-tap transformer 188, mode/bias control 198, envelope detectors 190, 200, LPF 192, ADC 194, 202 and control logic 196.

Figure 41:
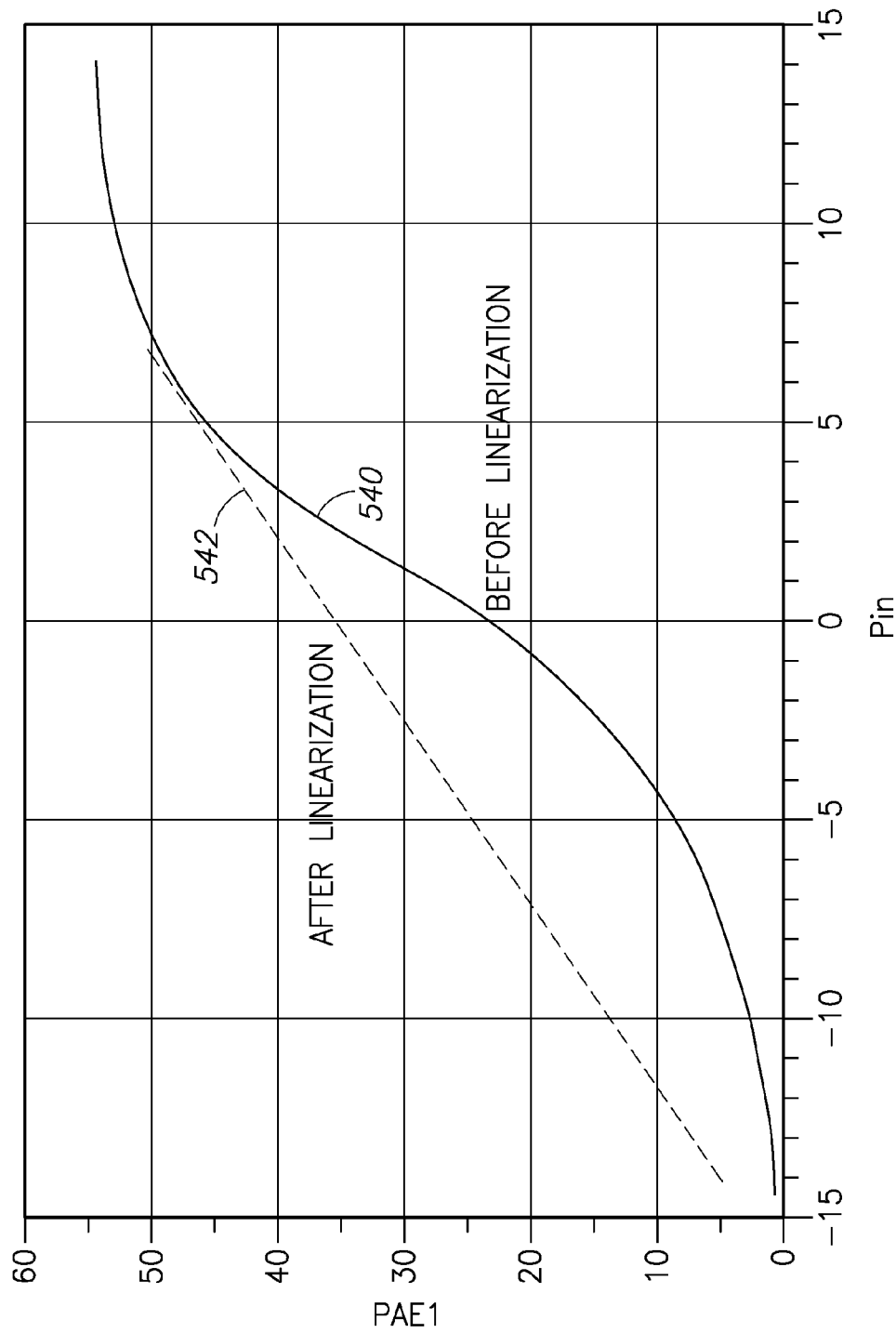
FIG. 41 is a graph illustrating the linearization achieved by the power amplifier circuit of the present invention.

In this example embodiment, envelopment detection is used to track both the RF input and the RF output signals. The envelope signals generated are used to configure one or more parameters of operation of the dual mode PA 184 to maximize linearity, gain, etc. and minimize power consumption. The operation of the dual mode PA is described in more detail infra. In operation, the feed-forward algorithm performs envelope detection at the input to the power amplifier. The A/D converter samples the envelope signal. Digital control logic functions to drive the PA bias control in accordance with the envelope level, enabling the appropriate PA transistors the output of which are combined via a multi-tap transformer. The programmable delay functions to compensate for the delay between the envelope detector and the RF signal path. The use of a feed-forward algorithm enables a significant improvement in efficiency as shown in FIG. 41 where trace 540 represents the power added efficiency (PAE) before linearization by the feed-forward algorithm of FIG. 5 and trace 542 represents the PAE after linearization.

The modulation generated by many modern wireless standards, such as 802.11 and 802.11ac in particular, results in a signal with relatively large peak to average ratios. Considering, for example, orthogonal frequency division modulation (OFDM), the peak to average ratio increases as the number of subcarriers increases and is in the order of 20 log (number of subcarriers). OFDM modulation using 256 subcarriers, for example, can generate 10-12 dB peak to average ratio. In addition, within each subcarrier, using 256 QAM requires relatively good error vector magnitude (EVM), e.g., −32 dB. Noise, distortion, spurious signals, IQ mismatch and phase noise of the PLL, power amplifier nonlinearity, adjacent channel leakage ratio (ACLR) all degrade the EVM. Thus the linearity requirements on the power amplifier and FEM circuit over all are relatively stringent. In addition, it is desirable to minimize the battery consumption thus requiring the FEM circuit to have a high efficiency.

Further, in one embodiment, it is desirable to construct the FEM circuit using standard complementary metal oxide semiconductor (CMOS) integrated circuit technology. Alternatively, the FEM circuit may be fabricated using any suitable semiconductor technology such as Gallium Arsenide (GaAs), Silicon Germanium (SiGe), Indium Gallium Phosphide (InGaP), Gallium Nitride (GaN), etc. Using CMOS technology, however, is desirable due to lower cost and complexity and the ability to integrate digital logic with analog circuitry.

In one embodiment, the power amplifier circuit 184 is constructed from a plurality of sub-power amplifiers or sub-amplifiers 186. The input signal is split and fed to each of the sub-amplifiers, which provides a portion of the total desired gain of the power amplifier. The outputs of each of the sub-amplifiers are combined to generate the RF output signal. In one embodiment, the combiner element comprises a multi-tap transformer an example of which is described in more detail infra.

In operation, the envelope detector 190 senses the RF input and generates an envelope representation of the signal that is then filtered and digitized and input to the control logic circuit 196. The RF output is similarly sensed and a digitized envelope representation of the signal is generated and input to the control logic circuit 196. The biasing of the sub-amplifiers 186 is controlled by bias control circuit 198, which is driven by one or more control signals from the control logic 196. The programmable delay compensates for the signal delay through the envelope detector and digitization steps.

Figure 6:
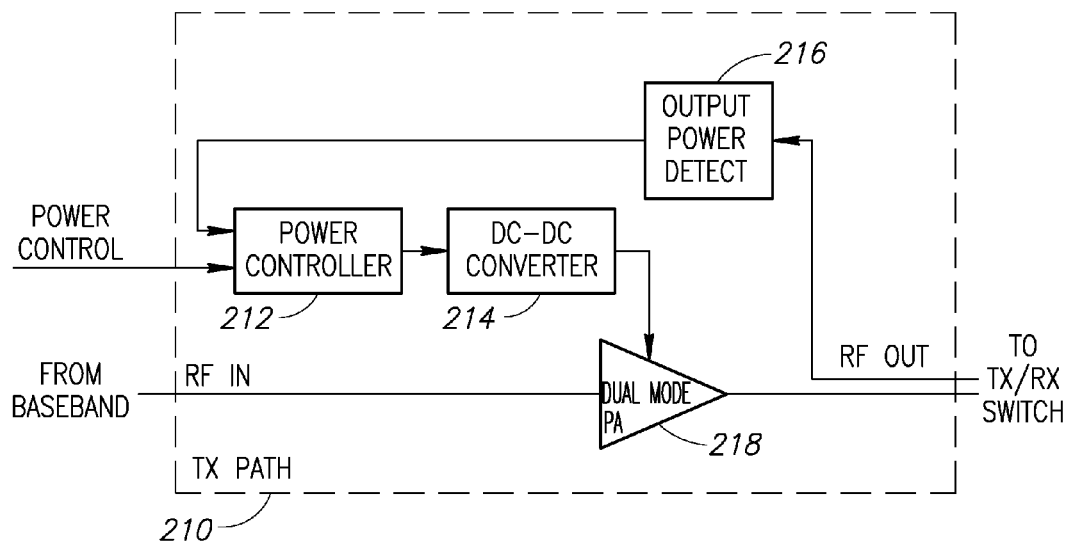
FIG. 6 is a block diagram illustrating a second example TX path portion of the FEM circuit.

A block diagram illustrating a second example TX path portion of the FEM circuit is shown in FIG. 6. The TX path, generally referenced 210, comprises a dual mode power amplifier 218, power controller 212, DC-DC converter 214 and output power detect circuit 216 which functions to sense the RF output.

In this embodiment, the gain of the power amplifier is controlled by a power control signal. In response to the power control signal and the output power level, the power controller generates a control signal for the DC-DC converter, which modulates the supply voltage of the power amplifier. The power amplifier 218 may comprise one or more sub-amplifiers depending on the implementation.

Figure 7:
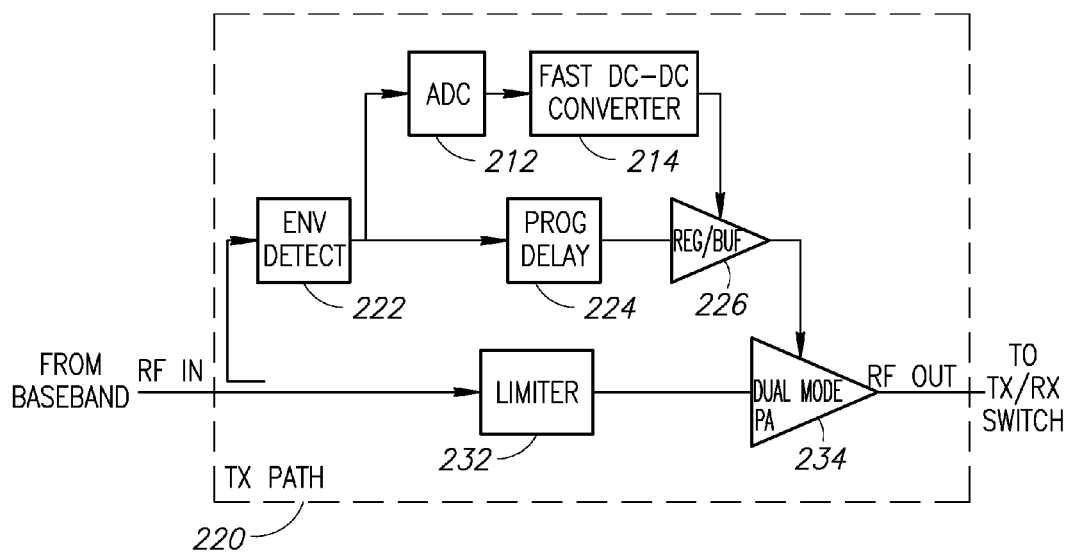
FIG. 7 is a block diagram illustrating a third example TX path portion of the FEM circuit.

A block diagram illustrating a third example TX path portion of the FEM circuit is shown in FIG. 7. The TX path, generally referenced 220, comprises a limiter 232, dual mode power amplifier 234, envelope detector 222, programmable delay 224, regulator/buffer 226, ADC 228 and fast DC-DC converter 230. In operation, the circuit amplifies the TX signal in a polar manner where a limited TX signal with amplitude striped out is input to the PA. The gain of the PA is controlled and modulated to track the amplitude of the original TX signal. The RF input is sensed and the envelope generated and digitized by ADC 228. The fast DC-DC converter drives a regulator or buffer circuit 226 to generate the gain (or power supply) of the PA 234. The power amplifier 234 may comprise one or more sub-amplifiers depending on the implementation.

Figure 8:
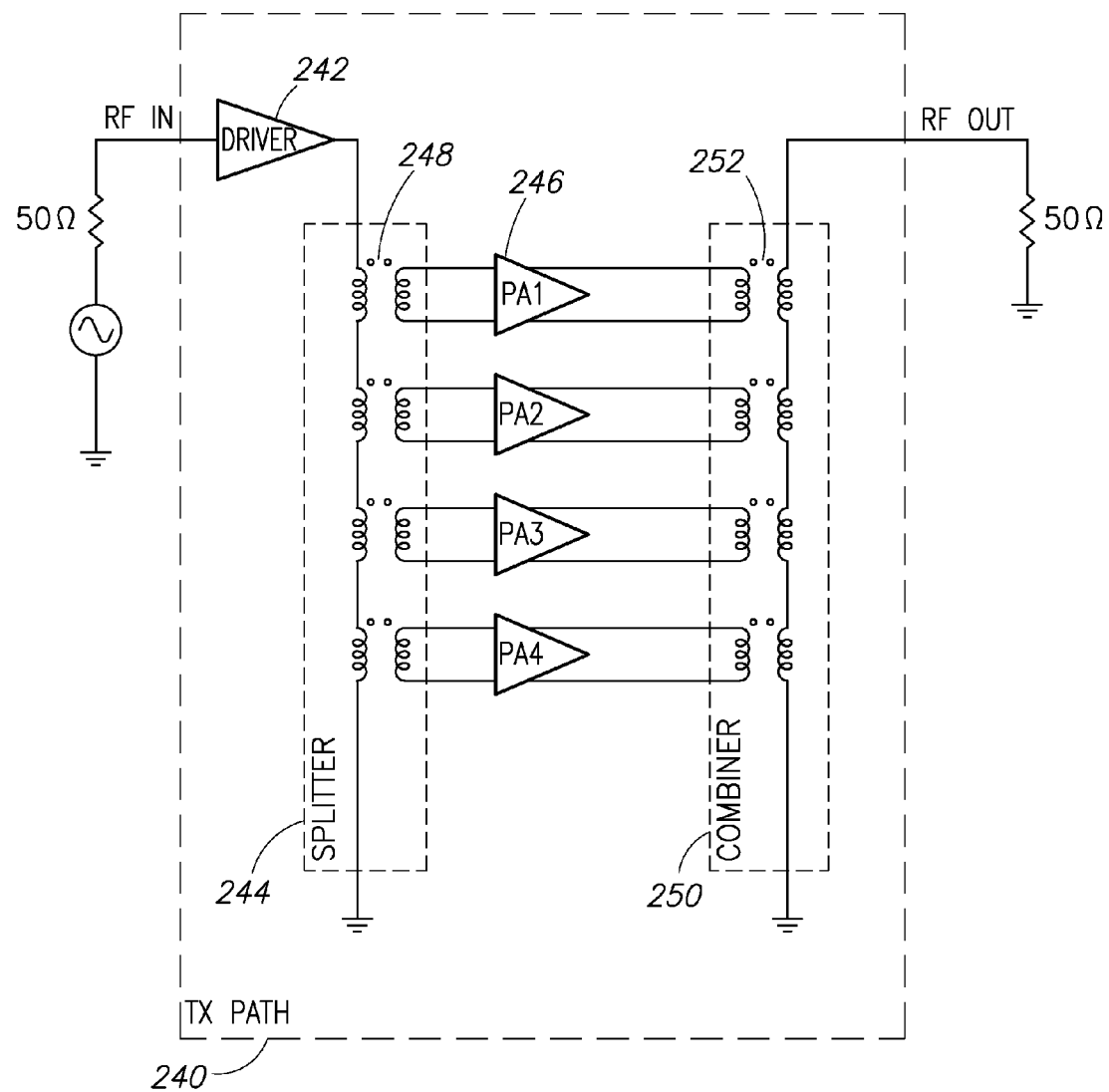
FIG. 8 is a block diagram illustrating a fourth example TX path portion of the FEM circuit.

A block diagram illustrating a fourth example TX path portion of the FEM circuit is shown in FIG. 8. The TX path, generally referenced 240, comprises a driver circuit/buffer 242, power splitter 244, one or more differential sub-amplifiers 246 and power combiner 250. In operation, the RF input signal is input to a driver circuit whose output is input to the splitter. The splitter functions to provide an input signal to each of the sub-amplifiers 246. In one embodiment, the splitter comprises a multi-tap transformer 248 having a primary winding and multiple secondary windings, one secondary for each sub-amplifier. Each sub-amplifier may be adapted to handle either a differential (shown) or single ended input signal. The differential output of each sub-amplifier is coupled to a corresponding primary winding of a multi-tap combiner transformer 252. The output signal is generated in the secondary winding and provides the RF output of the TX path circuit. Note that the impedance of each winding tap is adapted to be approximately 12.5 Ohm to yield a desired RF output impedance of approximately 50 Ohm.

In operation, the RF output signal is generated from the combination of the individual outputs of the sub-amplifiers. Each sub-amplifier contributes a portion of the total power required from the power amplifier circuit. The power generated by each sub-amplifier is combined via the combiner multi-tap transformer to generate the RF output signal having a combined total RF power.

Note that differential amplifiers (or balanced amplifiers) are preferable in that they enable a doubling of the voltage swing that can be applied to a balanced load. This quadruples the output power without incurring any additional stress on the transistors. Thus, an efficient power amplifier is realized utilizing differential sub-amplifier stages.

In one embodiment, both the splitter and combiner transformers are fabricated in CMOS and integrated on the same die with other analog and digital circuitry. In alternative embodiments, the transformers are fabricated using other technologies such as GaAs, InGaP, GaN, etc. The transformers comprise air cores and may take on any suitable shape and configuration. Several examples of integrated multi-tap transformers are described in more detail infra. Note that in one embodiment, the transformer is constructed to be relatively broadband so as to be able to both 2.4 and 5.8 GHz WLAN signals. Alternatively, a diplexer, constructed from two transformers and two band pass filters, one transformer and band pass filter for each frequency band. Note that the FEM circuit of the present invention is applicable to not only WLAN signal but any modulation scheme that exhibits high peak to average ratio, e.g., 3G, 4G LTE, etc.

Figure 9:
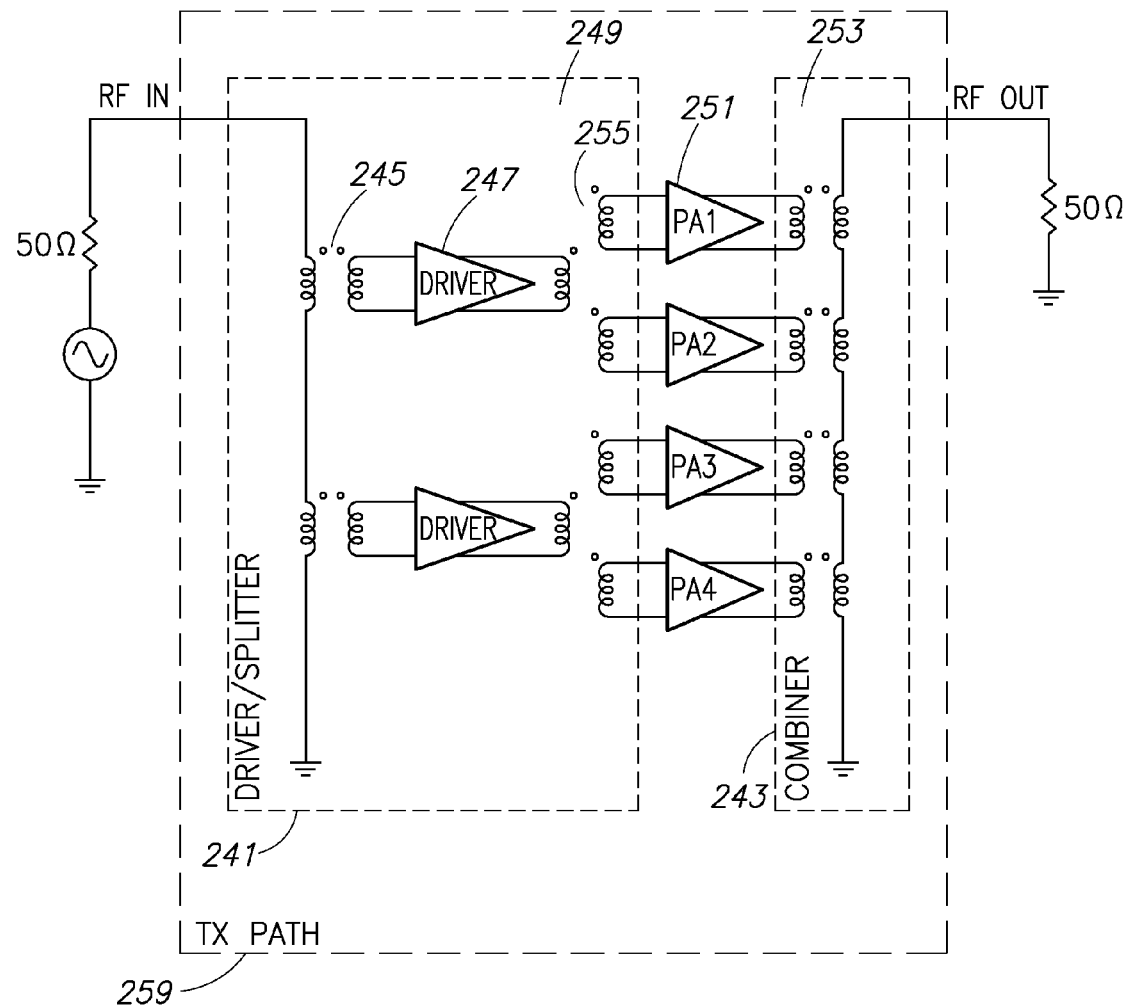
FIG. 9 is a block diagram illustrating a fifth example TX path portion of the FEM circuit.

A block diagram illustrating a fifth example TX path portion of the FEM circuit shown in FIG. 9. The TX path, generally referenced 259, comprises a driver/splitter circuit 241, one or more differential sub-amplifiers 251 and power combiner 243. The driver/splitter 241 comprises multi-tap transformer 245 having a primary winding and two secondary windings, one secondary winding for each differential driver 247. Multi-tap transformer 255 comprises a pair of one-to-two transformers each having a primary winding associated with driver 247 and secondary windings for two sub-amplifiers 251. The combiner 243 comprises a multi-tap transformer 253 having a primary winding associated with each sub-amplifier 251 and a secondary winding for generating the RF output signal.

In operation, the RF input signal is input to a driver circuit 241 that splits the RF input signal into two signals. Each of the signals is input to a driver 247 whose output is further split into two signals. The splitter functions to provide an input signal to each of the sub-amplifiers 251. In one embodiment, the splitter comprises transformers 245, 255 and driver circuit 247. Each sub-amplifier may be adapted to handle either a differential (shown) or single ended input signal. The differential output of each sub-amplifier is coupled to a corresponding primary winding of a multi-tap combiner transformer 253. The output signal is generated in the secondary winding and provides the RF output of the TX path circuit. Note that the impedance of each winding tap is adapted to be approximately 12.5 Ohm to yield a desired RF output impedance of approximately 50 Ohm.

In operation, the RF output signal is generated from the combination of the individual outputs of the sub-amplifiers. Each sub-amplifier contributes a portion of the total power required from the power amplifier circuit. The power generated by each sub-amplifier is combined via the combiner multi-tap transformer to generate the RF output signal having a combined total RF power.

In one embodiment, both the splitter and combiner transformers are fabricated in CMOS and integrated on the same die with other analog and digital circuitry. In alternative embodiments, the transformers are fabricated using other technologies such as GaAs, GaN, etc. The transformers comprise air cores and may take on any suitable geometrical shape and configuration. Several examples of integrated multi-tap transformers are described in more detail infra.

Figure 10:
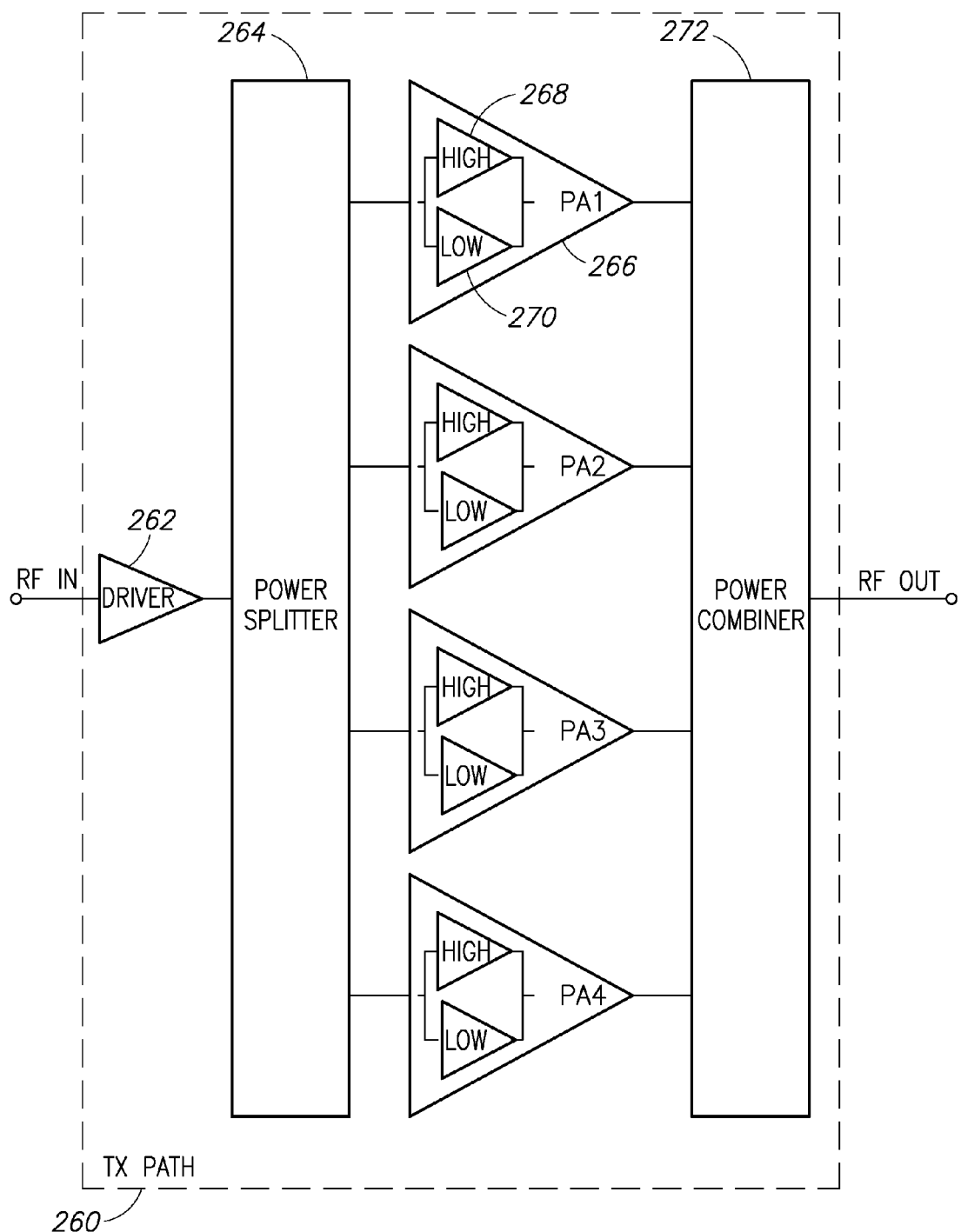
FIG. 10 is a block diagram illustrating a sixth example TX path portion of the FEM circuit.

A block diagram illustrating a sixth example TX path portion of the FEM circuit shown in FIG. 10. The TX path, generally referenced 260, comprises a driver circuit 262, power splitter 264, four dual mode sub-power amplifiers 266 and a power combiner 272. In operation, the RF input signal is input to the driver circuit. The output of the driver is then split and fed to each of the sub-amplifiers. In this embodiment, the number of sub-amplifiers is four but any number may be used depending on the particular implementation. Each sub-amplifier provides a portion of the total required gain. The outputs of the sub-amplifiers are combined to generate the RF output signal.

In one embodiment, one or more of the sub-power amplifiers, operating in parallel and making up the power amplifier, are identical with each sub-amplifier comprised of separate high and low amplifiers. The high amplifier operates at relatively large backoff (e.g., 12 dB) and is adapted to handle the high peak input amplitudes seen roughly 5% of the time. In one embodiment, the high amplifier is implemented as a class C nonlinear amplifier having appropriate biasing to amplify the peak signals with high efficiency. The low amplifier operates at lower backoff (e.g., 6 dB) and is adapted to handle the lower average input amplitudes seen roughly 95% of the time. In one embodiment, the low amplifier is implemented as a class AB linear amplifier having appropriate biasing to amplify the average signals with high linearity. Note that in an alternative embodiment, each sub-amplifier may comprise more than two amplifiers and/or be implemented using amplifiers other than class AB and C depending on the particular application.

Note that the use of separate high and low amplifiers in each sub-amplifier enables the power amplifier and FEM circuit to comply with the stringent linearity and spectral efficiency requirements of modern wireless standards, such as 802.11 Wi-Fi (802.11 ac in particular), LTE, 3G, 4G, etc., whose signals exhibit high peak to average ratios while providing relatively high efficiency resulting in minimized battery consumption.

Figure 11:
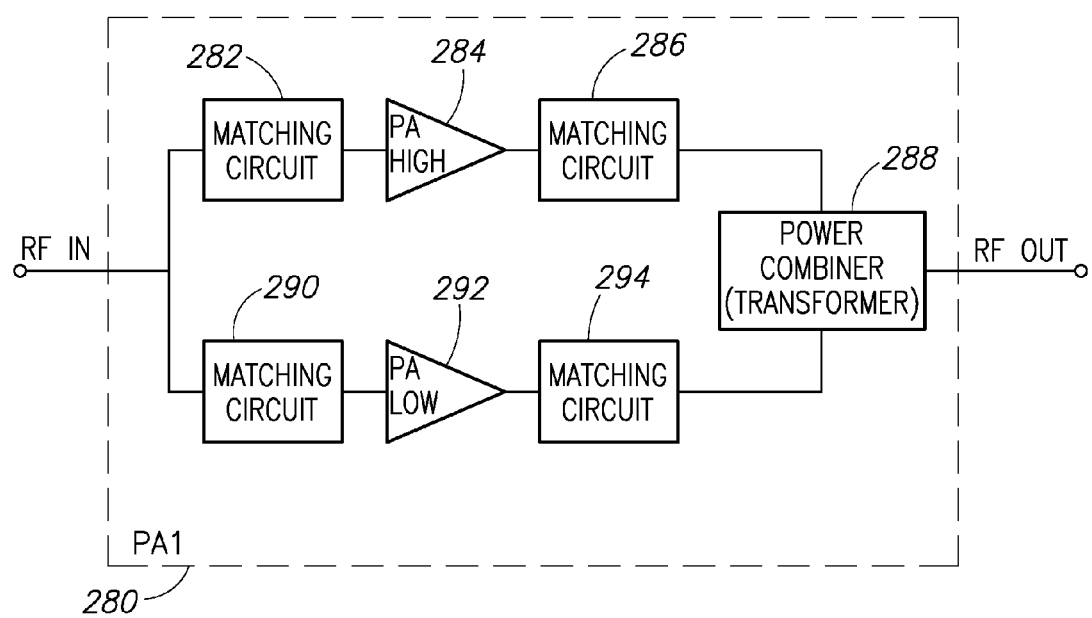
FIG. 11 is a block diagram illustrating the low and high portions of the power amplifier circuit in more detail.

A block diagram illustrating the high and low portions of the power amplifier circuit in more detail is shown in FIG. 11. The circuit, generally referenced 280, represents one of the sub-amplifiers of the power amplifier circuit 266 (FIG. 10). In one embodiment, four identical sub-amplifiers are used to generate the total desired power gain. Although in alternative embodiments, they may not be identical. The circuit 280 comprises a high circuit path and a low circuit path. The high path comprises matching circuits 282, 286 and high power amplifier 285. The low path comprises matching circuits 290, 294 and power amplifier 292. Power combiner (e.g., multi-tap transformer) 288 combines the outputs of the high and low amplifiers to generate the RF output for one of the sub-amplifiers. In the case of high and low circuit paths, the multi-tap combiner transformer comprises taps for high and low sub-amplifier outputs for each of the sub-amplifiers (four in this example embodiment) making up the power amplifier.

Figure 40:
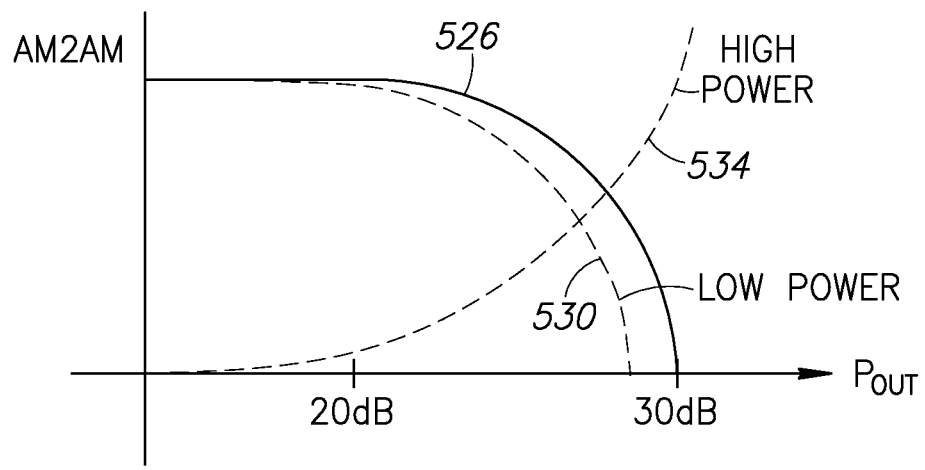
FIG. 40 is a graph illustrating the AM2AM and AM2PM response of the power amplifier circuit.
Figure 40:
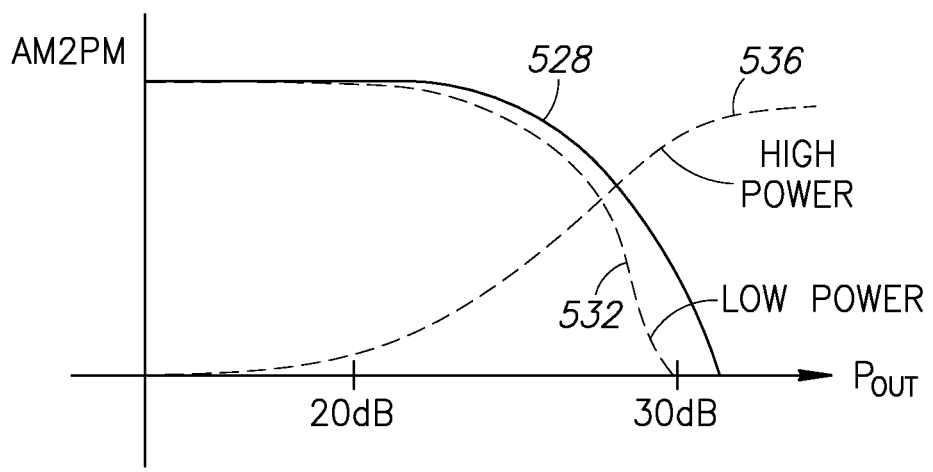

A graph of the AM2AM and AM2PM performance of the high and low circuit paths is shown in FIG. 40. Trace 530 represents the low circuit response and trace 534 represents the high circuit response as a function of output power. Trace 526 represents the combined response. Similarly, trace 532 represents the low circuit response and trace 536 represents the high circuit response as a function of output power. Trace 528 represents the combined response.

Figure 12A:
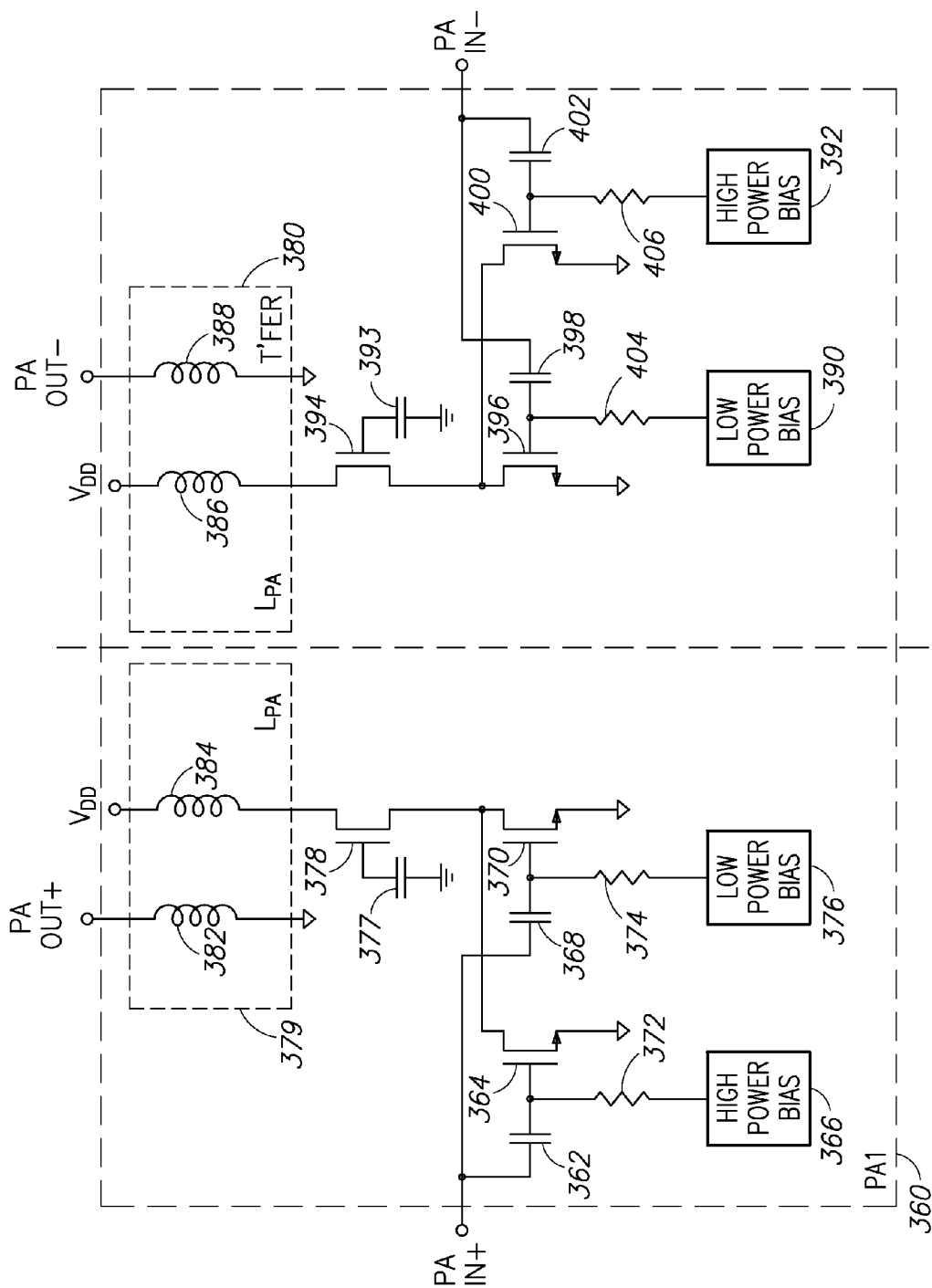
FIG. 12A is a schematic diagram illustrating a first example differential PA circuit.

A schematic diagram illustrating a first example of a sub-amplifier circuit in more detail is shown in FIG. 12A. The sub-amplifier circuit, generally referenced 360, functions to amplify a differential RF input signal applied to the PA IN+ and PA IN− terminals. The circuit comprises a transistor current modulation topology to amplifier the RF input signal. The outputs of one or more instances of the sub-amplifier are combined to generate the RF output signal having the desired total gain. The plus side of the sub-amplifier comprises capacitors 362, 368, 377, resistors 372, 374, transistors 364, 370, 378, low power bias circuit 376, high power bias circuit 366, and transformer 379 having a power amplifier primary winding 384 ($L_{PA}$) and secondary winding 382. Similarly, the minus side of the sub-amplifier comprises capacitors 402, 398, 393, resistors 404, 406, transistors 400, 396, 394, low power bias circuit 390, high power bias circuit 392, and transformer 380 having a power amplifier primary winding 386 ($L_{PA}$) and secondary winding 388.

Figure 12B:
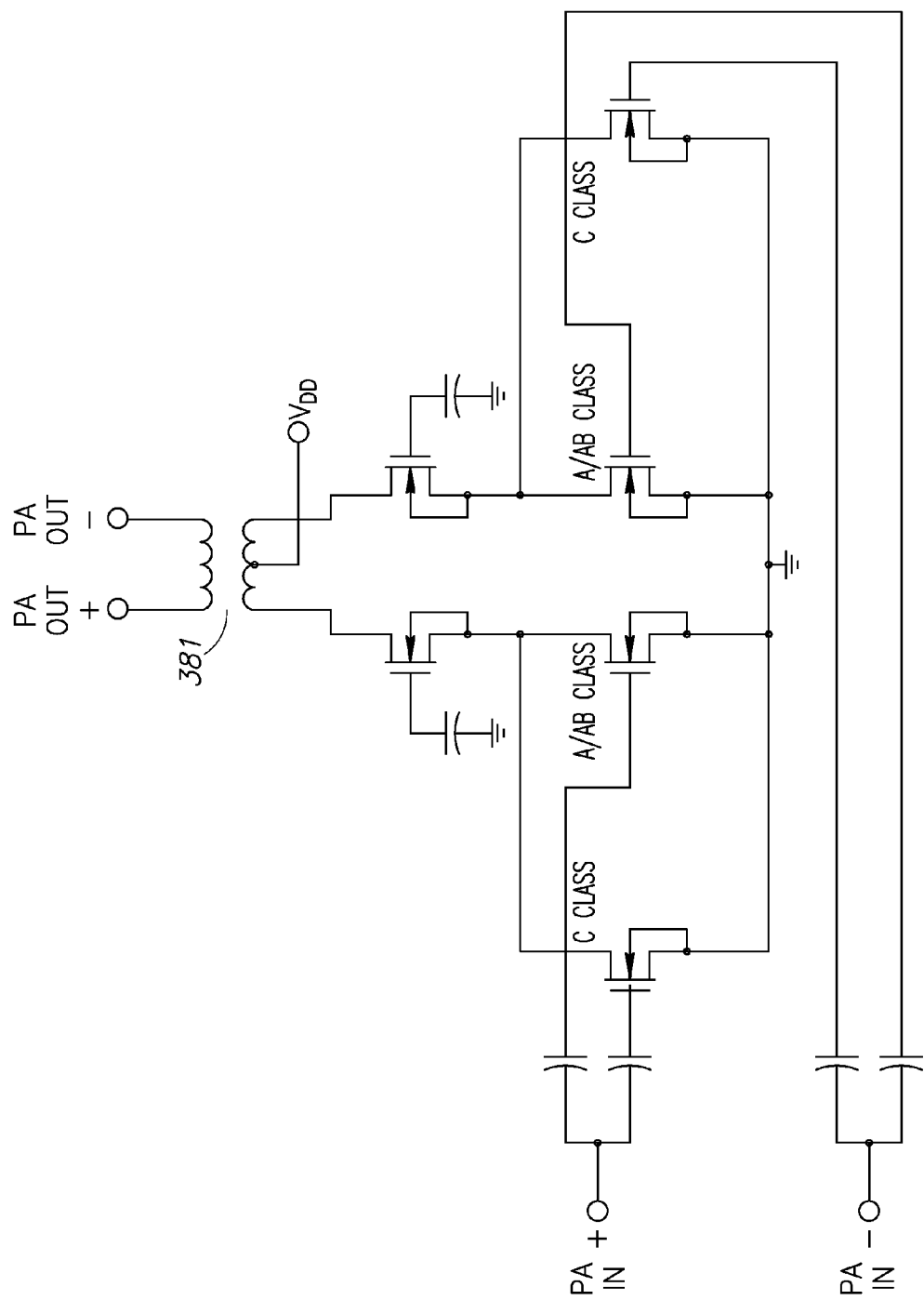
FIG. 12B is a schematic diagram illustrating the first example differential PA circuit with the transformer connection shown in more detail.

In operation, the low power transistors of both plus and minus circuits are biased for and operate as linear class A/AB amplifiers for average amplitude inputs while the high power transistors of both plus and minus circuits are biased for and operate as high efficiency class C amplifiers for peak amplitude inputs. The power generated by the high and low portion of the sub-amplifier is combined in the transistor circuit (370, 364 and 396, 400) via current combining. FIG. 12B illustrates the sub-amplifier output connections to the integrated transformer 381 in more detail.

Figure 13A:
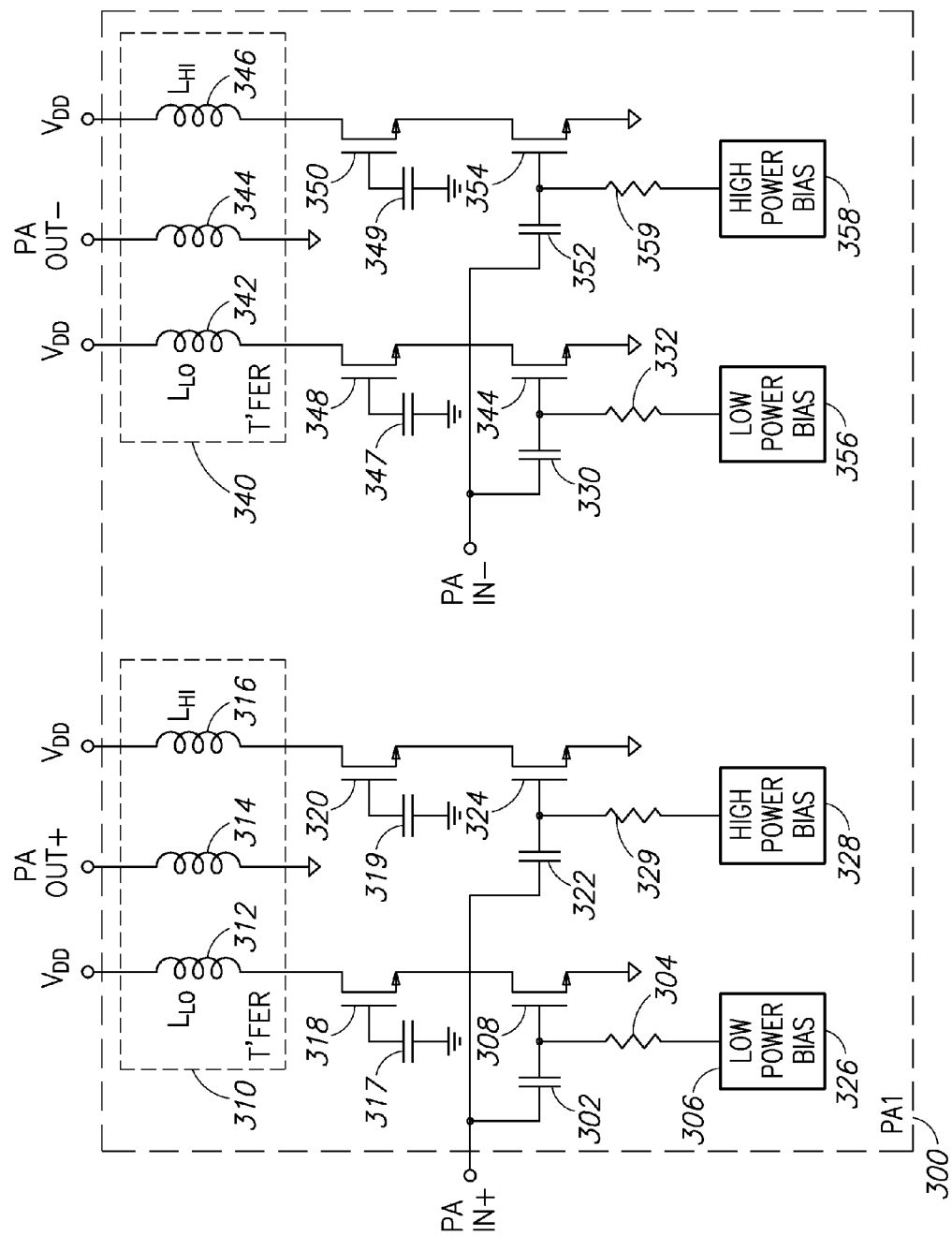
FIG. 13A is a schematic diagram illustrating a second example differential PA circuit.

A schematic diagram illustrating a second example of a sub-amplifier circuit in more detail is shown in FIG. 13A. The sub-amplifier circuit, generally referenced 300, functions to amplify a differential RF input signal applied to the PA IN+ and PA IN− terminals. The outputs of one or more instances of the sub-amplifier are combined to generate the RF output signal having the desired total gain.

The plus side of the sub-amplifier comprises capacitors 302, 317, 319, 322, resistors 304, 329, transistors 318, 320 and 308, 324, low power bias circuit 326 and high power bias circuit 328, and transformer 310 having low primary winding 312 ($L_{LO}$), high primary winding 316 ($L_{HI}$) and secondary winding 314 (PA OUT+). Similarly, the minus side of the sub-amplifier comprises capacitors 330, 347, 349, 352, resistors 332, 359, transistors 348, 350 and 334, 354, low power bias circuit 356 and high power bias circuit 358, and transformer 340 having low primary winding 342 ($L_{LO}$), high primary winding 346 ($L_{HI}$) and secondary winding 344 (PA OUT−).

Figure 13B:
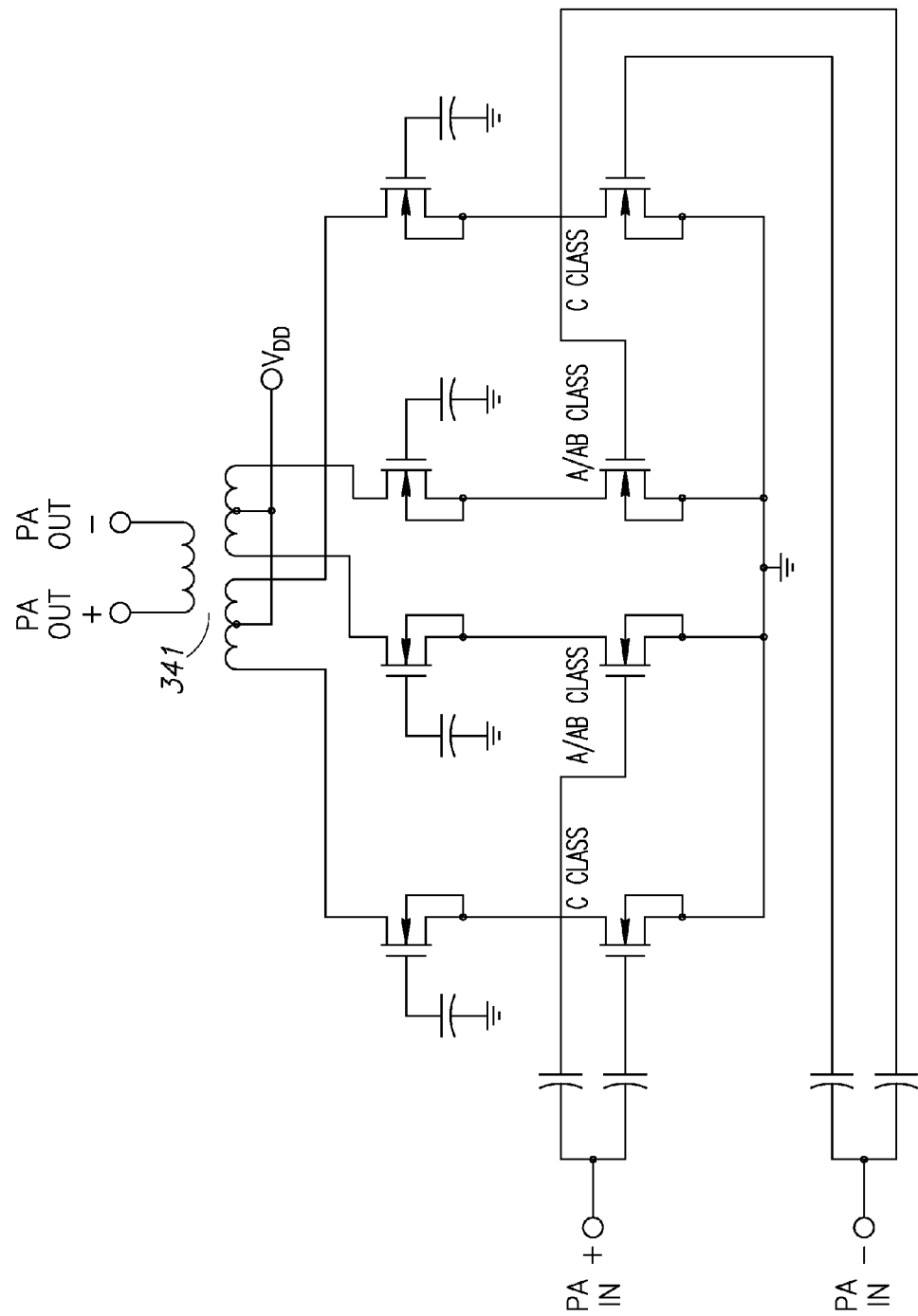
FIG. 13B is a schematic diagram illustrating the second example differential PA circuit with the transformer connection shown in more detail.

In operation, the low power transistors of both plus and minus circuits are biased for and operate as linear class A/AB amplifiers for average amplitude inputs while the high power transistors of both plus and minus circuits are biased for and operate as high efficiency class C amplifiers for peak amplitude inputs. In this embodiment, the power generated by the high and low portions of the sub-amplifier are combined magnetically in the transformer circuit (312, 316 and 342, 346). FIG. 13B illustrates the sub-amplifier output connections to the integrated transformer 341 in more detail.

Figure 16:
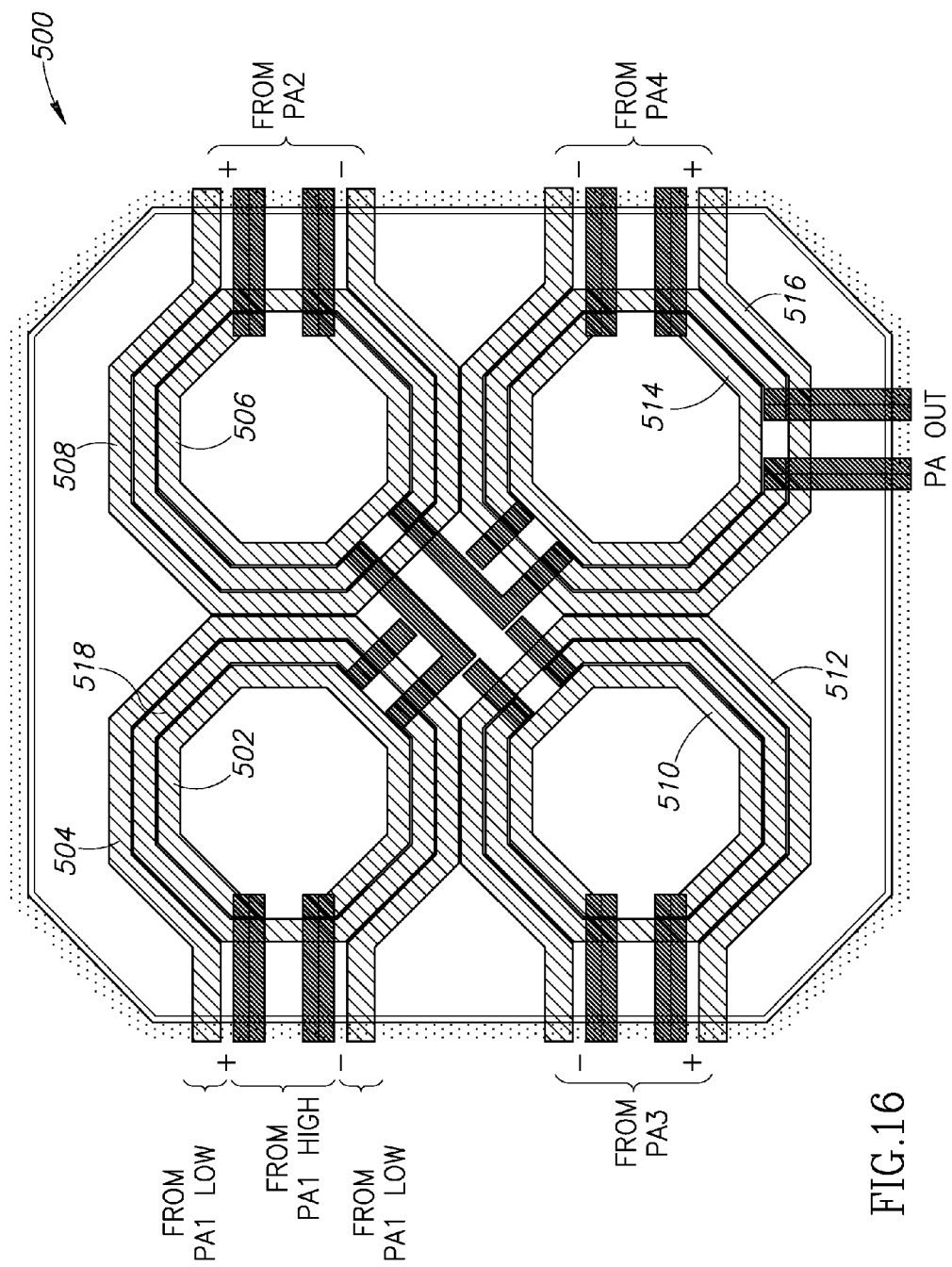
FIG. 16 is a layout diagram illustrating a second example integrated transformer for use with the power amplifier of the present invention.

In one embodiment, the high and low primary windings 312, 316 (342, 346) correspond to high and low primary windings 502, 504 of FIG. 16. The secondary winding 314 (344) corresponds to the secondary winding 518 of FIG. 16.

Figure 14:
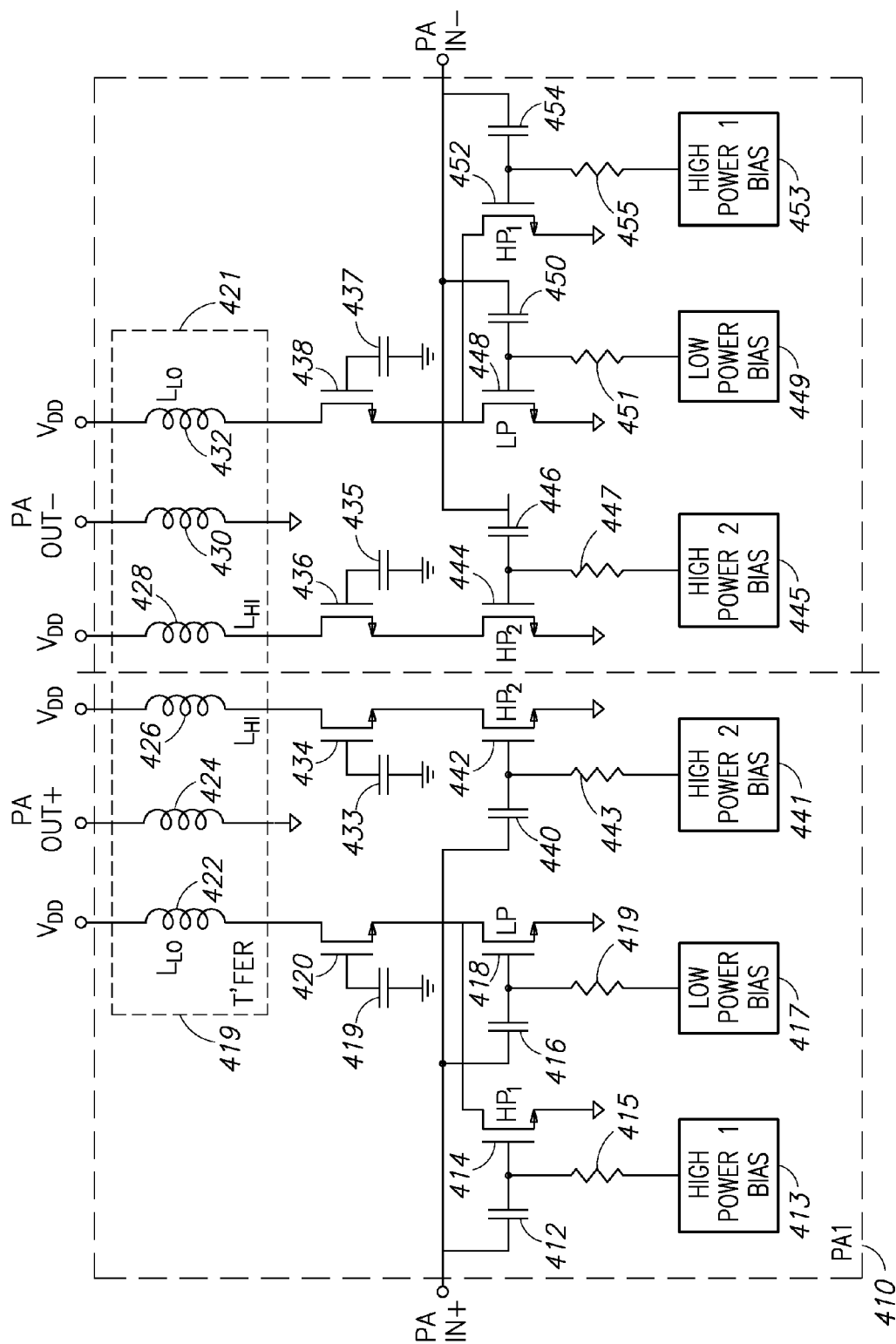
FIG. 14 is a schematic diagram illustrating a third example differential PA circuit.

A schematic diagram illustrating a third example of a sub-amplifier circuit in more detail is shown in FIG. 14. This sub-amplifier circuit is similar to the circuit shown in FIG. 13 with low and high power transistor paths. The difference being the addition of a second high power transistor (HP1) in parallel with the low power transistor (LP).

The sub-amplifier circuit, generally referenced 410, functions to amplify a differential input signal applied to the PA IN+ and PA IN− terminals. The outputs of one or more instances of the sub-amplifier are combined to generate the RF output signal having the desired total gain.

The plus side of the sub-amplifier comprises capacitors 412, 416, 440, 419, 433, resistors 415, 419, 443, transistors 418 (LP), 414 (HP1), 442 (HP2) and 420, 434, low power bias circuit 417, high power 1 bias circuit 413 and high power 2 bias circuit 441, and transformer 419 having low primary winding 422 ($L_{LO}$), high primary winding 426 ($L_{HI}$) and secondary winding 424 (PA OUT+). Similarly, the minus side of the sub-amplifier comprises capacitors 446, 450, 454, 435, 437, resistors 447, 451, 455, transistors 448 (LP), 452 (HP1), 444 (HP2) and 436, 438, low power bias circuit 449, high power 1 bias circuit 453 and high power 2 bias circuit 445, and transformer 421 having low primary winding 432 ($L_{LO}$), high primary winding 428 ($L_{HI}$) and secondary winding 430 (PA OUT−).

In operation, the low power transistors of both plus and minus circuits are biased for and operate as linear class A/AB amplifiers for average amplitude inputs while the high power 1 and high power 2 transistors of both plus and minus circuits are biased for and operate as high efficiency class C amplifiers for peak amplitude inputs. In this embodiment, the power generated by the high and low portions of the sub-amplifier are combined magnetically in the transformer circuit (422, 426 and 428, 432).

In one embodiment, the high and low primary windings 422, 426 (432, 428) correspond to high and low primary windings 502, 504 of FIG. 16. The secondary winding 424 (430) corresponds to the secondary winding 518 of FIG. 16.

The FEM circuit of the present invention utilizes transformer based power combining techniques to generate the RF output signal. The use of transformer based power combining increases the output power capability of the FEM. The power amplifier is split into a plurality of sub-amplifiers (four quarters in this example), with each sub-amplifier supplying a quarter of the power in series. This minimizes or eliminates any transistor stress issue, depending on the particular technology employed. Each quarter (i.e. sub-amplifier) is further split into high and low power portions. This increases the efficiency by up to 40% over use of a single transistor sub-amplifier.

With reference to FIGS. 8 and 9, the primary windings are driven by the independent sub-amplifiers PA1, PA2, PA3, PA4 while the secondary windings are connected in series. The power delivered to the load is the sum of the output power generated by each sub-amplifier. Note that some power may be dissipated in any matching networks coupled to the transformer.

Thus, the power combiner not only efficiently sums the ac voltages of the individual sub-amplifiers but also performs an impedance transformation function. Since the secondary winding of each transformer carries the same current, the sub-amplifiers are coupled to each other. Thus, the impedance seen by each sub-amplifier is determined by the output voltage and output impedance of the other sub-amplifiers. If the sub-amplifiers have the same output impedance and generate the same output voltage and the transformers have the same turns ratio, then the impedance seen by each sub-amplifier is determined by the turns ratio of each transformer and the number of parallel stages (four in this example embodiment).

Figure 15:
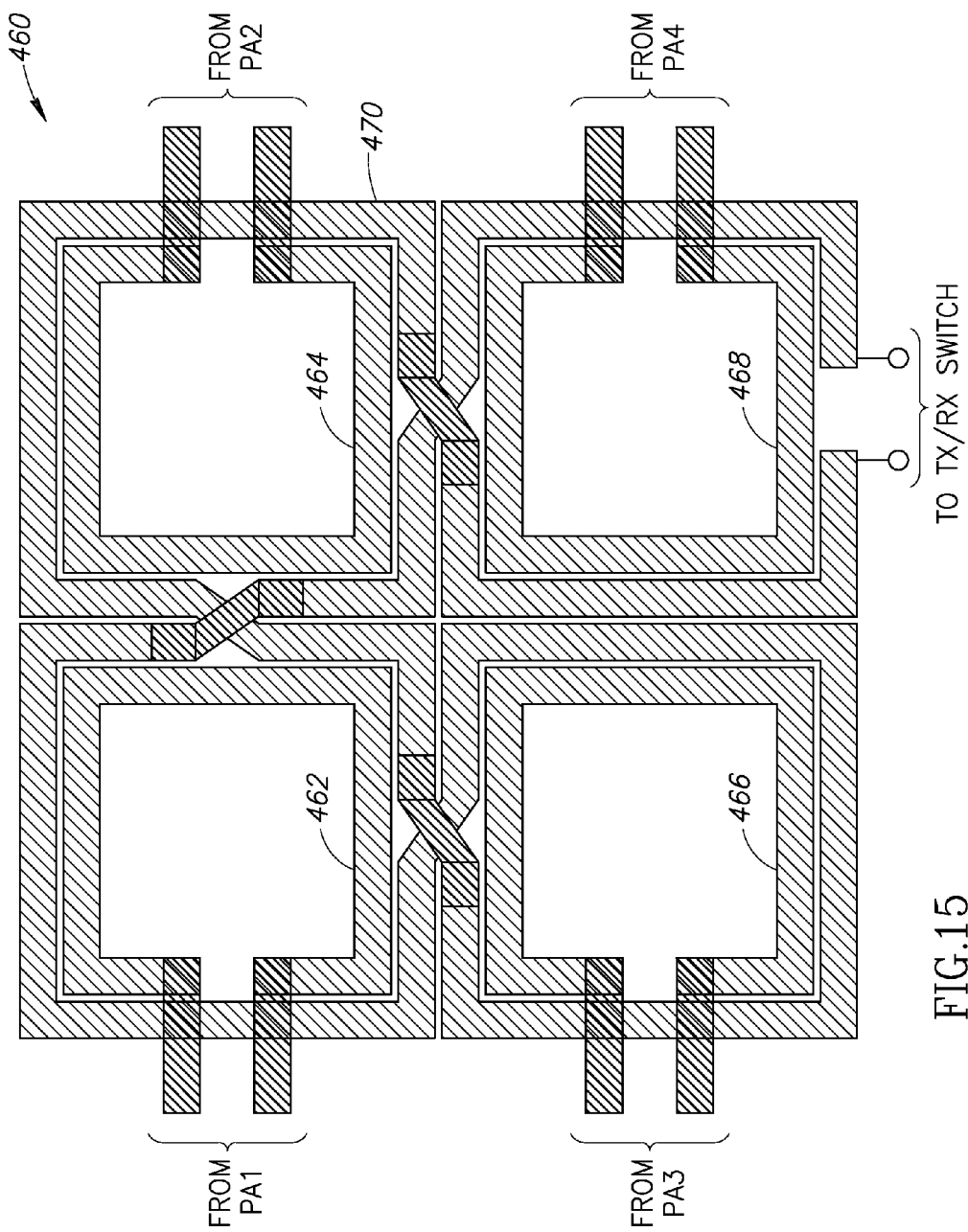
FIG. 15 is a layout diagram illustrating a first example integrated transformer for use with the power amplifier of the present invention.

A layout diagram illustrating a first example power combining integrated transformer for use with the power amplifier of the present invention is shown in FIG. 15. The transformer, generally referenced 460, comprises four primary windings in a two dimensional (2D) quad shaped arrangement wherein winding 462 is coupled to the output of sub-power amplifier 1, winding 464 is coupled to the output of sub-power amplifier 2, winding 466 is coupled to the output of sub-power amplifier 3 and winding 468 is coupled to the output of sub-power amplifier 4. The secondary winding 470 snakes around the four primary windings and is coupled to the TX/RX switch. Note that in this embodiment, the magnetic field is symmetric around symmetry lines 461 and 463. The transformer has an air core and the width, spacing and thickness of the metal layer is configured to provide sufficient performance at the respective frequency bands (e.g., 2.4 and 5 GHz) and exhibits input and output impedance to meet the required inductance and Q factor. Note that alternative configurations for the transformer windings may be implemented depending on the application. For example, the primary and secondary windings may be implemented on the same or different metal layers.

A layout diagram illustrating a second example integrated transformer for use with the power amplifier of the present invention is shown in FIG. 16. The transformer, generally referenced 500, comprises four sets of octagonal shaped primary windings and one secondary winding in a quad shaped arrangement. Each set of parallel primary windings comprises a high loop and a low loop to accommodate the high and low amplifiers of the sub-amplifiers shown in FIGS. 12A, 12B, 13A, 13B, 14, for example. The inner winding of each set of primary windings is from the high amplifier and the outer winding is from the low amplifier. The middle winding is the secondary, which runs between the primary windings. Note that separating the high and low power windings has the advantage of providing a way to better control the phase distortion of each sub-amplifier thus providing improved combined control of the total phase distortion of the power amplifier. In addition, stretching the windings of the outer set of windings (or the inner set) also compensates for phase distortion between the PA sub-amplifiers. The use of multiple techniques described herein enables the FEM to achieve maximum efficiency and lowest EVM.

In particular, the integrated transformer comprises windings 502, 504, 506, 508, 510, 512, 514, 516 and a secondary winding 518 wherein winding 504 is coupled to the low differential output of sub-amplifier 1, winding 502 is coupled to the high differential output of sub-amplifier 1; winding 508 is coupled to the low differential output of sub-amplifier 2, winding 506 is coupled to the high differential output of sub-amplifier 2; winding 512 is coupled to the low differential output of sub-amplifier 3, winding 510 is coupled to the high differential output of sub-amplifier 3; and winding 516 is coupled to the low differential output of sub-amplifier 4, winding 514 is coupled to the high differential output of sub-amplifier 4. Note that the outer primary winding of each transformer is coupled to the low output of the sub-amplifier rather than the inner winding because the inductance of the outer winding is larger as it has a longer length. The shorter inner winding is coupled to the high power output of each sub-amplifier. The secondary winding 518 snakes between the four pairs of '+' and '−' primary windings and is coupled to the TX/RX switch. Running the secondary winding between the '+' and '−' primary windings improves magnetic coupling between the two. The transformer has an air core and the width, spacing and thickness of the metal layers is configured to provide sufficient performance at the respective frequency bands (e.g., 2.4 and 5 GHz) and exhibits input and output impedance to meet the required inductance and Q factor. Note that alternative configurations for the transformer windings may be implemented depending on the particular application.

Figure 17:
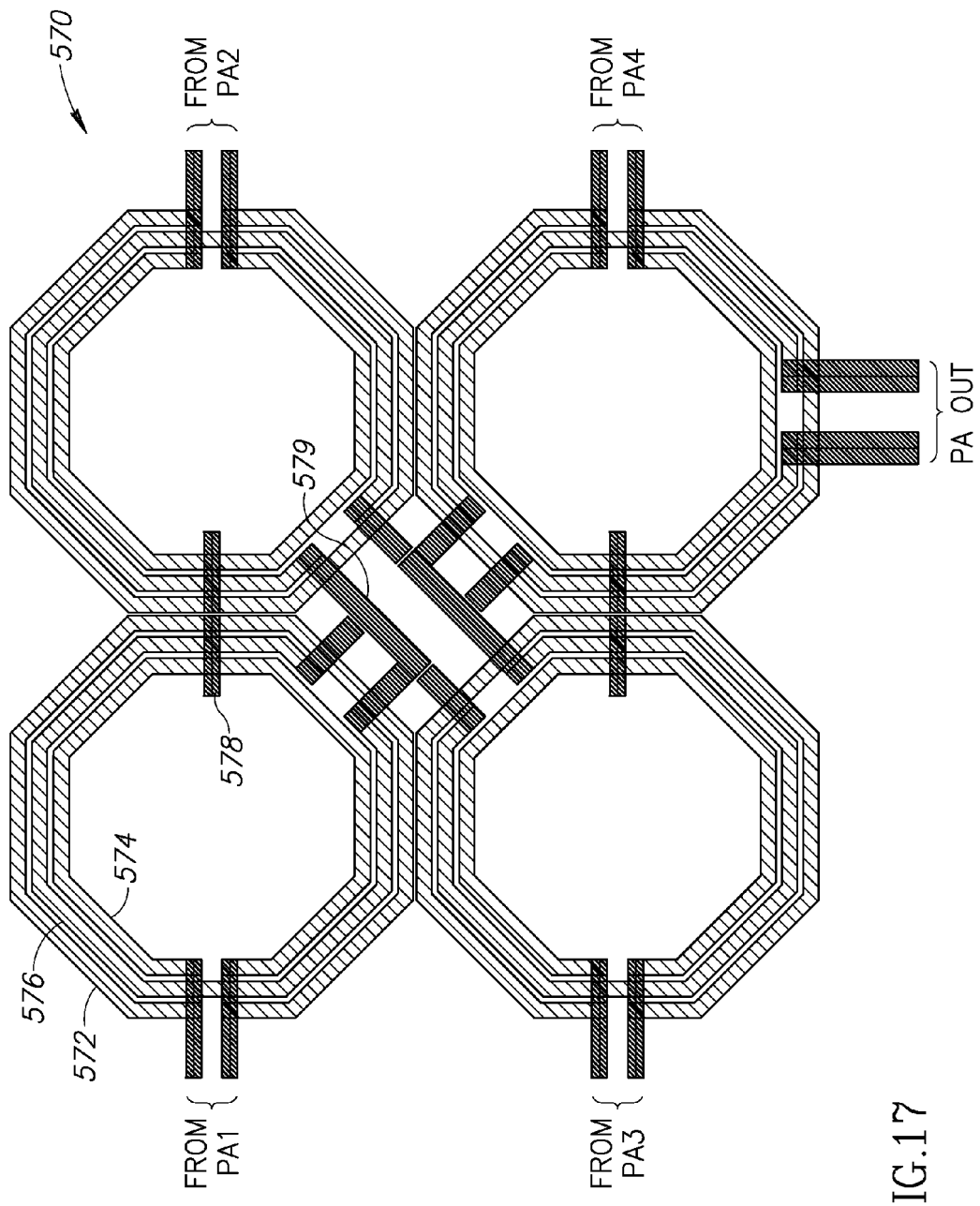
FIG. 17 is a layout diagram illustrating a third example integrated transformer for use with the power amplifier of the present invention.

A layout diagram illustrating a third example integrated transformer for use with the power amplifier of the present invention shown in FIG. 17. The transformer, generally referenced 570, comprises four sets of octagonal shaped primary windings and one secondary winding in a quad shaped arrangement. Each set of primary windings comprises two parallel windings. The middle winding is the secondary, which runs between the parallel primary windings. This reduces the current crowding (proximity) effect as the current is spread more uniformly in the secondary thereby reducing losses.

In particular, the integrated transformer comprises four sets of windings, each associated with one of the differential sub-amplifiers. Each set of windings comprises parallel primary windings 572, 574 and secondary winding 576. The parallel primary windings are coupled to the sub-amplifiers PA1, PA2, PA3 and PA4. Parallel primary windings enable the transformer to handle higher current. The secondary winding 576 snakes between the four parallel primary windings via connectors 579 to generate the PA output which is subsequently coupled to the TX/RX switch. Running the secondary winding between the parallel primary windings improves magnetic coupling between the two and mitigates the proximity effect as described supra. The transformer has an air core and the width, spacing and thickness of the metal layers is configured to provide sufficient performance at the respective frequency bands (e.g., 2.4 and 5 GHz) and exhibits input and output impedance to meet the required inductance and Q factor. Note that alternative configurations for the transformer windings may be implemented depending on the particular application.

Figure 18:
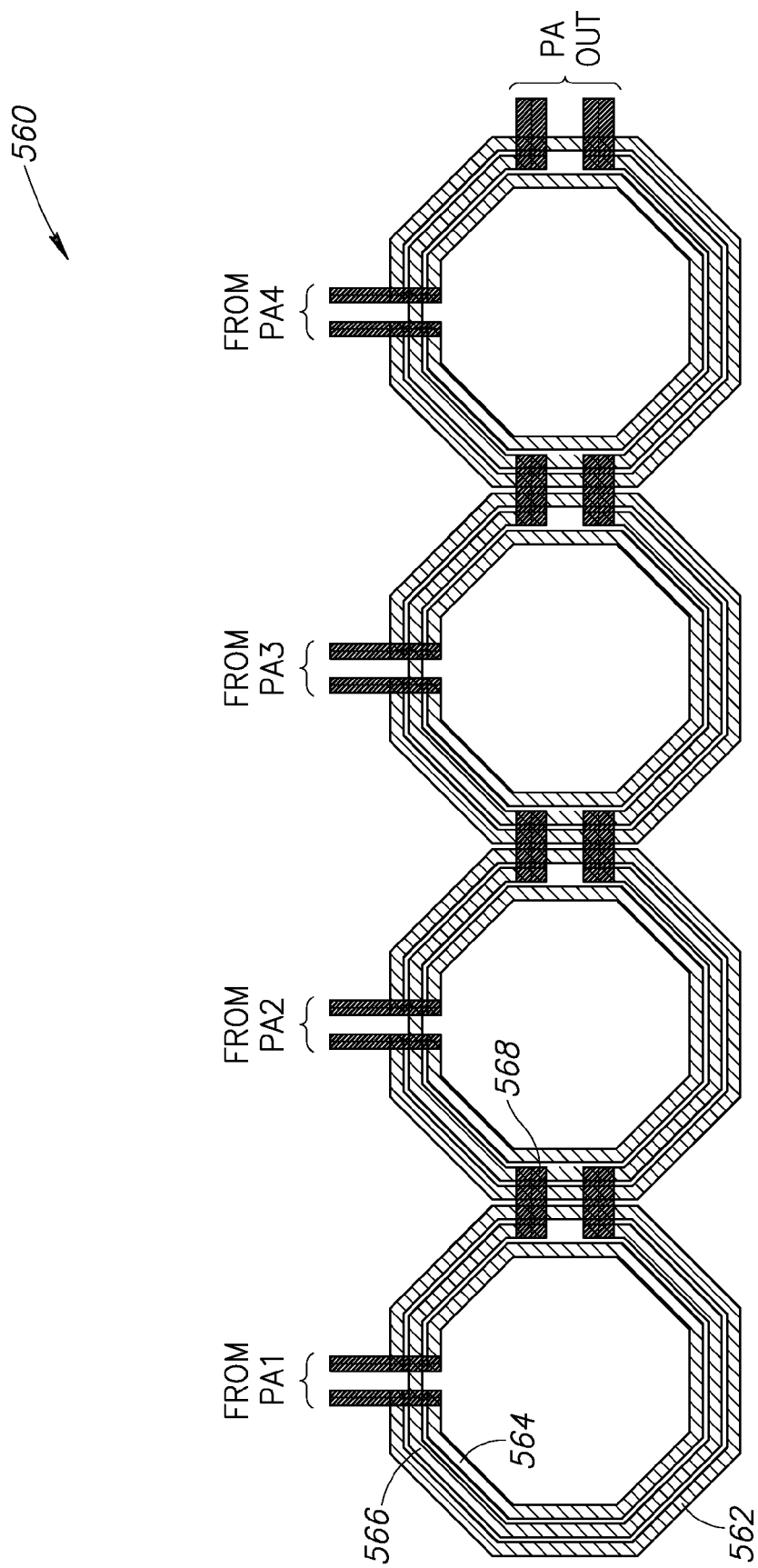
FIG. 18 is a layout diagram illustrating a fourth example integrated transformer for use with the power amplifier of the present invention.

A layout diagram illustrating a fourth example integrated transformer for use with the power amplifier of the present invention shown in FIG. 18. The transformer, generally referenced 560, comprises four sets of octagonal shaped primary windings and one secondary winding arranged in a sequential or linear row array configuration. Each set of primary windings comprises two parallel windings. This reduces the current crowding (proximity) effect as the current is spread more uniformly in the secondary thereby reducing losses. It also increases the current handling capability of the transformer. The middle winding is the secondary, which runs between the parallel primary windings.

In particular, the integrated transformer comprises four sets of windings, each associated with one of the differential sub-amplifiers. Each set of windings comprises parallel primary windings 562, 564 and secondary winding 566. The parallel primary windings are coupled to the sub-amplifiers PA1, PA2, PA3 and PA4. The secondary winding 566 snakes between the four parallel primary windings via connectors 568 to generate the PA output which is subsequently coupled to the TX/RX switch. Running the secondary winding between the parallel primary windings improves magnetic coupling between the two and mitigates the proximity effect as described supra. The transformer has an air core and the width, spacing and thickness of the metal layers is configured to provide sufficient performance at the respective frequency bands (e.g., 2.4 and 5 GHz) and exhibits input and output impedance to meet the required inductance and Q factor. Note that alternative configurations for the transformer windings may be implemented depending on the particular application.

Figure 19A:
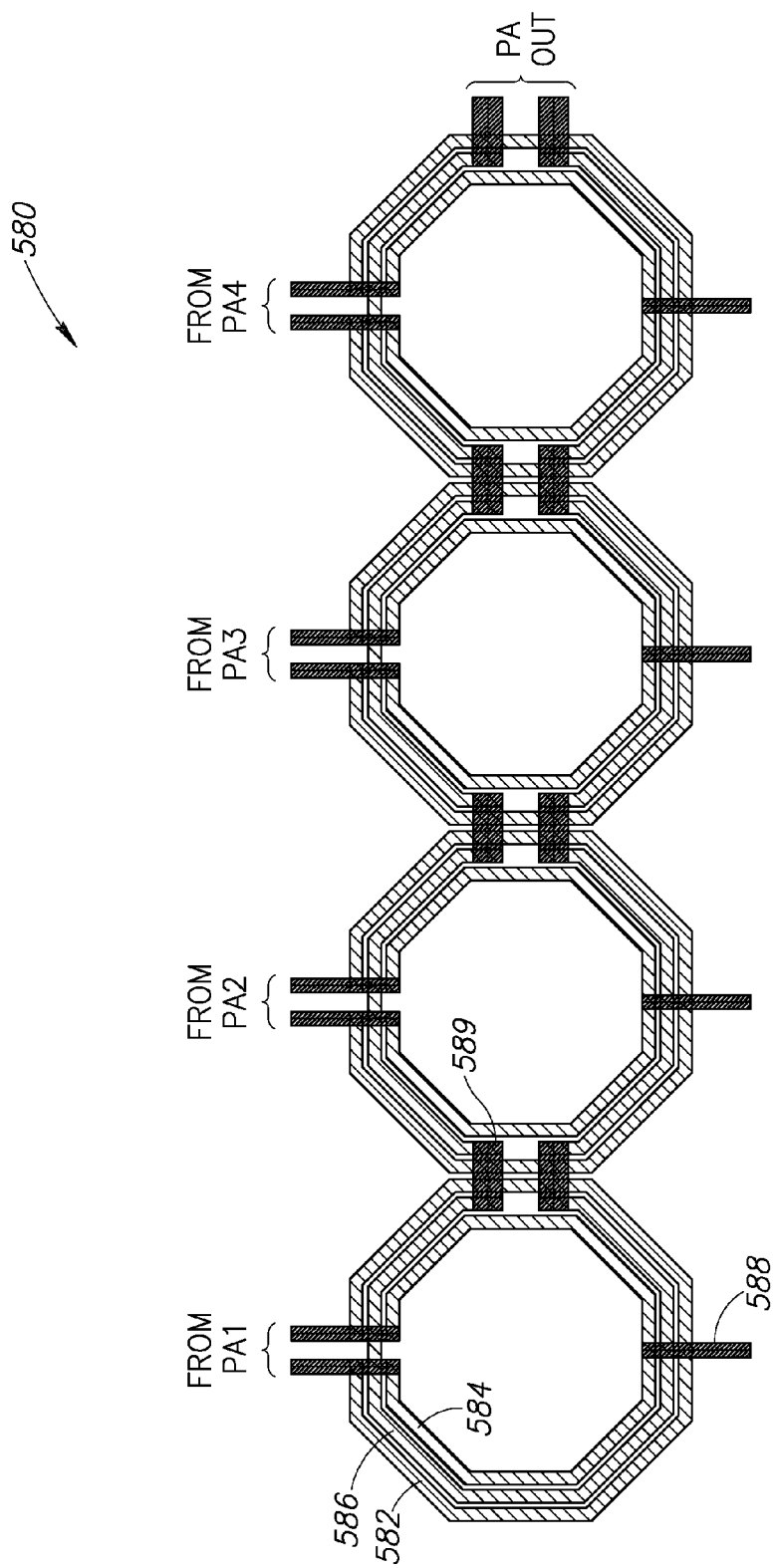
FIG. 19A is a layout diagram illustrating a fifth example integrated transformer for use with the power amplifier of the present invention.

In the circuit of FIG. 19A, a center tap 588 in each transformer is connected to $V_{DD}$. The parallel primary windings 582, 584 and secondary winding 586 operate similarly to that of the integrated transformer of FIG. 18 with the addition of the center tap 588 in the transformer of FIG. 19A.

Figure 19B:
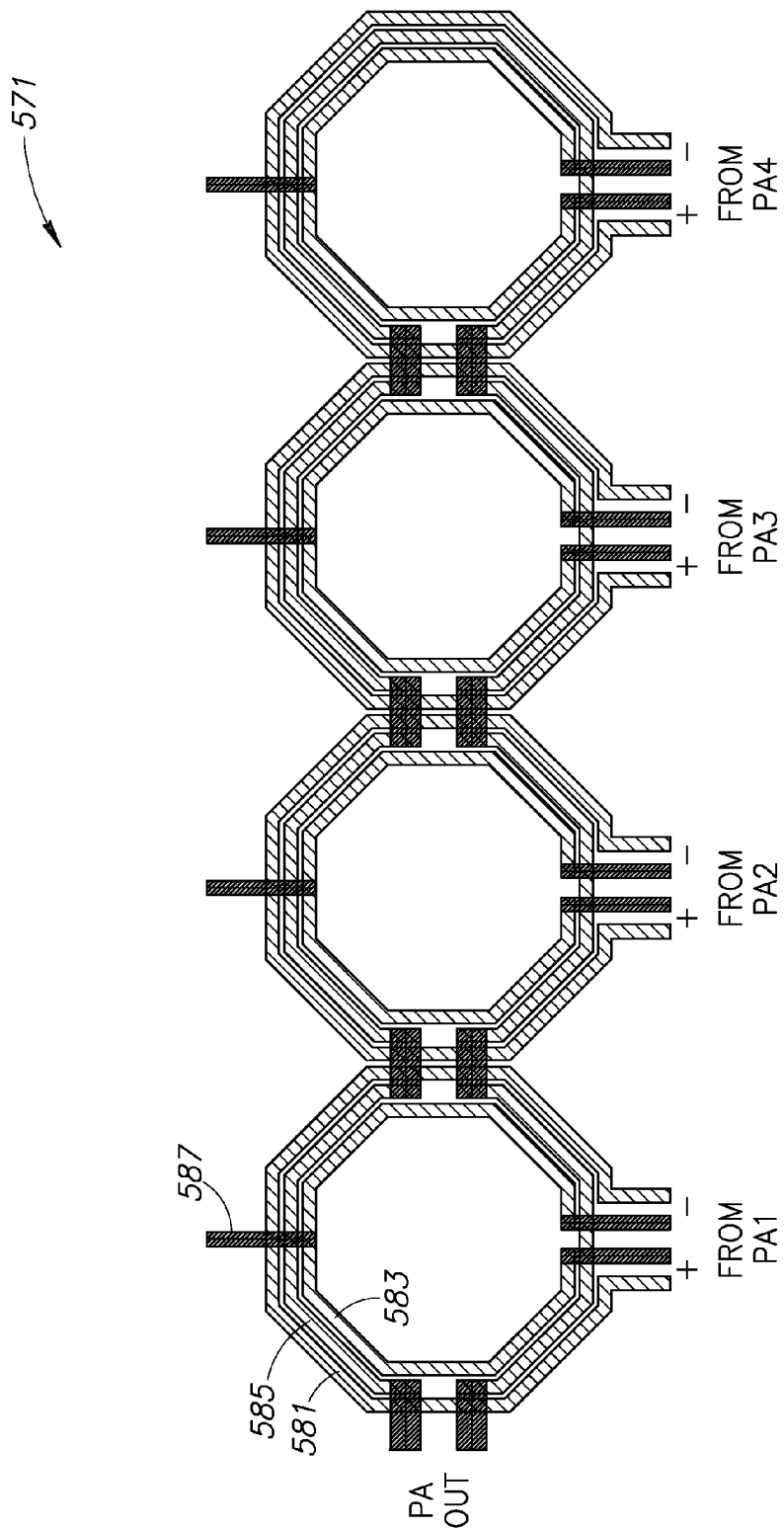
FIG. 19B is a layout diagram illustrating a sixth example integrated transformer for use with the power amplifier of the present invention.

A layout diagram illustrating a sixth example integrated transformer for use with the power amplifier of the present invention shown in FIG. 19B. The integrated transformer, generally referenced 571, comprises four sets of windings in a linear row configuration, each associated with one of the differential sub-amplifiers. Each set of windings comprises a pair of parallel primary windings 581, 583 and secondary winding 585. The parallel primary windings in each set are coupled to the high and low circuit outputs in the sub-amplifiers of each of PA1, PA2, PA3 and PA4. In each set of windings, the inner inductor loop is used for low power sub-amplifier and the outer inductor loop is used for the high power sub-amplifier, for example, the two cascade amplifiers shown in FIGS. 12A, 12B, 13A, 13B. A center tap 587 in each transformer is connected to $V_{DD}$. The secondary winding is routed between the four sets of parallel primary windings via connectors to generate the PA output which is subsequently coupled to the TX/RX switch. Routing the secondary winding between the parallel primary windings improves magnetic coupling between the two and mitigates the proximity effect as described supra. The transformer has an air core and the width, spacing and thickness of the metal layers is configured to provide sufficient performance at the respective frequency bands (e.g., 2.4 and 5 GHz) and exhibits input and output impedance to meet the required inductance and Q factor. Note that alternative configurations for the transformer windings may be implemented depending on the particular application.

Figure 19C:
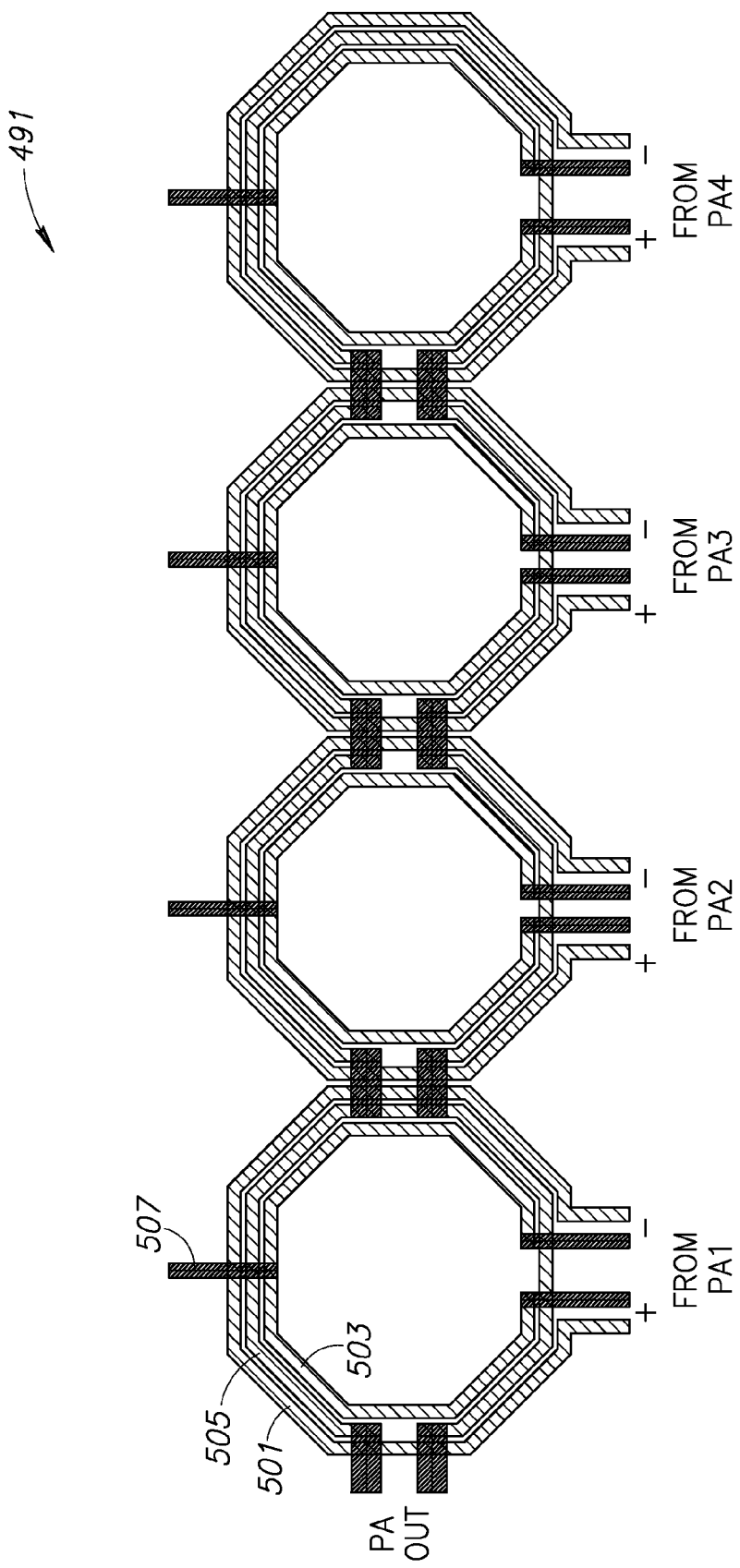
FIG. 19C is a layout diagram illustrating a seventh example integrated transformer for use with the power amplifier of the present invention.

19C is a layout diagram illustrating a seventh example integrated transformer for use with the power amplifier of the present invention shown in FIG. 19C. The integrated transformer, generally referenced 491, comprises four sets of windings in a linear row configuration, each associated with one of the differential sub-amplifiers. Each set of windings comprises a pair of parallel primary windings 501, 503 and secondary winding 505. The parallel primary windings in each set are coupled to the high and low circuit outputs in the sub-amplifiers of each of PA1, PA2, PA3 and PA4. A center tap 507 in each transformer is connected to $V_{DD}$. Note that the set of windings for PA1 and PA4 are longer (i.e. stretched) than that of PA2 and PA3. This serves to compensate for phase mismatch generated in the PA sub-amplifiers.

The secondary winding is routed between the four sets of parallel primary windings via connectors to generate the PA output which is subsequently coupled to the TX/RX switch. Routing the secondary winding between the parallel primary windings improves magnetic coupling between the two and mitigates the proximity effect as described supra. The transformer has an air core and the width, spacing and thickness of the metal layers is configured to provide sufficient performance at the respective frequency bands (e.g., 2.4 and 5 GHz) and exhibits input and output impedance to meet the required inductance and Q factor. Note that alternative configurations for the transformer windings may be implemented depending on the particular application. This configuration and any of the integrated transformer configurations described herein may be used with any of the sub-amplifier configurations described supra, i.e. the circuits of FIGS. 12A, 12B, 13A, 13B and 14.

Figure 20:
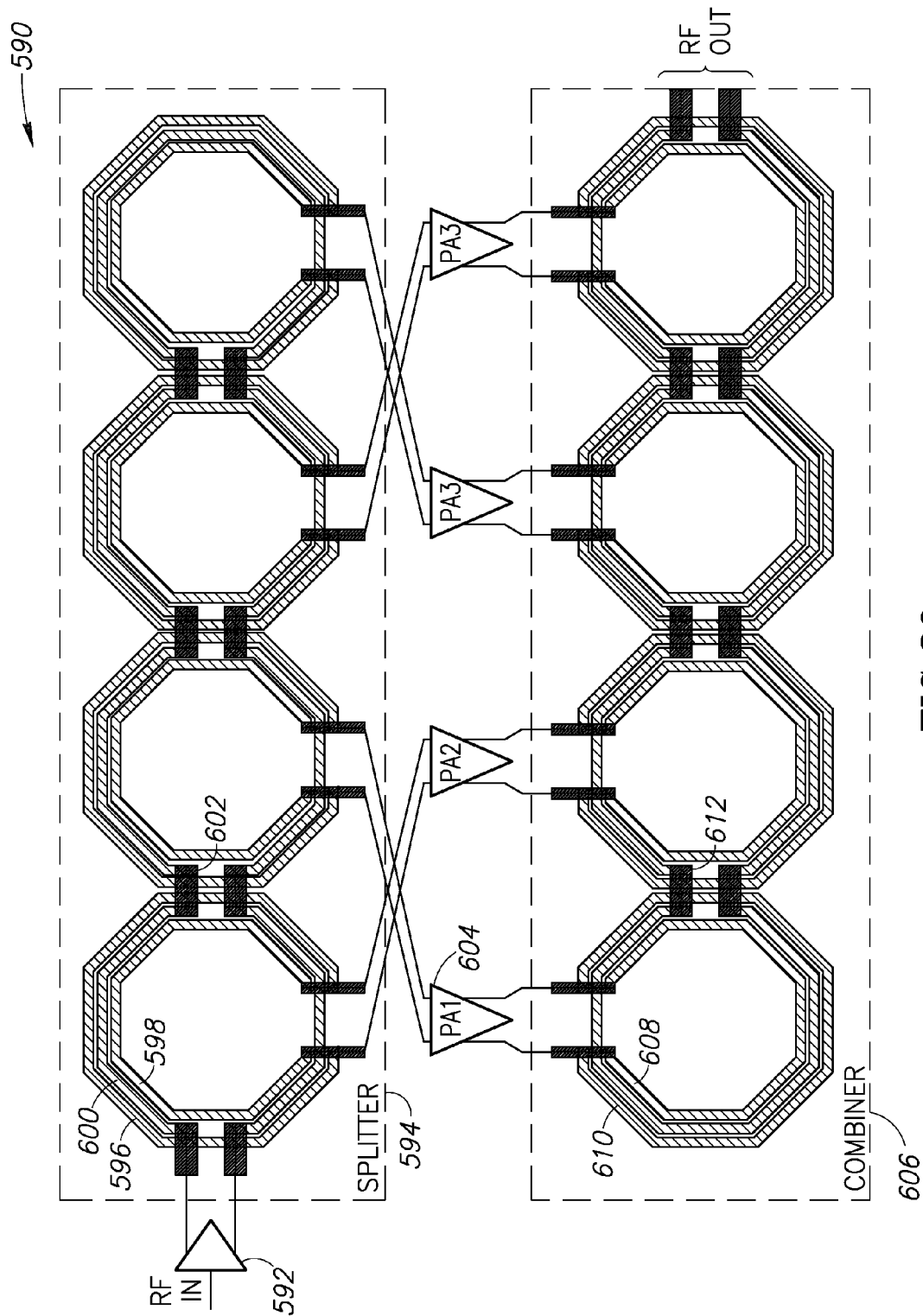
FIG. 20 is a layout diagram illustrating an eighth example integrated transformer for use with the power amplifier of the present invention.

A layout diagram illustrating an eighth example integrated transformer for use with the power amplifier of the present invention shown in FIG. 20. The transformer, generally referenced 590, comprises a splitter 594, four sub-amplifiers 604 and a combiner 606. The splitter comprises one primary winding 600 and four sets of octagonal shaped secondary windings arranged in a sequential or linear row array configuration. Each set of secondary windings comprises two parallel windings 596, 598. This increases the current handling capability of the transformer. The middle winding is the primary, which runs between the parallel secondary windings.

To minimize and compensate for any phase mismatch between the individual transformers in the splitter caused by a difference between the outer two PA1, PA4 transformers and the inner two PA2, PA3 transformers, the differential outputs are crossed between the PA1 and PA2 windings and the PA3 and PA4 windings.

The combiner comprises four sets of octagonal shaped primary windings 610, 608 and one secondary winding 611 arranged in a sequential or linear row array configuration. Each set of primary windings comprises two parallel windings. This reduces the current crowding (proximity) effect as the current is spread more uniformly in the secondary thereby reducing losses. It also increases the current handling capability of the transformer. The middle winding is the secondary, which runs between the parallel primary windings.

In particular, both the splitter and combiner comprise four sets of windings, each associated with one of the differential sub-amplifiers PA1, PA2, PA3 and PA4. The RF input signal is input to a buffer 592 whose differential output is applied to the primary of the splitter transformer. The parallel secondary windings of each transformer of the splitter are coupled to a respective differential input of a sub-amplifier. The primary winding 600 snakes between the four sets of parallel secondary windings to generate the four signals input to the sub-amplifiers. The output of each sub-amplifier is input to a respective transformer in the combiner. The secondary winding 611 snakes between the four sets of parallel primary windings 610, 608 to generate the PA output which is subsequently coupled to the TX/RX switch. The transformers in the splitter and combiner both have air cores and the width, spacing and thickness of the metal layers is configured to provide sufficient performance at the respective frequency bands (e.g., 2.4 and 5 GHz) and exhibits input and output impedance to meet the required inductance and Q factor. Note that alternative configurations for the transformer windings may be implemented depending on the particular application.

Figure 21:
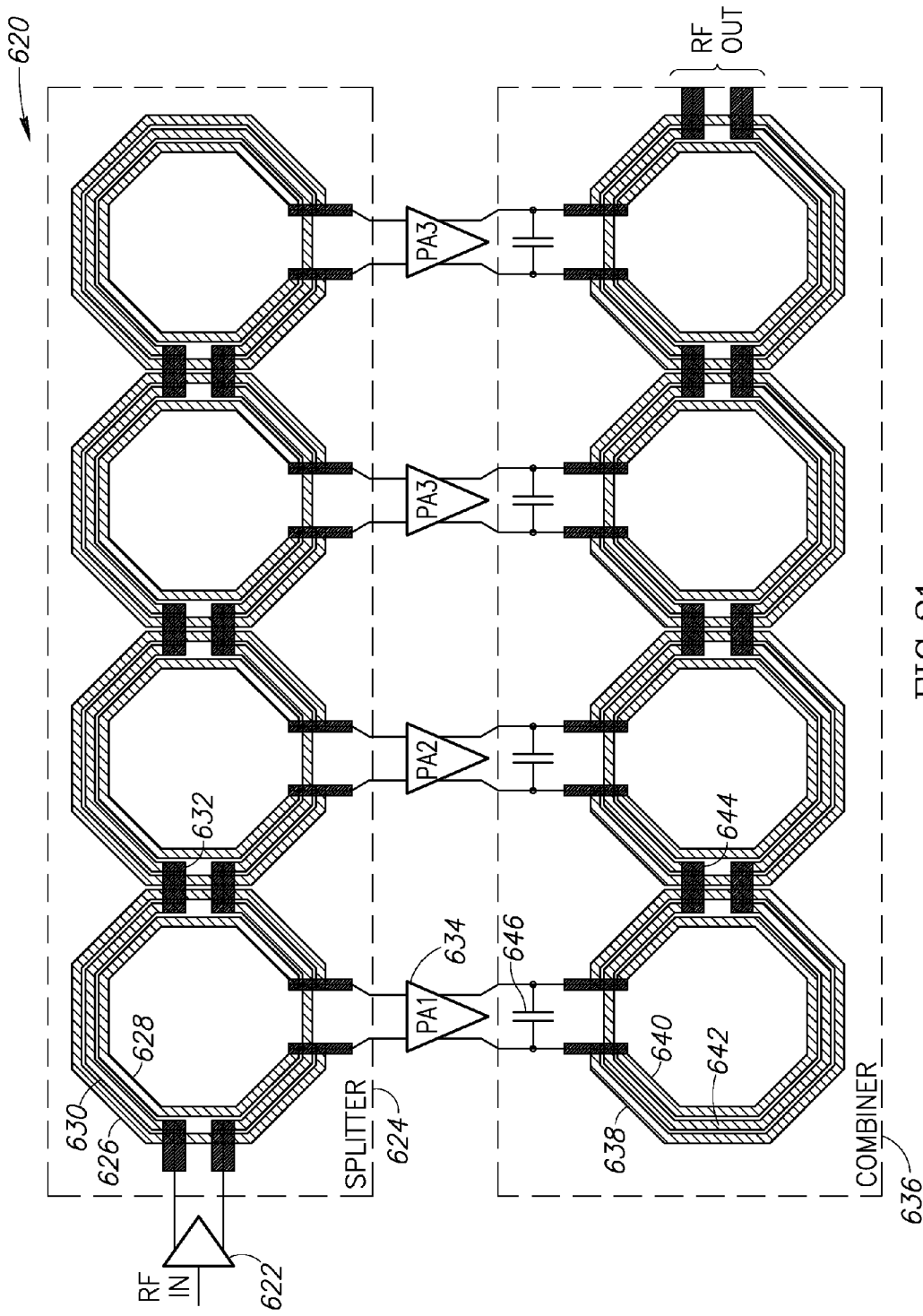
FIG. 21 is a layout diagram illustrating a ninth example integrated transformer for use with the power amplifier of the present invention.

In an alternative technique to combat any phase mismatch of the transformers, a tuning capacitor is added to each primary winding in the combiner. The capacitor, however, may be lossy thereby reducing the power gain of the power amplifier. Such a circuit is shown in FIG. 21. The use of a capacitor enables the transformer to achieve better phase compensation across the transformer windings. It also reduces parasitic losses and results in lower phase and amplifier error.

The transformer, generally referenced 620, comprises a splitter 624, four sub-amplifiers 634 and a combiner 636. The splitter comprises one primary winding 630 and four sets of octagonal shaped secondary windings arranged in a sequential or linear row array configuration. Each set of secondary windings comprises two parallel windings 626, 628. This increases the current handling capability of the transformer. The middle winding is the primary, which runs between the parallel secondary windings.

The combiner comprises four sets of octagonal shaped primary windings 638, 640, one secondary winding 642 and capacitor 646 arranged in a sequential or linear row array configuration. Each set of primary windings comprises two parallel windings. This reduces the current crowding (proximity) effect as the current is spread more uniformly in the secondary thereby reducing losses. It also increases the current handling capability of the transformer. The middle winding is the secondary, which runs between the parallel primary windings.

In particular, both the splitter and combiner comprise four sets of windings, each associated with one of the differential sub-amplifiers PA1, PA2, PA3 and PA4. The RF input signal is input to a buffer 622 whose differential output is applied to the primary of the splitter transformer. The parallel secondary windings of each transformer of the splitter are coupled to a respective differential input of a sub-amplifier. The primary winding 630 snakes between the four sets of parallel secondary windings to generate the four signals input to the sub-amplifiers. The output of each sub-amplifier is input to a respective transformer in the combiner. The secondary winding 642 snakes between the four sets of parallel primary windings 638, 640 to generate the PA output which is subsequently coupled to the TX/RX switch. The transformers in the splitter and combiner both have air cores and the width, spacing and thickness of the metal layers is configured to provide sufficient performance at the respective frequency bands (e.g., 2.4 and 5 GHz) and exhibits input and output impedance to meet the required inductance and Q factor. Note that alternative configurations for the transformer windings may be implemented depending on the particular application.

Figure 22:
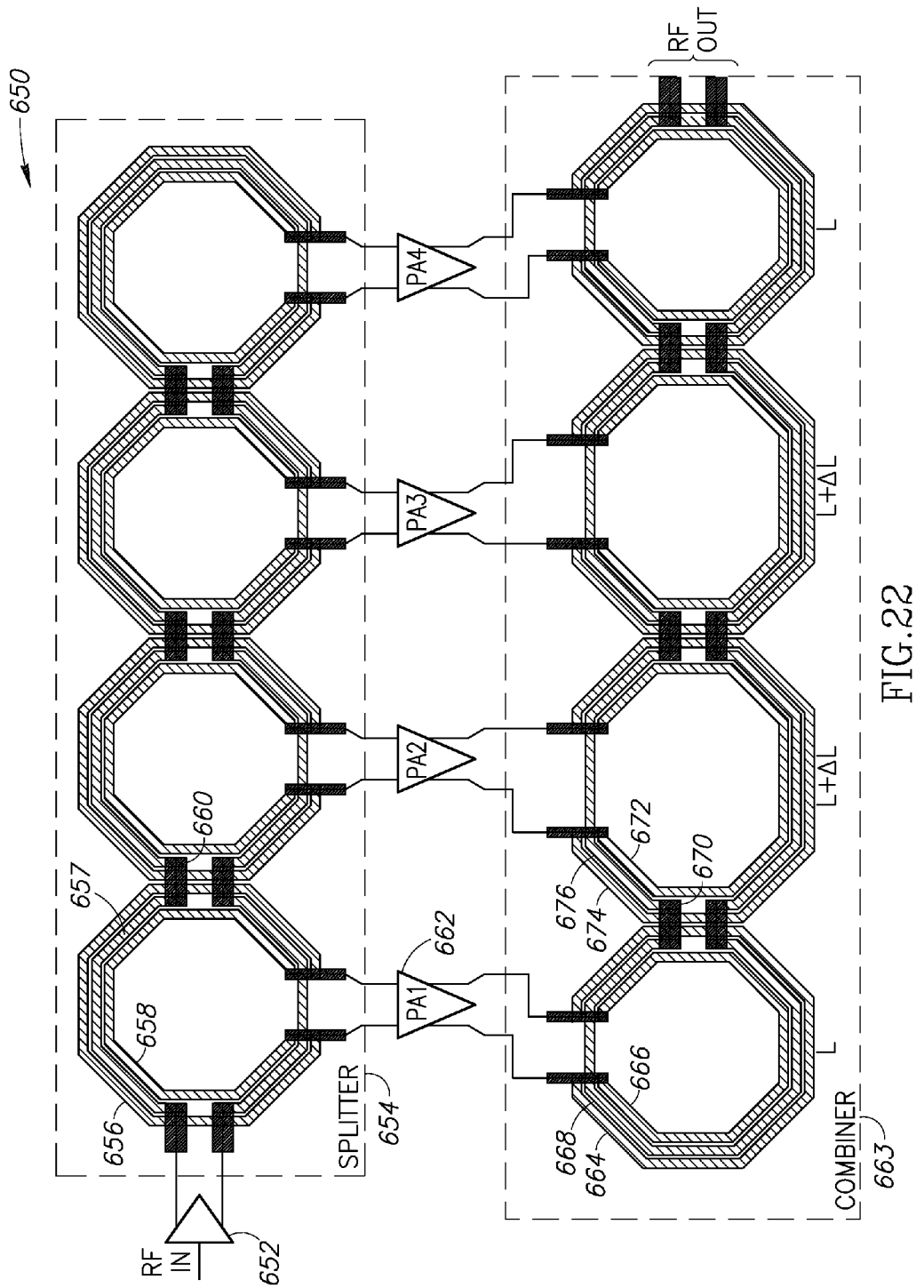
FIG. 22 is a layout diagram illustrating a tenth example integrated transformer for use with the power amplifier of the present invention.

In another alternative technique to combat any phase mismatch of the transformers, the primary windings of the inner two transformers of the combiner (i.e. PA2 and PA3 windings) are made longer than those of the outer two transformers (i.e. PA1 and PA4 windings). This effectively increases the inductance of the inner two primary windings to a value L+ΔL with the outer two primary windings having an inductance represented by L. This eliminates the need to crossover the inputs to the differential sub-amplifiers. Such a circuit is shown in FIG. 22. Note that increasing the inductance by an amount ΔL of approximately 20% (i.e. 10% per side) is effective in minimizing the phase mismatch. It is also noted that the variation in inductance L with PVT is roughly ±8% versus ±20% for capacitance C 646 used in the circuit of FIG. 20.

The transformer, generally referenced 650, comprises a splitter 654, four sub-amplifiers 662 and a combiner 663. The splitter comprises one primary winding 657 and four sets of octagonal shaped secondary windings arranged in a sequential or linear row array configuration. Each set of secondary windings comprises two parallel windings 656, 658. This increases the current handling capability of the transformer. The middle winding is the primary, which runs between the parallel secondary windings.

The combiner comprises four sets of octagonal shaped primary windings (664, 666) and 674,672) and one secondary winding 668, 676 arranged in a sequential or linear row array configuration. As described supra, the inner two sets of windings corresponding to PA2 and PA3 have longer windings resulting in larger inductance of L+ΔL. Each set of primary windings comprises two parallel windings. This reduces the current crowding (proximity) effect as the current is spread more uniformly in the secondary thereby reducing losses. It also increases the current handling capability of the transformer. The middle winding is the secondary, which runs between the parallel primary windings.

In particular, both the splitter and combiner comprise four sets of windings, each associated with one of the differential sub-amplifiers PA1, PA2, PA3 and PA4. The RF input signal is input to a buffer 652 whose differential output is applied to the primary of the splitter transformer. The parallel secondary windings of each transformer of the splitter are coupled to a respective differential input of a sub-amplifier. The primary winding 657 snakes between the four sets of parallel secondary windings to generate the four signals input to the sub-amplifiers. The output of each sub-amplifier is input to a respective transformer in the combiner. The secondary winding 668, 676 snakes between the four sets of parallel primary windings (664, 666) and 674,672) and to generate the PA output which is subsequently coupled to the TX/RX switch. The transformers in the splitter and combiner both have air cores and the width, spacing and thickness of the metal layers is configured to provide sufficient performance at the respective frequency bands (e.g., 2.4 and 5 GHz) and exhibits input and output impedance to meet the required inductance and Q factor. Note that alternative configurations for the transformer windings may be implemented depending on the particular application.

Figure 23:
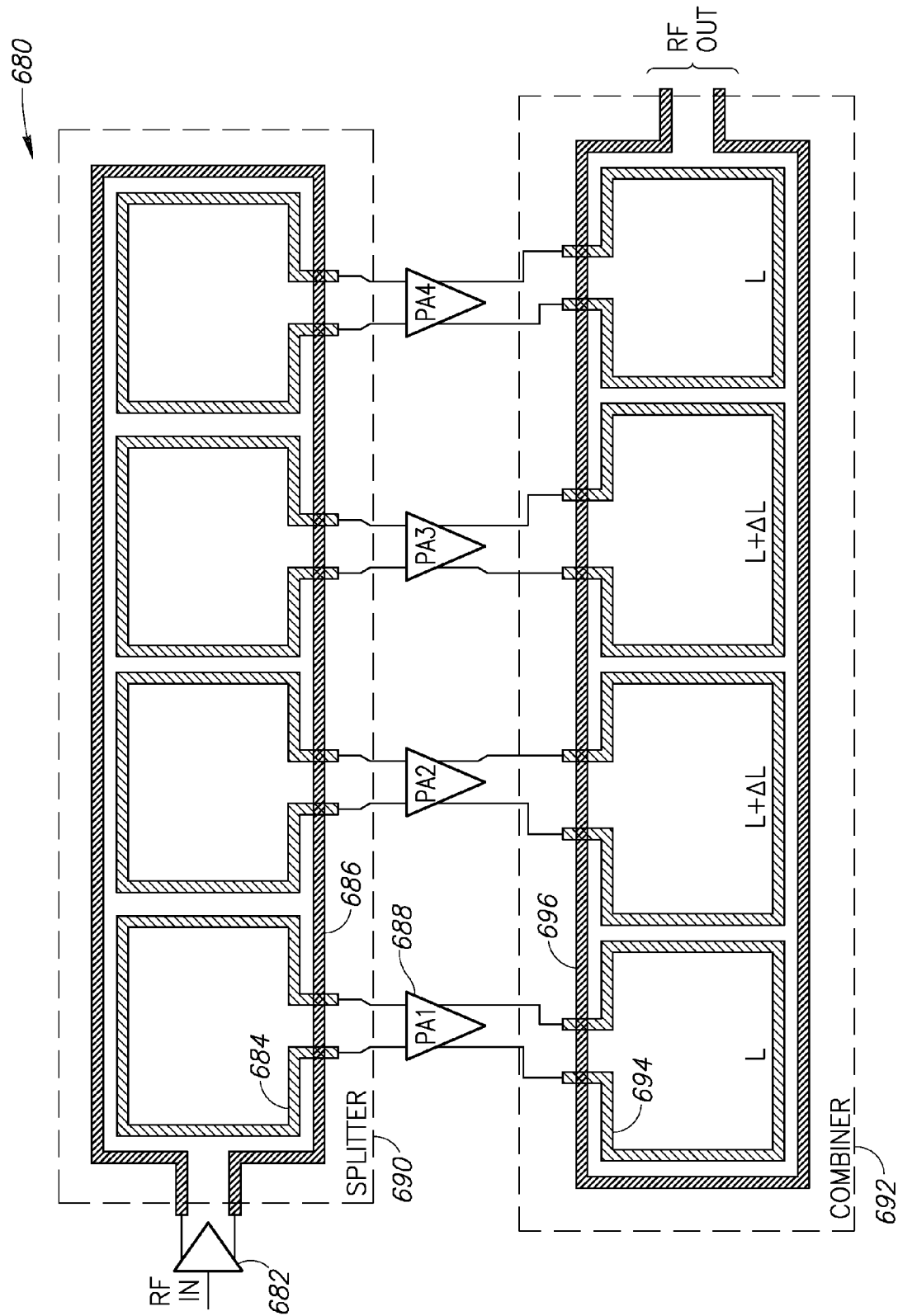
FIG. 23 is a layout diagram illustrating an eleventh example integrated transformer for use with the power amplifier of the present invention.

A layout diagram illustrating a eleventh example integrated transformer for use with the power amplifier of the present invention is shown in FIG. 23. In this alternative embodiment, to address the phase mismatch of the transformers, the primary windings of the inner two transformers of the combiner (i.e. PA2 and PA3 windings) are made longer than those of the outer two transformers (i.e. PA1 and PA4 windings). This effectively increases the inductance of the inner two primary windings to a value L+ΔL with the outer two primary windings having an inductance represented by L. This eliminates the need to crossover the inputs to the differential sub-amplifiers. Note that increasing the inductance by an amount ΔL of approximately 20% (i.e. 10% per side) is effective in minimizing the phase mismatch. It is also noted that the variation in inductance L with PVT is roughly ±8% versus ±20% for capacitance C 646 used in the circuit of FIG. 20.

The transformer, generally referenced 680, comprises a splitter 690, four sub-amplifiers 688 and a combiner 692. The splitter comprises one primary winding 686 and four sets of rectangular shaped secondary windings 684 arranged in a sequential or linear row array configuration.

The combiner comprises four sets of rectangular shaped primary windings 694 and one secondary winding 696 arranged in a sequential or linear row array configuration. As described supra, the inner two sets of windings corresponding to PA2 and PA3 have longer windings resulting in larger inductance of L+ΔL.

In particular, both the splitter and combiner comprise four sets of windings, each associated with one of the differential sub-amplifiers PA1, PA2, PA3 and PA4. The RF input signal is input to a buffer 682 whose differential output is applied to the primary of the splitter transformer. The parallel secondary windings of each transformer of the splitter are coupled to a respective differential input of a sub-amplifier. The primary winding 686 encircles the four secondary windings to generate the four signals input to the sub-amplifiers. The output of each sub-amplifier is input to a respective transformer in the combiner. The secondary winding 696 encircles the four primary windings 694 to generate the PA output which is subsequently coupled to the TX/RX switch. The transformers in the splitter and combiner both have air cores and the width, spacing and thickness of the metal layers is configured to provide sufficient performance at the respective frequency bands (e.g., 2.4 and 5 GHz) and exhibits input and output impedance to meet the required inductance and Q factor. Note that alternative configurations for the transformer windings may be implemented depending on the particular application.

In battery-operated wireless systems, such as mobile phones, an RF power amplifier (PA) is usually the most significant power-consuming component. To minimize the power consumption, a system-level power management scheme is designed to operate the RF PA over a wide range of output power. With a fixed supply voltage, the RF PA efficiency at lower power levels is very low, which adversely affects the average power consumption and the battery life. To improve the RF PA overall efficiency over the wide range of power, dynamic control of the supply voltage is implemented.

Power amplifier efficiency (PAE) is a critical factor in the RF design of modern wireless systems. In cellular base stations, for example, power consumption costs carriers millions of dollars annually. In smart phones, PA efficiency is an increasing concern as battery life declines and handsets get hotter. This inefficiency is brought about because the most recent higher-speed 3G and 4G technologies use modulation methods such as WCDMA and Long-Term Evolution (LTE) with quadrature amplitude modulation (QAM) over orthogonal frequency-division multiplexing (OFDM). All of these technologies require linear PAs that are less efficient by their nature. The typical linear RF PA operates in class A or class AB to achieve its linearity. Maximum theoretical efficiency is 50%, but in practice, maximum efficiencies are in the 30% to 35% range. This efficiency is best achieved when the amplifier is in compression or operating near the compression point. Compression occurs when the input signal is at or near its peak. With the latest modulation methods, the Peak to Average Power Ratio (PAPR) is high. The PA then operates well below the compression point for much of the transmission, providing good linearity with an efficiency average of 20% or less. This causes the power dissipated as heat to increase, and the excessive current drawn by the PA leads to shorter battery life.

The present invention addresses this issue by utilizing envelope tracking which replaces the typical fixed DC supply for the PA with a fast-changing DC supply that dynamically tracks the amplitude or envelope of the RF signal. Envelope Tracking (ET) and Envelope Elimination and Restoration (EER) are two techniques used to realize highly efficient linear RF power amplifiers. In both techniques, a high-efficiency modulated power supply supplies the RF PA with variable voltage as shown in FIGS. 24 and 25.

Figure 24:
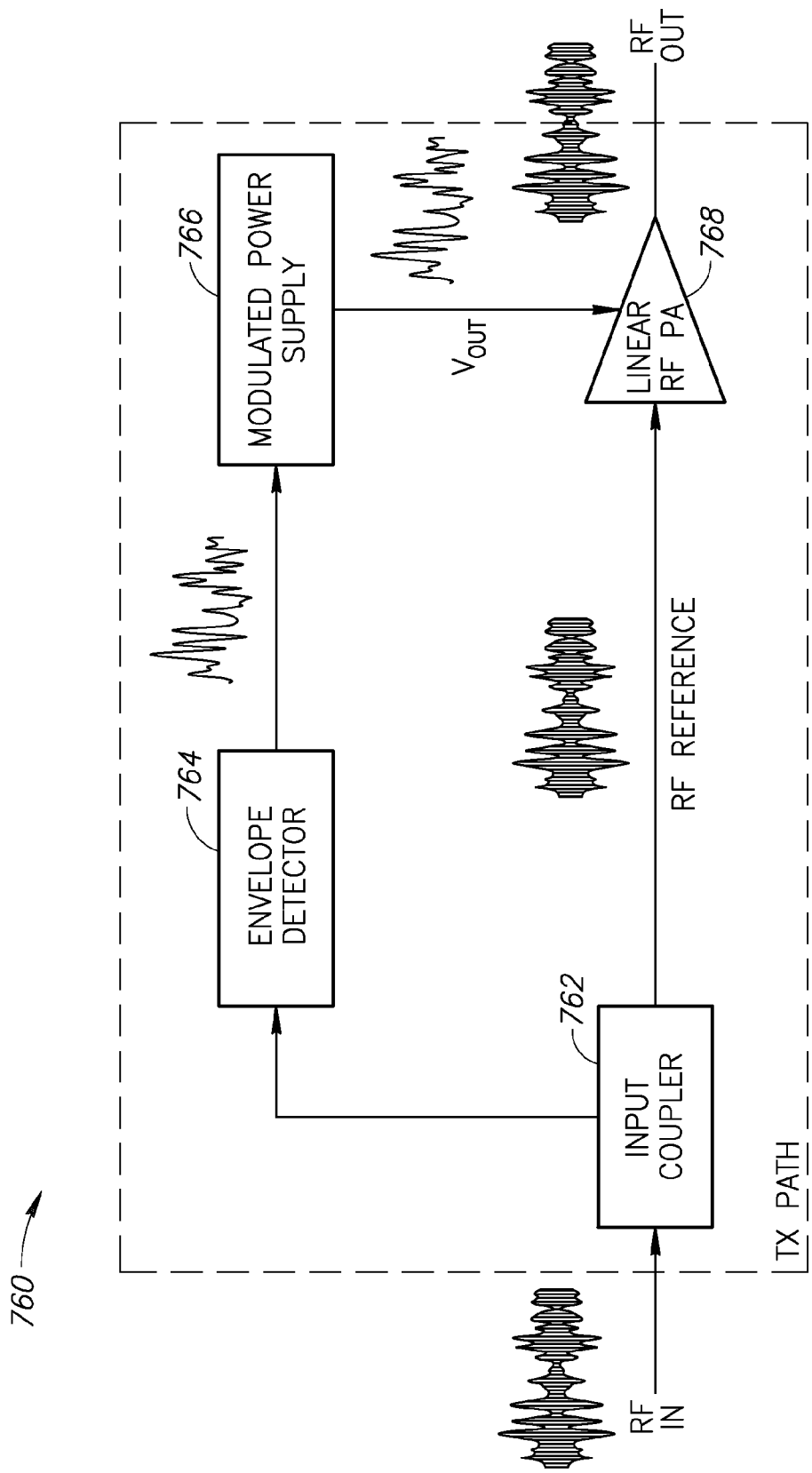
FIG. 24 is a block diagram illustrating a seventh example TX path portion of the FEM circuit.

A block diagram illustrating a seventh example TX path portion of the FEM circuit incorporating envelope tracking is shown in FIG. 24. The circuit, generally referenced 760, comprises an input coupler 762, envelope detector 764, modulated power supply 766 and linear RF power amplifier 768. In operation, an envelope of the RF input signal is generated by the envelopment detector and input to the modulated power supply which generates a dc voltage output Vout that conforms to the envelope of the RF input signal. This voltage output serves as the supply voltage for the linear RF PA. Note that power buffer is optional as the DC-DC converter output voltage can be connected directly to the PA supply voltage as the power amplifier is based on a linear topology (i.e. ET).

Figure 25:
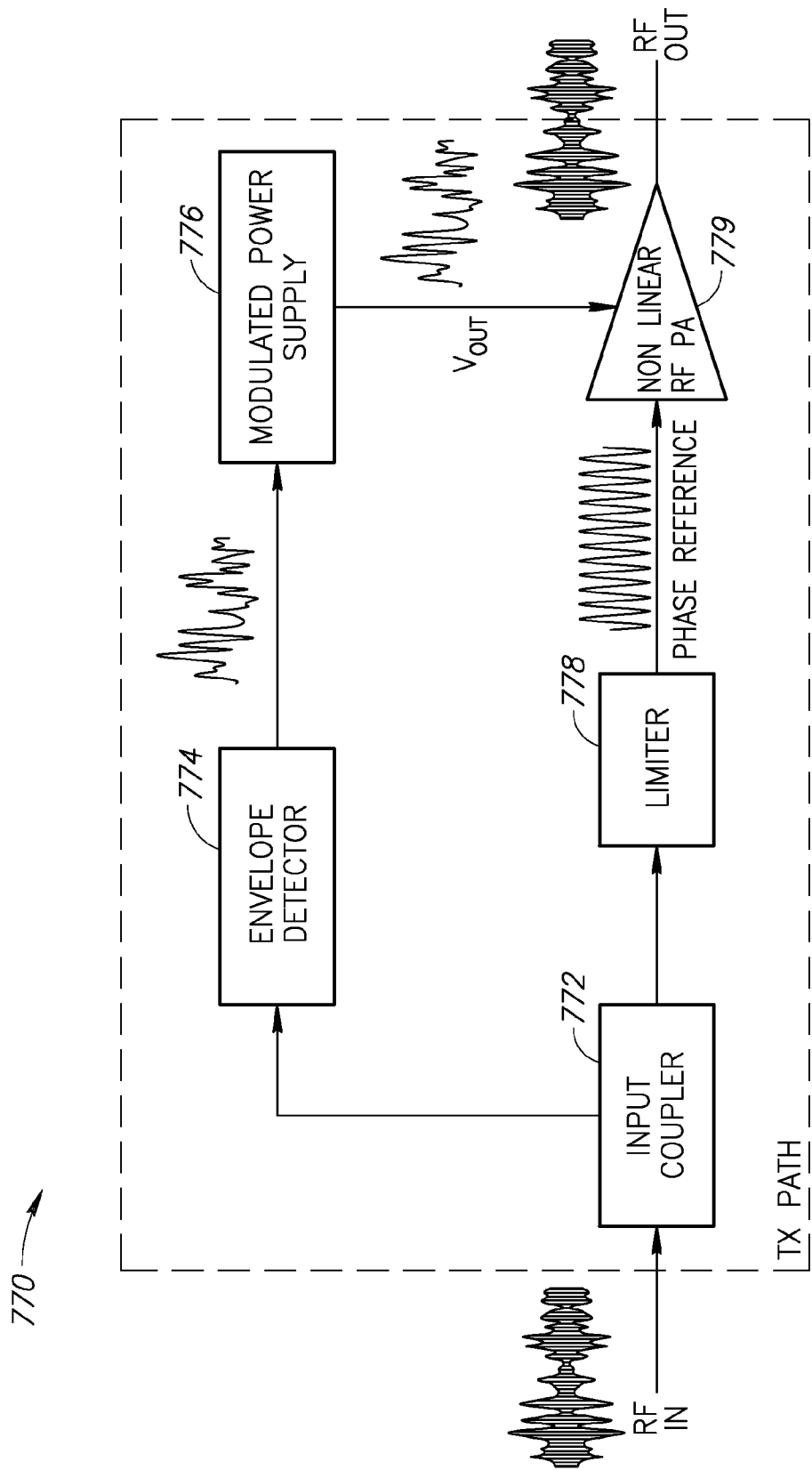
FIG. 25 is a block diagram illustrating an eighth example TX path portion of the FEM circuit.

A block diagram illustrating an eighth example TX path portion of the FEM circuit incorporating envelope elimination and restoration is shown in FIG. 25. The circuit, generally referenced 770, comprises an input coupler 772, envelope detector 774, modulated power supply 776, limiter 778 and nonlinear RF power amplifier 779. In operation, an envelope of the RF input signal is generated by the envelopment detector and input to the modulated power supply which generates a dc voltage output Vout that conforms to the envelope of the RF input signal. The limiter generates a phase reference signal that is input to the nonlinear PA. The voltage output Vout serves as the supply voltage for the nonlinear RF PA. Note that use of a power buffer in this circuit is not optional as the PA is based on a non-linear topology (i.e. EER).

A technique for using a DC-DC converter with very fast output voltage transitions to realize a high-efficiency envelope tracking system is described below.

Figure 26A:
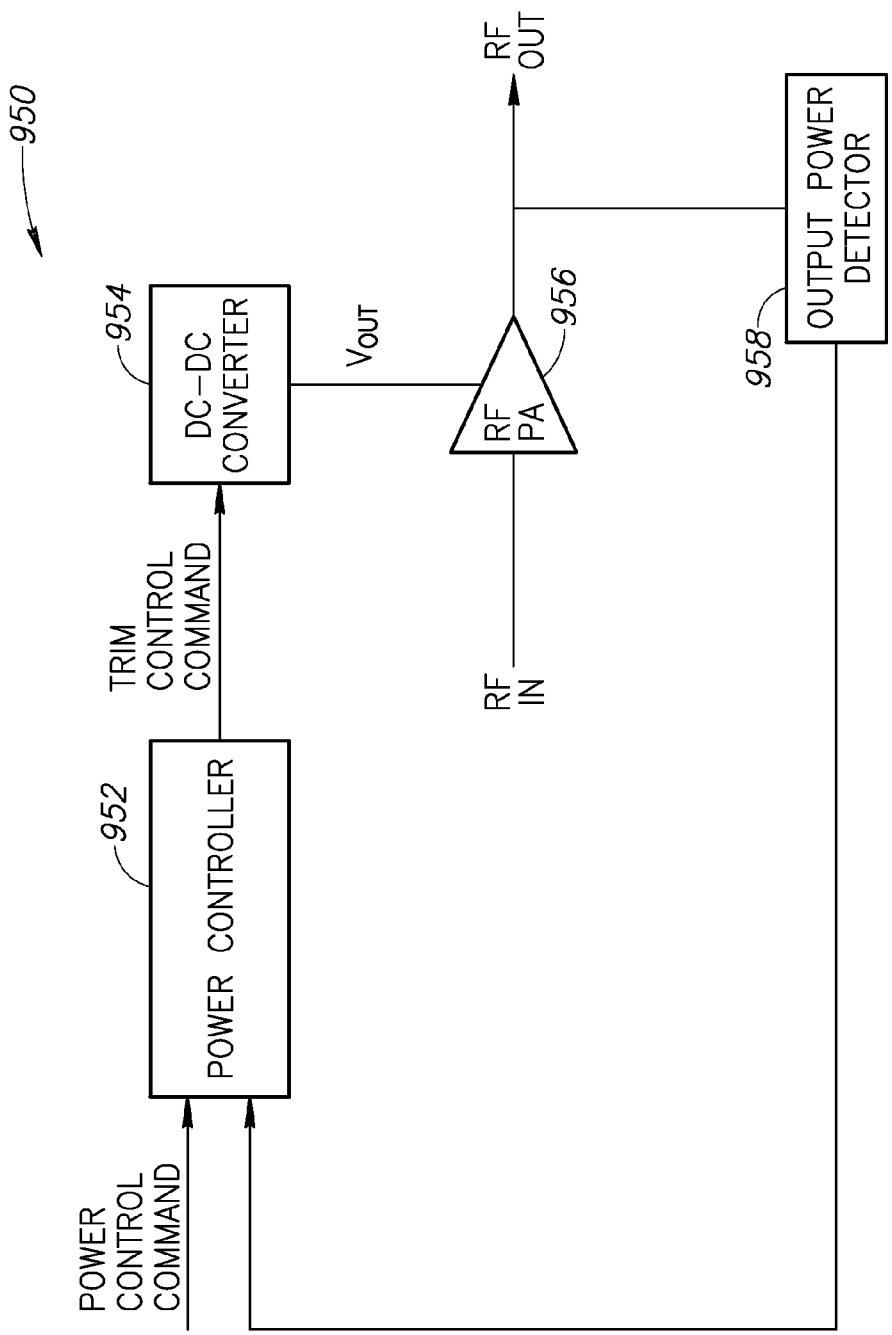
FIG. 26A is a high level system block diagram illustrating an example DC-DC converter of the present invention.

A system block diagram implementing a closed-loop RF power control through the power supply is shown in FIG. 26A. The circuit, generally referenced 950, comprises an RF power amplifier 956, an output power detector 958, power controller block 952 and DC-DC converter 954. The output RF power is sensed through the detector 958 and compared to a power control command signal. In response to the error between the sensed RF power and the command power, the trim control of the DC-DC converter 954 adjusts the output voltage (Vout). In the steady state, the measured output power ideally equals the power control command. In this system, compared to a more traditional realization where the supply voltage for the RF PA is constant, the overall efficiency improvement depends on the DC-DC converter which is capable of maintaining very high efficiency over a wide range of output voltages and output power levels. The challenge in implementing a conventional DC-DC converter for the RF PA is the need to provide very fast output voltage transitions in response to the RF PA output power changes. Described below is a novel approach for providing very fast output voltage transitions in the DC-DC converter.

A high level block diagram of an example synchronous DC-DC converter is shown in FIG. 26A (buck topology is presented for illustration purposes only but boost, forward and any other DC-DC converter configuration may be used). The circuit, generally referenced 720, comprises input voltage Vin 722, switches 724, 726, switch driver 736, inductor Lo 728, capacitor Co 730, resistors R1, R1, pulse width modulation (PWM) generator 734 and error amplifier 732. In operation, the buck converter is used to generate a lower output voltage (Vout) from a higher DC input voltage (Vin). If the losses in both switches (high-side and low-side FETs) and inductor are ignored then the duty cycle or the ratio of ON time to the total period of the converter can be expressed as $$D = \frac{Vout}{Vin} \quad (1)$$

Figure 26B:
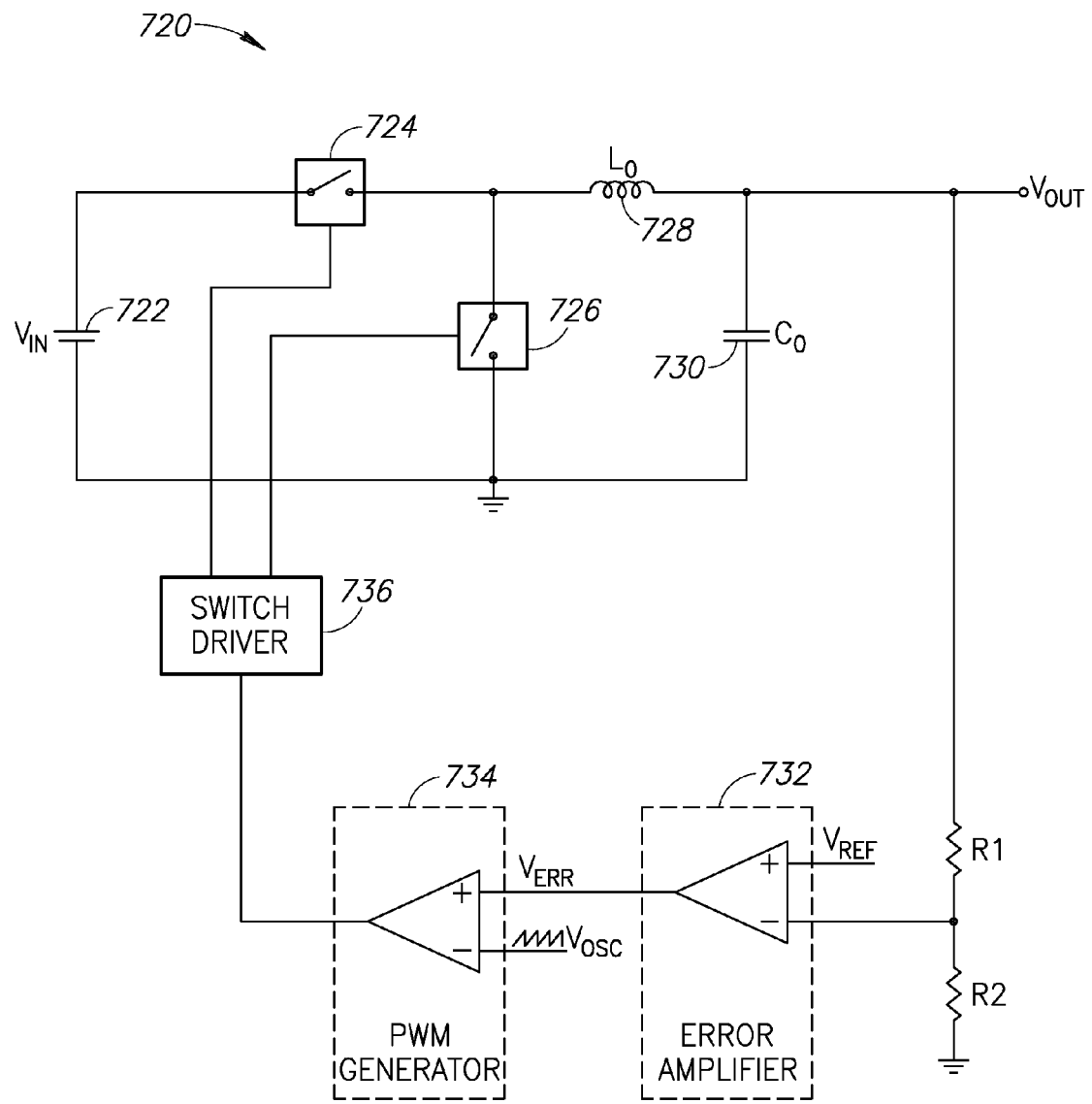
FIG. 26B is a high level block diagram illustrating an example synchronous DC-DC buck converter of the present invention.

The duty cycle is determined by the output of the error amplifier (Verr) and the PWM ramp voltage (Vosc) as shown in FIG. 26B. The Vosc signal in this and other embodiments may comprise sinusoidal, triangle, saw tooth or any other suitable signal. The ON time begins on the falling edge of the PWM ramp voltage and stops when the ramp voltage equals the output voltage of the error amplifier. The output of the error amplifier (Yen) in turn is set so that the feedback portion of the output voltage (Vout) is equal to the internal reference voltage (Vref). This closed-loop feedback system causes the output voltage to regulate at the desired level. Normally, a resistor divider network (R1 and R2) as shown in FIG. 26B is used to feed back a portion of the output voltage to the inverting terminal of the error amplifier. This voltage is compared to Vref and during steady state regulation the error-amplifier output will not go below the voltage required to maintain the feedback voltage equal to Vref. Thus, the output voltage can be expressed as $$Vout = Vref\left(1 + \frac{R1}{R2}\right) \quad (2)$$

As it can be seen from Equation (2), the output voltage (Vout) can be changed by varying the reference voltage (Vref).

Figure 27:
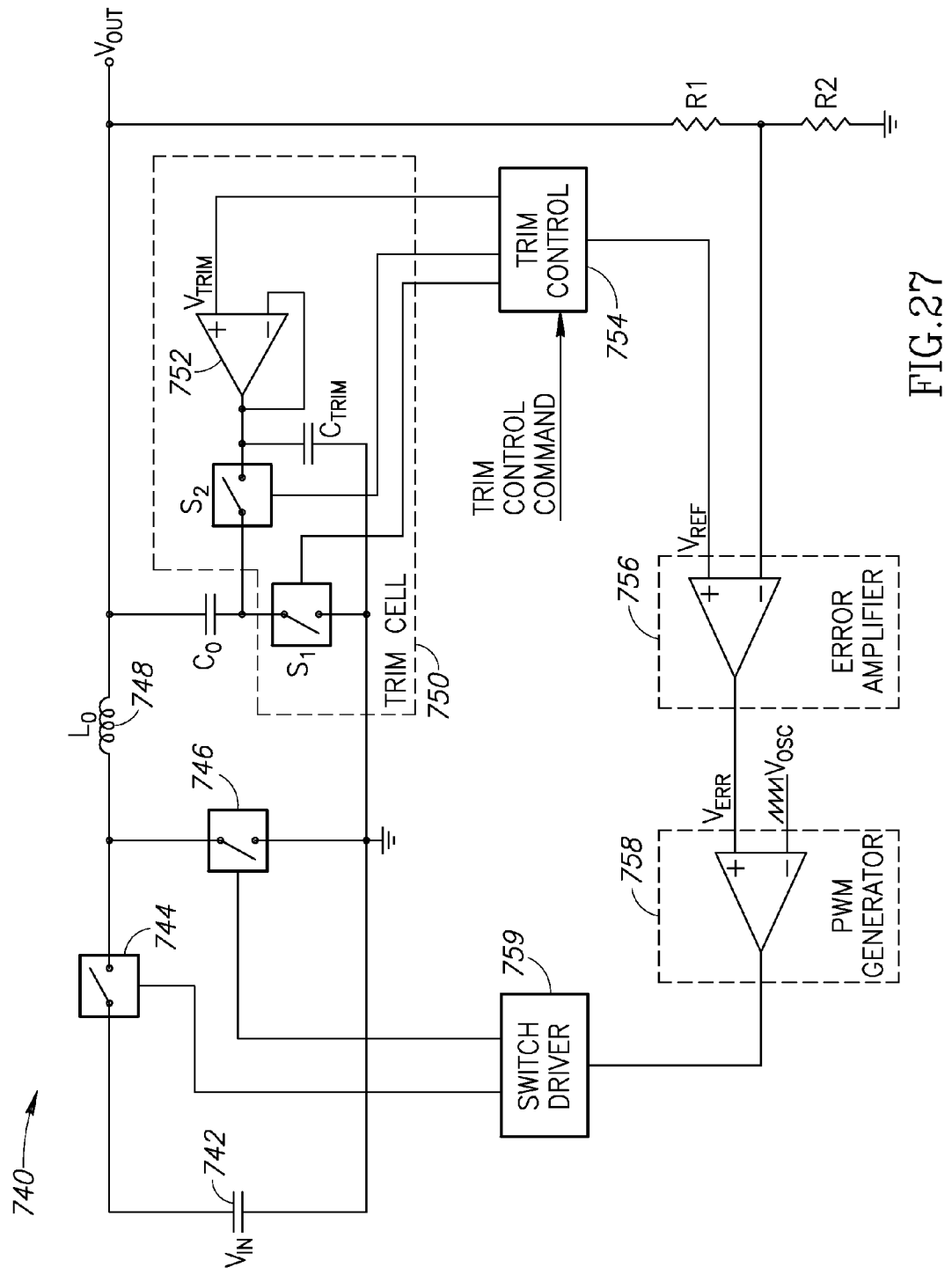
FIG. 27 is a block diagram illustrating an example DC-DC converter of the present invention incorporating a trim cell.

In order to provide very fast output voltage transitions in the DC-DC converter, the present invention provides a novel approach described below. A high level block diagram of a synchronous DC-DC buck converter incorporating an example fast output voltage transition circuit is shown in FIG. 27. The circuit, generally referenced 740, comprises an input voltage source Vin 742, switches 744, 746, switch driver 759, output inductor Lo 748, output capacitor Co 749, trim cell 750, trim control block 754, resistors R1, R2, error amplifier 756 and PWM generator 758. The trim cell comprises trim buffer 752m capacitor Ctrim and switches S1, S2.

In operation, during the steady state mode, switch S1 is on and switch S2 is off. The capacitor Ctrim is charged to Vtrim through the trim buffer. In this mode, the converter operates as the DC-DC converter in FIG. 26B and its output voltage value can be calculated using Equation (2). The output capacitor (Co) is charged to the output voltage (Vout). Once the trim control command is applied as a trim up command (i.e. output voltage increases), switch S1 is turned off and switch S2 is turned on thereby connecting the trim capacitor (Ctrim) in series to the output capacitor (C0). The voltage on these two capacitors is defined as Vout+Vtrim such that the output voltage (Vout) increases very quickly (virtually instantaneously) to the new value given by $$Vout\_trim\_up = Vout + Vtrim \quad (3)$$

In order to keep the DC-DC converter feedback loop in the steady-state condition, the reference voltage (Vref) is increased by a delta voltage given by the following $$\Delta Vref = Vtrim\left(\frac{R2}{R1 + R2}\right) \quad (4)$$

The transition from the output voltage (Vout) to the new voltage (Vout_trim_up) occurs very fast because there is no need to charge the output capacitor (Co) and the trim capacitor (Ctrim).

Before applying a trim down control command (i.e. output voltage decrease), the steady-state condition of the DC-DC converter should be as follows. Switch S1 is off and switch S2 is on while the trim capacitor (Ctrim) is connected in series to the output capacitor (C0) and charged to the Vtrim voltage through the trim buffer. In this mode, the converter operates as a conventional DC-DC converter as in FIG. 25 and its output voltage value can be calculated using Equation (2). After the trim down control command is applied, switch S1 is turned on and switch S2 is turned off, thereby disconnecting the trim capacitor (Ctrim) from the output capacitor (Co). The voltage on the output capacitor (Co) is Vout-Vtrim such that the output voltage (Vout) decreases very quickly (virtually instantaneously) to the new value defined as follows $$Vout\_trim\_down = Vout - Vtrim \quad (5)$$

In order to keep the DC-DC converter feedback loop in the steady-state condition, the reference voltage has to be decreased by a delta voltage given by $$\Delta Vref = Vtrim\left(\frac{R2}{R1 + R2}\right) \quad (6)$$

The transition from the output voltage (Vout) to the new voltage (i.e. Vout_trim_down) occurs very fast because there is no need to discharge the output capacitor (Co).

Figure 28:
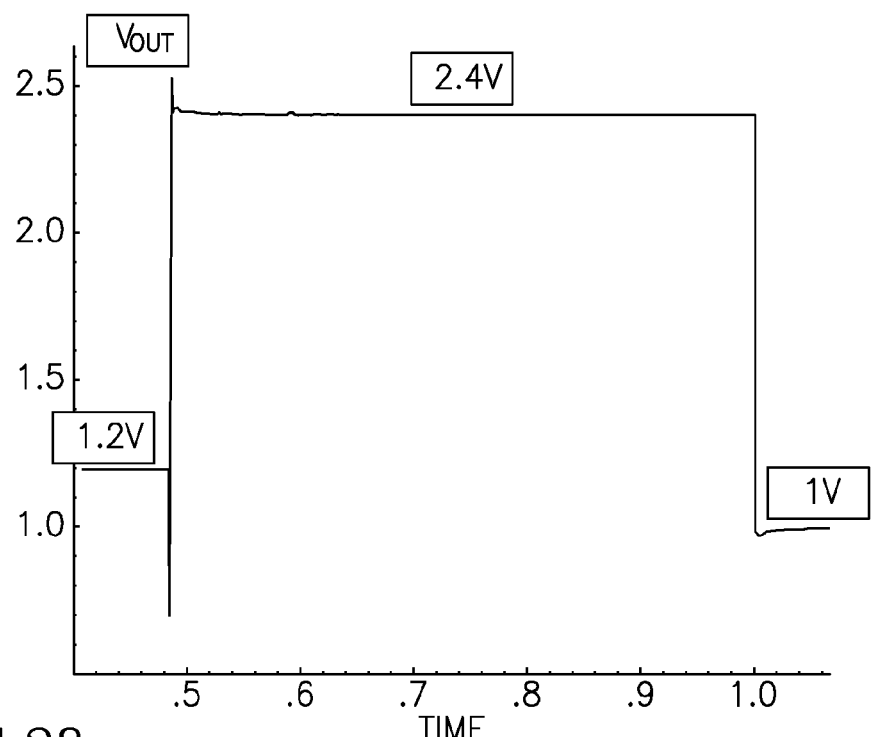
FIG. 28 is a diagram illustrating the output voltage of the DC-DC converter circuit.
Figure 29:
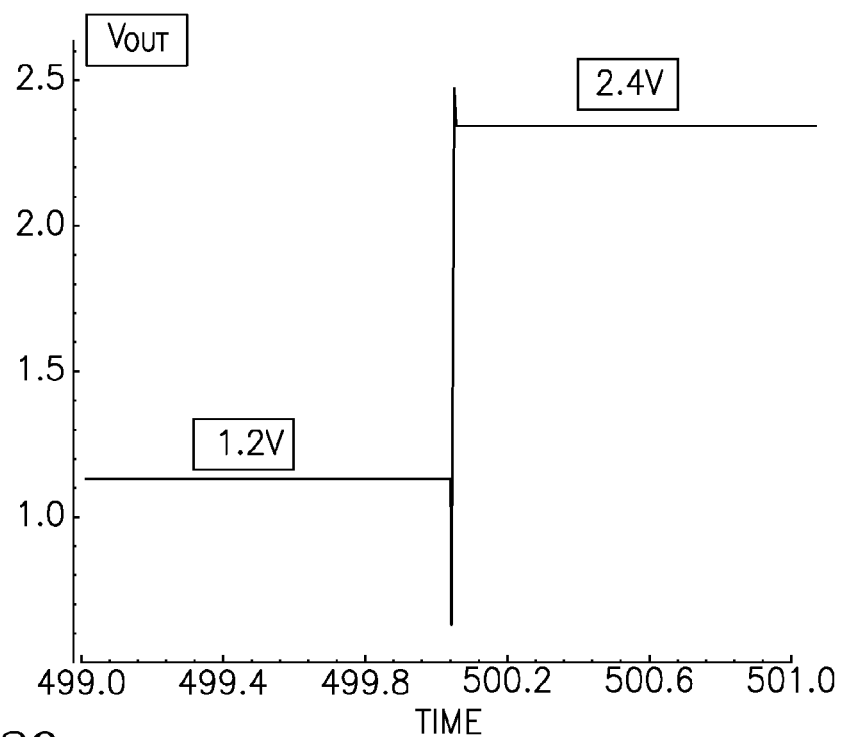
FIG. 29 is a diagram illustrating the output voltage of the DC-DC converter circuit for a rising edge.
Figure 30:
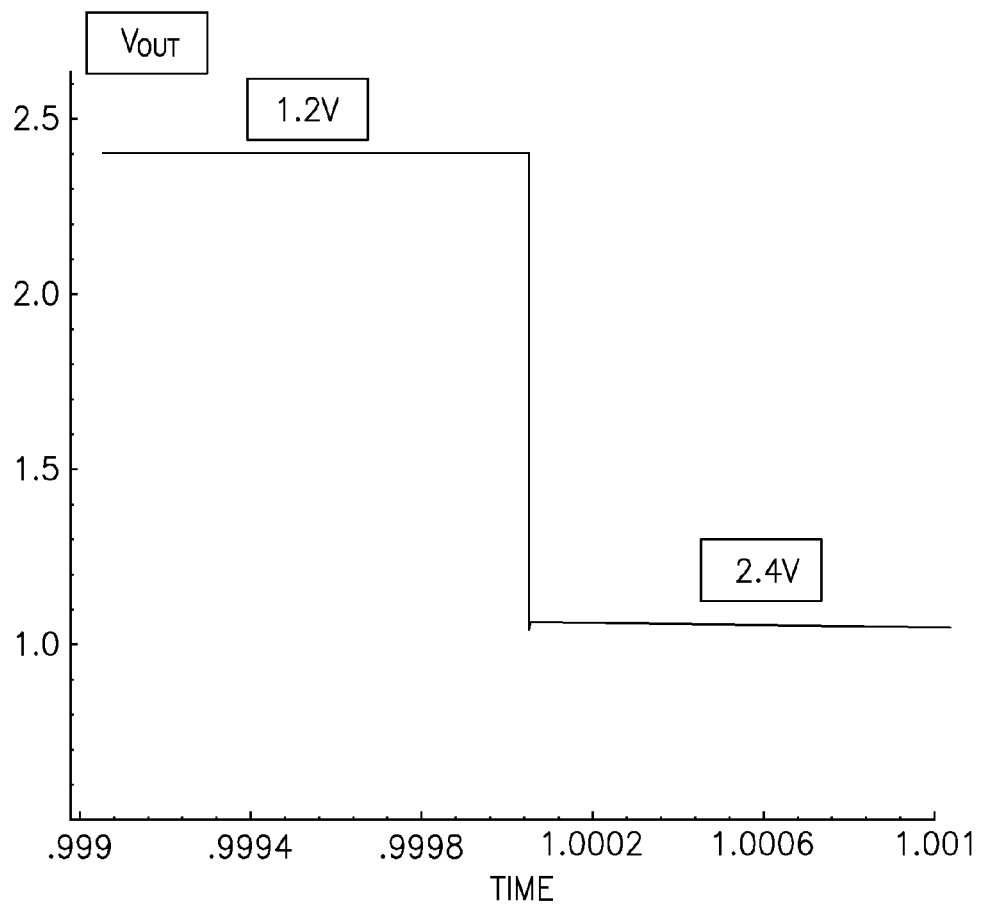
FIG. 30 is a diagram illustrating the output voltage of the DC-DC converter circuit for a falling edge.

The converter circuit proposed was simulated using the following parameters using synchronous DC-DC buck topology: Co=Ctrim=22 µF; Lo=6.8 µH; Fsw=1.15 MHz; Vout=1.2 V and Vtrim up=1.2 V for trimming up; Vout=2.4 V and Vtrim=1.4 V for trimming down; Iload=500 mA; Vin=3 V. The simulation results are presented in FIGS. 28, 29 and 30. FIG. 28 shows a simulated output voltage waveform for the synchronous DC-DC buck converter. FIG. 29 shows a zoom in of the trimming up output waveform while FIG. 30 shows a zoom in of the trimming down waveform.

It is noted that the simulation results show a very fast (less than 0.1 µSec) voltage transition during the output voltage rise and fall. These results are compared to the theoretically calculated rise and fall times of the conventional DC-DC buck converter by using the following equation below $$trise/tfall = \sqrt{\frac{2LC}{Dm(1-Dm)\left(\frac{1}{|\Delta D|}+0.5\right)}} \quad (7)$$

Where Dm=(D1+D2)/2 and ΔD=D2−D1. D1 is the initial steady-state duty cycle while D2 is the final steady-state duty cycle.

Using the same parameters for the simulation results described supra, where D1=0.4 and D2=0.8 for trimming up and D1=0.8 and D2=0.333 for trimming down, we obtain the following calculated results

*t*rise=20.4 μSec

*t*fall=21.5 μSec

Figure 31:
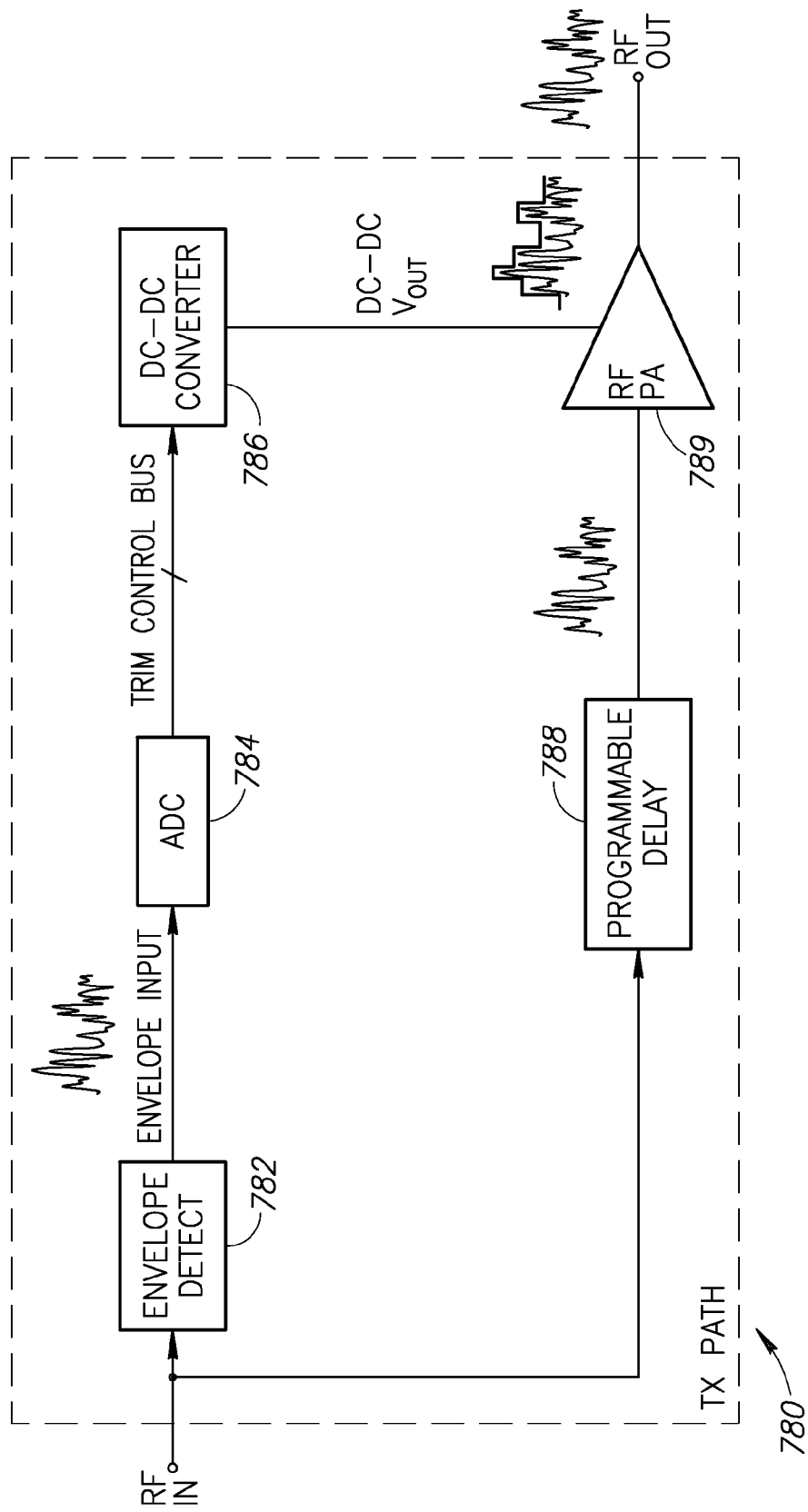
FIG. 31 is a block diagram illustrating an ninth example TX path portion of the FEM circuit.

A high level block diagram of an example high-efficiency envelop tracking method and system utilizing the DC-DC converter with fast output voltage transitions described supra is shown in FIG. 31. The system, generally referenced 780, comprises an envelope detector 782, analog to digital converter (ADC) 784, DC-DC converter 786 with fast output voltage transitions as described supra, programmable delay 788 and RF power amplifier (buffer) 789. Note that power buffer is optional as the DC-DC converter output voltage can be connected directly to the PA supply voltage.

In operation, the RF envelope signal (envelope input) output of the envelope detector 782 is applied to the A/D converter and to the PA power buffer (through the delay 788) simultaneously. The A/D converter functions to quantize the analog RF envelop signal into a digital signal which is then applied as a digital trim control bus to the DC-DC converter with fast output voltage transitions. In one embodiment, a property of the trim control bus is that only one bit is high (i.e. logic "1") at a time while the other bits are at a low value (i.e. logic "0"). The contents of the digital trim control bus functions to change the DC-DC converter output voltage (DC-DC Vout). This output voltage tracks the RF envelop signal and provides a variable supply voltage to the PA power amplifier (buffer). The DC-DC Vout and RF envelope signal vary together, greatly increasing the PA power buffer efficiency and overall efficiency of the system. The programmable delay functions to compensate for the delay between the envelope detector and the RF signal path.

In an alternative embodiment, the envelope signal along with phase information in digital form may be provided by another sub-system or component such as the baseband sub-system. In this case, the A/D converter block is not necessary and the digital envelope signal can be used by the trim control circuit without the A/D converter thereby reducing the components and cost.

The DC-DC converter comprises the DC-DC converter shown in FIG. 27 and described supra. In order to configure the DC-DC converter with fast output voltage transitions appropriately for the RF envelope tracking system of the present invention, the converter is realized as a DC-DC converter having many discrete output voltages. To achieve this, n trim cells are added where n is number of bits of the trim control command bus. In addition, the trim control block generates n Vtrim voltages where n is number of bits of the trim control command bus as well as a variable Vref voltage.

Figure 32:
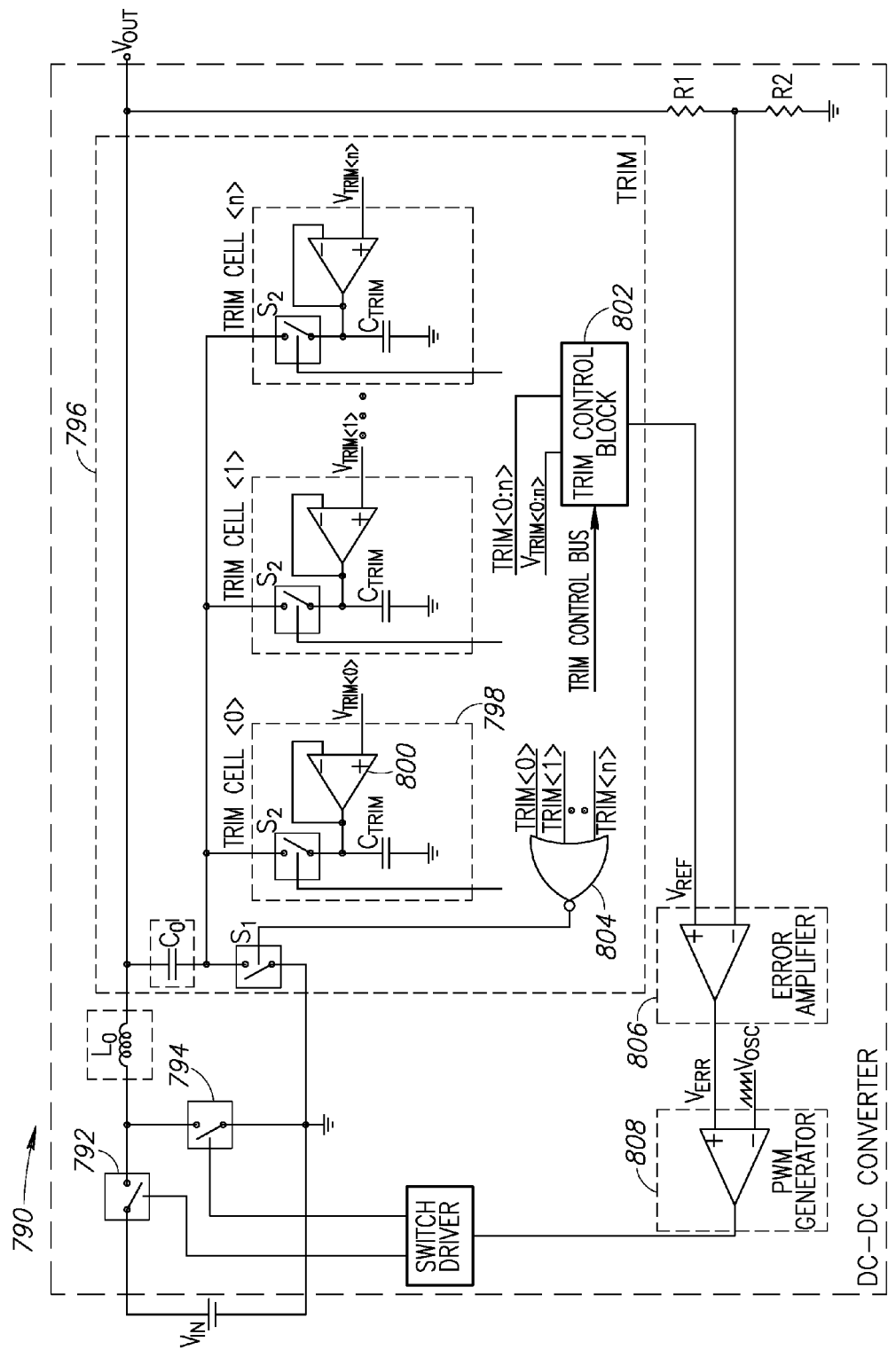
FIG. 32 is a block diagram illustrating an example DC-DC converter of the present invention incorporating multiple trim cells.

A block diagram illustrating an example DC-DC converter of the present invention incorporating multiple trim cells is shown in FIG. 32. The converter, generally referenced 790, comprises a voltage source Vin, switches 792, 794, output inductor Lo, output capacitor Co, switch driver 793, trim circuit 796, resistors R1, R2, error amplifier 806 and PWM generator 808. The trim circuit 796 comprises a plurality of trim cells 798, switch S1, trim control block 802 and NOR gate 804. Each trim cell 798 comprises a trim buffer 800, trim capacitor Ctrim and switch S2.

When all trim control bus signals have a "0" value, the output of gate 804 turns switch S1 on and all S2 switches in the n trim cells are off. Each Ctrim capacitor in each trim cell is charged to the proper Vtrim through its respective trim buffer. In this mode, the converter operates as a conventional DC-DC converter and its output voltage value can be calculated using Equation (8) below. The output capacitor (Co) is charged to the initial output voltage (Vout_init).

$$\text{Vout\_init} = Vref\left(1+\frac{R1}{R2}\right) \quad (8)$$

If, for example, the '0' bit of the trim control bus goes high (i.e. a "1" value), the switch S1 is turned off and the switch S2 is turned on thereby connecting the trim capacitor (Ctrim) of trim cell '0' in series with the output capacitor (Co). The voltage on these two capacitors is defined as Vout_init+Vtrim<0> such that the output voltage (Vout) increases very quickly (virtually instantaneously) to the new value given by $$V\text{out\_trim}<0>=V\text{out\_init}+V\text{trim}<0> \quad (9)$$

In order to keep the DC-DC converter feedback loop in the steady-state condition, the reference voltage (Vref) is increased by a delta voltage which is determined using the following $$\Delta Vref = Vtrim\langle 1\rangle\left(\frac{R2}{R1+R2}\right) \quad (10)$$

The transition from the output voltage (Vout_init) to the new voltage (i.e. Vout_trim<1>) occurs very fast because there is no need to charge the output capacitor (Co) and the trim capacitor (Ctrim) in trim cell '1'.

It can be seen that the output voltage of the DC-DC converter can be changed by varying the digital value of the trim control bus as follows $$V\text{out}=V\text{out\_init}+\Sigma_{i=0}{}^{n}a_{i}V\text{trim}_{i} \quad (11)$$

where $a_i$ is a digital value of the $i^{th}$ bit of the n bit trim control bus.

It is noted that an advantage of the envelop tracking method and system of the present invention is that the DC-DC converter is able to track the input envelope signal with relatively high bandwidth using a low switching frequency for the converter, therefore maintaining its high efficiency.

It is further noted that the linearity of a perfect linear PA with sufficient power supply rejection will be minimally affected during transitions of its supply voltage. Thus, in most cases there is no need for a smoothing circuit.

In reality, however, the linearity of the PA is affected due to rapid transitions in its supply voltage especially in cases where low EVM (i.e. high linearity) is required. Thus, a smoothing circuit block is preferably used, e.g. a power buffer, in the circuit. This power buffer is necessary if we consider a nonlinear PA (such as in an Envelope Elimination and Restoration or Polar transmitter based system) in which all the amplitude information is on the PA supply. This "power buffer" may comprise a buffer with gain=1 where its input is the envelop signal and its supply is the stepped, unsmoothed output from the DC-DC converter. Its smoothed output voltage is used for the PA supply.

The tracking circuit of the present invention was simulated using the following parameters in a DC-DC buck converter topology: flash type A/D converter; trim control bus=7 bits; Co=Ctrim<0:6>=22 µF; Lo=6.8 µH; Fsw=1.15 MHz; Vout_init=0.8 V; Vin=3 V; Vtrim<0>=150 mV; Vtrim<1>=300 mV; Vtrim<2>=450 mV; Vtrim<3>=600 mV; Vtrim<4>=750 mV; Vtrim<5>=900 mV; Vtrim<6>=1050 mV; RF envelop input comprised a sinusoidal waveform with a frequency of 10 MHz.

Figure 33:
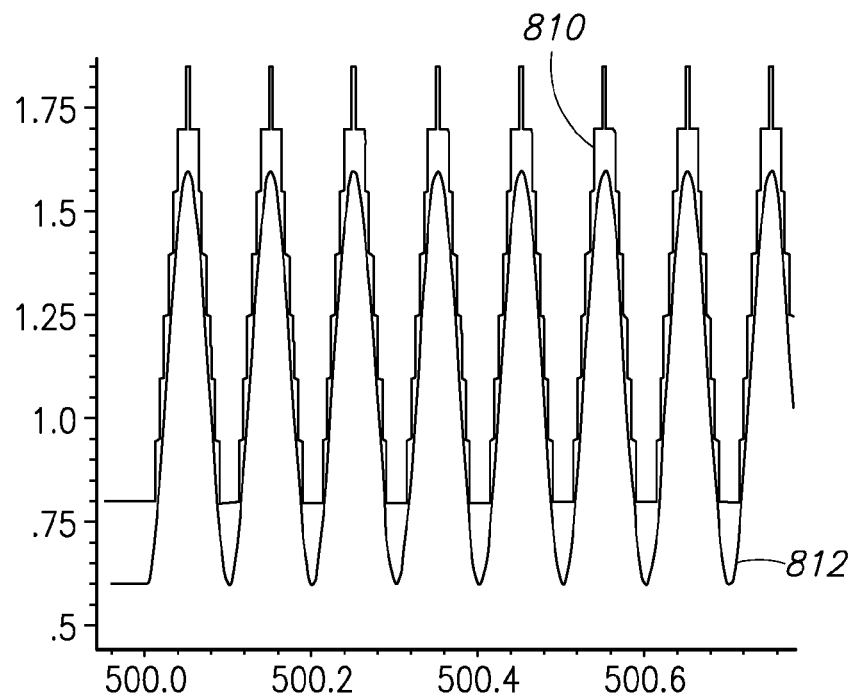
FIG. 33 is a diagram illustrating the output voltage of the DC-DC converter circuit for an RF input.
Figure 34:
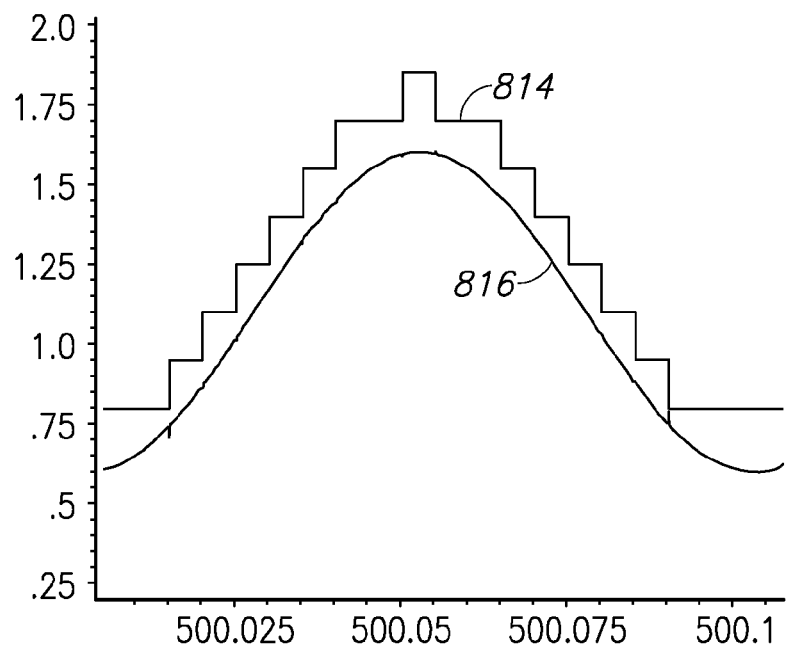
FIG. 34 is a diagram illustrating the output voltage of the DC-DC converter circuit for an RF input in more detail.

A diagram illustrating the output voltage of the DC-DC converter circuit for an RF input is shown in FIG. 33 where trace 810 represents the PA power buffer supply voltage and trace 812 represents the PA power buffer output voltage. A diagram illustrating the output voltage of the DC-DC converter circuit for an RF input in more detail is shown in FIG. 34 where trace 814 represents the PA power buffer supply voltage and trace 816 represents the PA power buffer output voltage. The simulation graphs of FIGS. 33 and 34 show very good tracking of the RF envelope signal by the DC-DC converter output voltage.

Figure 35:
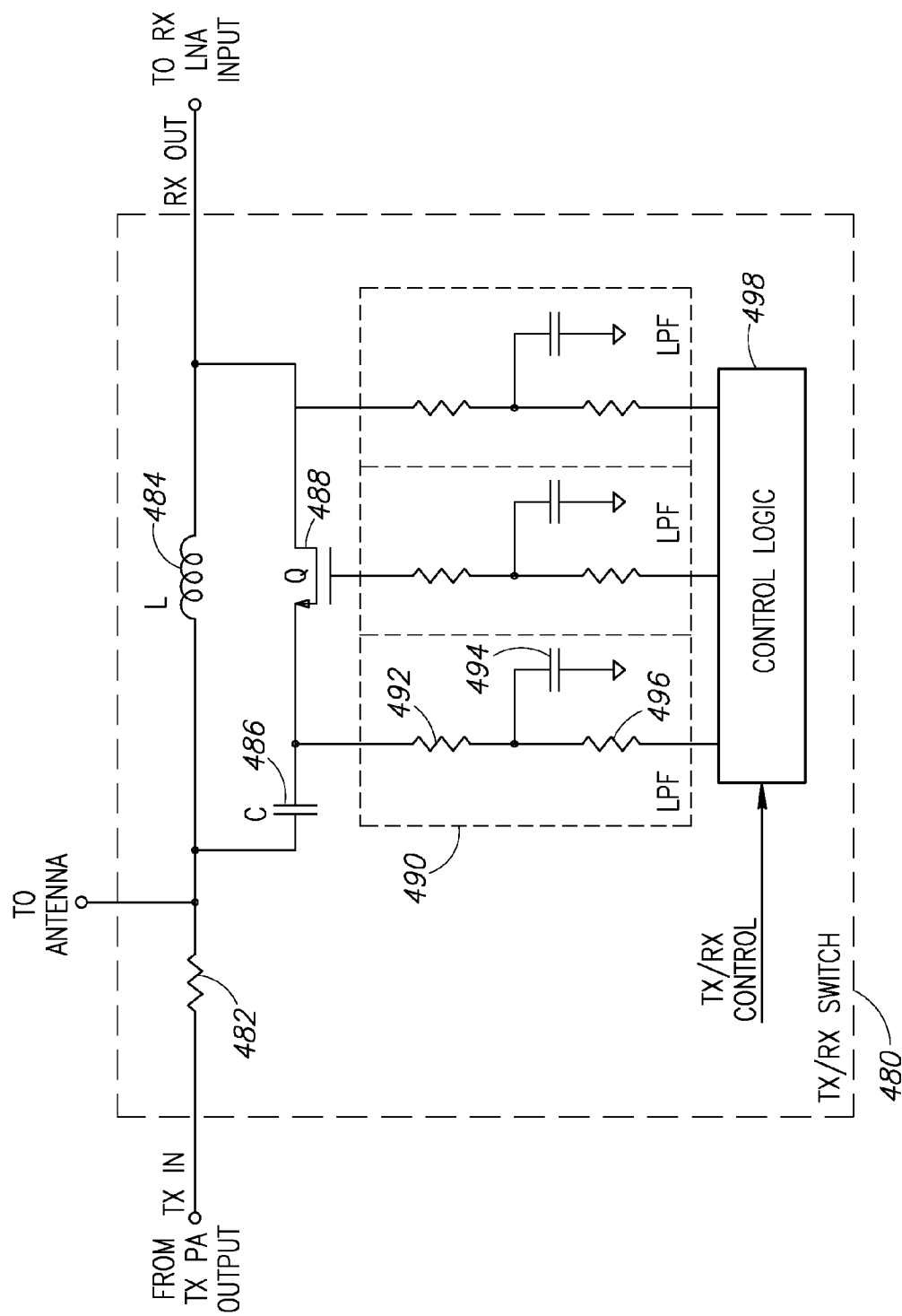
FIG. 35 is a schematic diagram illustrating a first example TX/RX switch.

A schematic diagram illustrating a first example TX/RX switch is shown in FIG. 35. The switch circuit, generally referenced 480, comprises a TX input port coupled to resistor R 482, inductor L 484 coupled to an RX output port, an antenna port, capacitor C 486, transistor Q 488, low pass filters 490 and control logic circuit 498. Each low pass filter comprises resistors 492, 496 and capacitor 494 coupled to ground and connected in a 'T' configuration.

In operation, the TX/RX switch is placed in receive mode by turning transistor Q off. In this mode, the signal path is from the antenna through inductor L to the LNA circuit. In one embodiment, the inductor may comprise an inductance of 1.4 nH. Alternatively, the inductor may be implemented as a bond wire having a suitable thickness (e.g., 0.7 mil) and length connected to a dummy pad.

To place the TX/RX switch into the transmit mode, transistor Q is turned on. In this mode, the combination of capacitor C and inductor L form a parallel resonant circuit and thus present a high impedance to the output of the transmitter while exhibiting a low insertion loss of less than 0.5 dB. The power from the transmitter is transferred to the antenna via resister R.

In one embodiment, the switch is implemented using standard CMOS technology. In another embodiment, a PIN diode is used to implement the switch along with the appropriate peripheral components that are used for biasing and matching networks. In an alternative embodiment, gallium arsenide (GaAs) based switches are used to implement the RF switch. GaAs based switches provide good linearity and isolation with low on resistance and off capacitance. Disadvantages of GaAs, however, include (1) the requirement of negative gate voltage to turn off due to their N-channel depletion mode configuration; (2) driving GaAs switches typically requires additional interface components; and (3) the difficulty of integrating other functions such as logic control and memory on the same chip.

In one embodiment, the RF switch is implemented entirely in CMOS and exhibits, high power, low current and high isolation while enabling integration with logic control circuitry and other digital circuitry based functions. Such an RF switch may be incorporated into a wireless device such as a mobile phone, cordless phone, etc. described in more detail infra.

Consider a wireless device such as a cordless phone including a base and one or more handsets. The handset usually comprises a single antenna with the recent trend of manufacturers implementing antenna diversity in the handset. Due to relatively small physical dimensions of the hand-set, regular space diversity is not practical. Thus, cordless phone manufacturers implement polarization diversity in hand-sets where one of the antennas is vertically polarized while a second antenna is horizontally polarized. This can improve the performance of the link up to 6 dB, on top of approximately 10 dB statistical improvement of diversity antenna in the base. The integrated CMOS DPDT switch of the present invention has additional advantages in the case of antenna diversity in hand-sets (HS) including requiring less PCB area which is critical in HS design; easy integration; and low BOM. The base station may comprise one or two antennas placed at a spatial angle to each other. At each point in time, space diversity is achieved, e.g., an antenna for which the direct wave and the reflected wave create constructive interference rather than destructive interference.

The logic control circuit 498 functions to generate the biasing voltages for the drain, source and gate terminals of transistor Q. The biasing signals are applied through the low pass filter networks 490 to the drain, source and gate of the transistor Q. The function of the LPF circuits 490 is to suppress the RF leakage from the drain, source and gate to the logic control circuit 498. Note that other RC type filter networks can be used without departing from the scope of the invention as is known in the art. Note also that the use of the RC filter networks avoids the needs for RF chokes which is desirable when implementing the switch in CMOS circuitry. Alternatively, RF chokes may be used either external to the chip or integrated therein.

In one embodiment, for the switch to operate at relatively high TX power levels (e.g., >25 dBm) and high VSWR, a deep N-well CMOS process is used to construct the N-channel FET 488.

In one embodiment, to turn the transistor Q on, a relatively high voltage (e.g., 3.6V) is applied to the gate while the drain and source terminals are connected to ground. Thus, $V_{GS}$ is 3.6V forward biasing the transistor. To turn the transistor Q off, a high voltage (e.g., 3.6V) is applied to the drain and source while the gate is connected to ground. Thus, $V_{GS}$ is −3.6V reverse biasing the transistor. It is noted that reverse biasing the transistor to be turned off rather than connecting the gate, drain and source to ground (or controlling the gate terminal only and keeping drain and source biasing constant) enables the RF switch to achieve significantly higher isolation on the order of approximately 17 dB.

The low pass filter networks 490 on the source, drain and gate terminals also function to provide termination so that the antenna has constant impedance relative to ground. The primary purpose of the LPF is to suppress the RF leakage from the drain, gate and source to the logic control circuit, thus preventing RF signal loss in the logic control circuit. This is achieved by configuring the switch circuit such that the impedance of the NMOS transistor is determined only by the physical parameters of the NMOS transistor itself (e.g., $R_{DS\text{-}ON}$, $C_{DS\text{-}OFF}$, $C_G$, $C_D$, $C_S$) and is independent of the logic control circuit.

It is appreciated that the logic control circuit is exemplary only and other components can be used for enabling the transistor Q to function such that each is turned on and off with the correct timing and synchronization in accordance with the particular application. The transistor Q and all related components can be placed on-chip, thus reducing cost.

It will also be appreciated that the RC network for the low pass filters and other components associated with the transistor Q are an example and that other circuits that perform similar functions may be used as is known in the electrical arts.

The logic control circuit controls the gate, drain and source of the transistor Q. The configuration and use of CMOS technology provide for low current consumption on the order of microamperes, as well as high isolation and flexibility as compared to prior art switches.

Note that the disclosed RF switch can also be used in environments in which one or more antennas are available, such as in handsets with or without antenna diversity, and with and without MIMO capability. The RF switch is not limited for use to any type of device and can be used for any environment in which multiple switches are required, such as wireless local area network access points (WLAN AP), cellular phones, cordless phones, communication systems, radar systems or the like.

In an alternative embodiment, the RF switch configuration can be expanded to include additional transistors and control circuits for switching between additional ports, e.g., additional antenna, TX and RX ports. A switch matrix can be used, such as an N×M matrix of elements, wherein each element is implemented as a single NMOS transistor, an L series shunt combination, or a T or PI combination. Any of these combinations can be implemented as a complementary switch, comprising NMOS and PMOS. It will be appreciated that various modifications and variations can be designed. For example, different peripheral components and control circuits can be used.

As described supra, the SPDT switch comprises three external terminals (i.e. pins or ports): Antenna, TX and RX. In one embodiment, for each of the terminals (pins) there are one or more parallel and/or series bond wires that connect the external pins to the internal on die SPDT terminals (i.e. bonding pads). In one embodiment, the bond wires measure a nominal 0.7 mil in diameter and made of copper or gold. The bond wires function not only connect the internal circuitry on the semiconductor die to the external pins of the device package but also function tune out or offset the capacitance of the transistors. The one or more bond wires per pin exhibit a relatively high Q factor which contributes to a lower insertion loss for the connection. The particular die position and the number of parallel bond wires used is adapted so as to tune out the NMOS switch input capacitance, thus simplifying the external matching network and achieving a lower insertion loss for the switch. This is described in more detail infra.

In particular, the one or more bond wires coupling the external TX pin to the semiconductor die is operative to tune out the capacitance of the drain of NMOS transistor Q. The one or more bond wires coupling the external antenna pin to the semiconductor die is operative to tune out the capacitance of the source of NMOS transistor Q. The one or more bond wires coupling the external RX pin to the semiconductor die is operative to tune out the capacitance of the drains of NMOS transistor Q. The combination of the bonding wire and external PCB based shunt capacitor form a matching network disposed between the TX, RX and antenna and the switching transistor Q.

At each junction the circuit sees either twice the drain capacitance or twice the source capacitance. Due to the relatively large area of the NMOS devices (e.g., on the order of 1 mm wide), this capacitance is on the order of 0.5 to 1.5 pF. In order to tune out this capacitance as seen at the input ports, the inductance presented by the bond wire (one or more in parallel and/or series) in combination with the PCB copper traces is adapted to resonate and form a tuned circuit in the range of desired frequencies. The off-chip external parallel shunt capacitor on the PCB functions, in combination with the inductance of the bond wires to present a matching 50 Ohms impedance to the TX, RX and antenna ports. Note that the bond wires are typically part of a package (e.g., quad, flat, no leads or QFN) having a diameter of 0.7 to 1 mils and constructed from gold, copper or aluminum.

Figure 36:
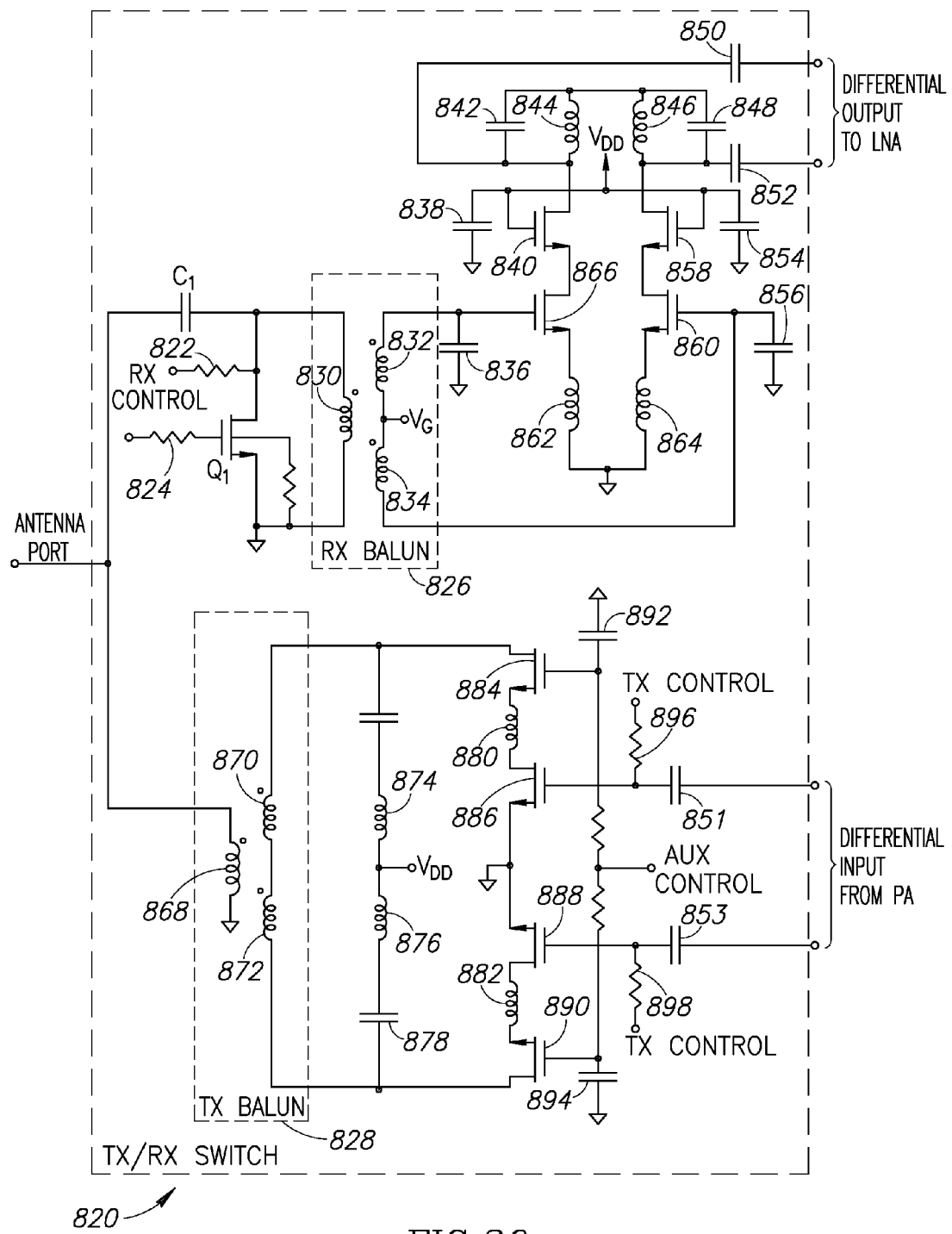
FIG. 36 is a schematic diagram illustrating a second example TX/RX switch.

A schematic diagram illustrating a second example TX/RX switch is shown in FIG. 36. The switch includes integrated TX and RX baluns and a common TX/RX single ended antenna port. A combination of a high pass filter and a shunt NMOS switch Q1 enable relatively high TX/RX isolation and low chip area. The switch, generally referenced 820, comprises transmit portion for coupling a differential input from a power amplifier to an antenna and a receive portion for coupling a signal received on the antenna to a differential output to a low noise amplifier (LNA) circuit. The transmit portion comprises capacitors 851, 853, 873, 878, 892, 894, inductors 880, 882, 874, 876, TX balun 828 including transformer windings 868, 870, 872, transistors 884, 886, 888, 890 and resistors 891, 893, 896, 898. The receive portion comprises capacitors C1, 836, 838, 842, 848, 854, 856, 850, 852, inductors 862, 864, 844, 846, RX balun 826 including transformer windings 830, 832, 834, transistors Q1, 866, 860, 840, 858 and resistors 822, 824, 823.

Operation of the switch includes applying appropriate control signals to the RX control input and the TX control inputs. To place the TX/RX switch in receive mode, the RX control is configured to turn Q1 off and the TX control is configured to turn transistors 886, 888 off. Turning Q1 off permits the receive signal from the antenna to pass through the RX balun 826 to differential transistor pair 866, 860. The differential signal generated is output to the LNA circuit (134 in FIG. 2 for example).

To place the TX/RX switch in transmit mode, the RX control is configured to turn Q1 on and the TX control is configured to turn transistors 886, 888 on. Turning Q1 on blocks the transmit signal from entering the receive circuit path. The differential signal input from the power amplifier is input to transistors 886, 888 and subsequently applied to the TX balun 828 whose output is input to the antenna port.

Figure 37:
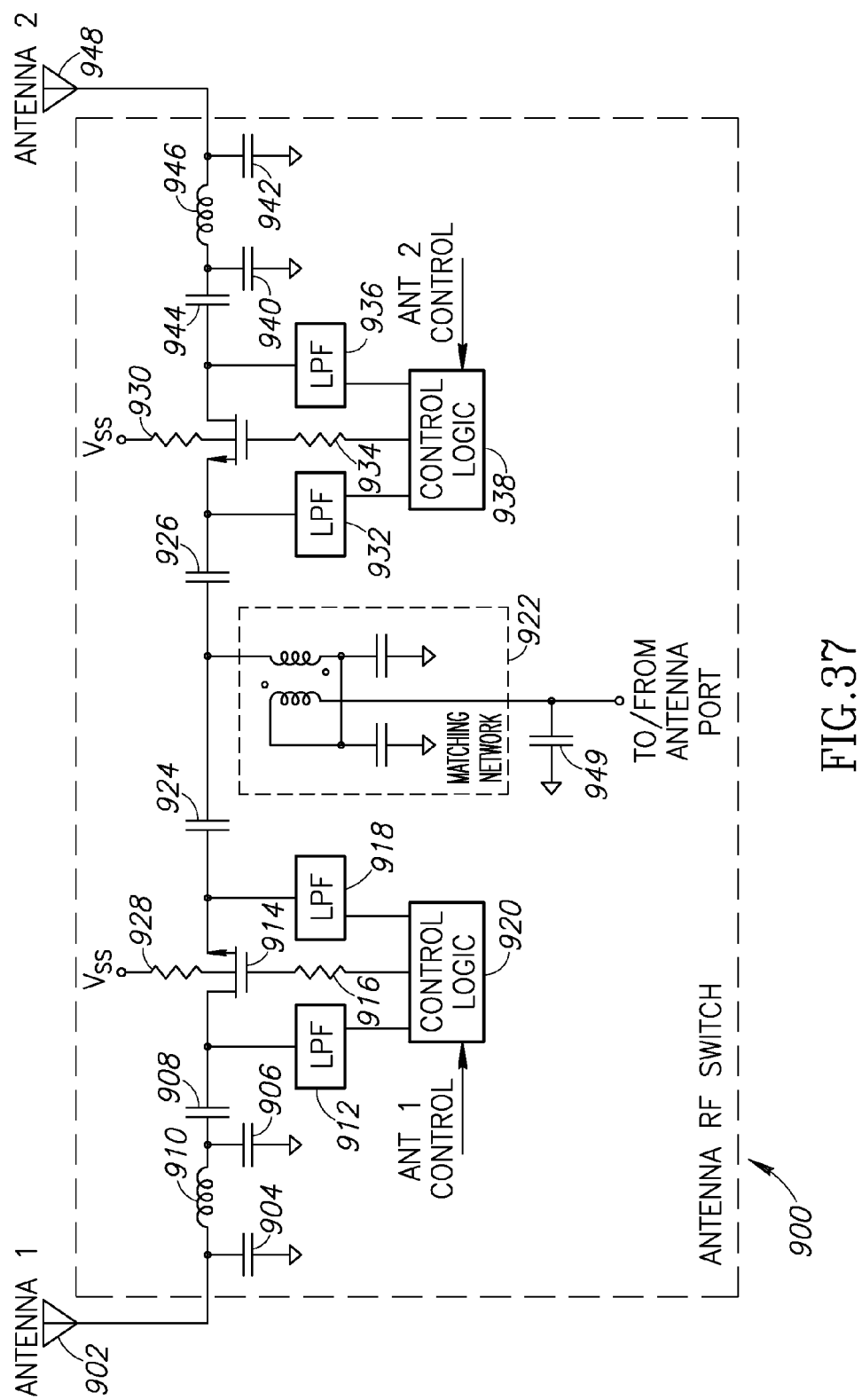
FIG. 37 is a schematic diagram illustrating an example antenna RF switch.

A schematic diagram illustrating an example antenna RF switch is shown in FIG. 37. The antenna switch, generally referenced 900, comprises two antenna ports for coupling an antenna port to antenna 1 902 and antenna 2 948 to achieve antenna diversity. In single antenna applications, one of the NMOS switches is disabled thus achieving lower insertion loss. The switch comprises capacitors 904, 906, 908, 924, 926, 944, 946, 940, 942, 949, matching network 922 including capacitors 923, 925 and transformer 927, low pass filters 912, 918, 932, 936, inductors 910, 946, transistors 914, 931, control logic blocks 920, 938 and resistors 916, 928, 930, 934.

In operation, the control logic blocks configure transistor switches 914, 931 to couple the antenna port to either antenna 1 or antenna 2 at any one time. To couple antenna 1 to the antenna port, the control logic block 920, via an antenna 1 control signal, turns transistor 914 on and the control logic block 938, via an antenna 2 control signal, turns transistor 931 off. To couple antenna 2 to the antenna port, the control logic block 920, via an antenna 1 control signal, turns transistor 914 off and the control logic block 938, via an antenna 2 control signal, turns transistor 931 on. The low pass filters 912, 918, 932, 936 and control logic blocks 920, 932 operate similarly to the low pass filters 490 and control logic block 494 of the TX/RX switch of FIG. 35.

Figure 38:
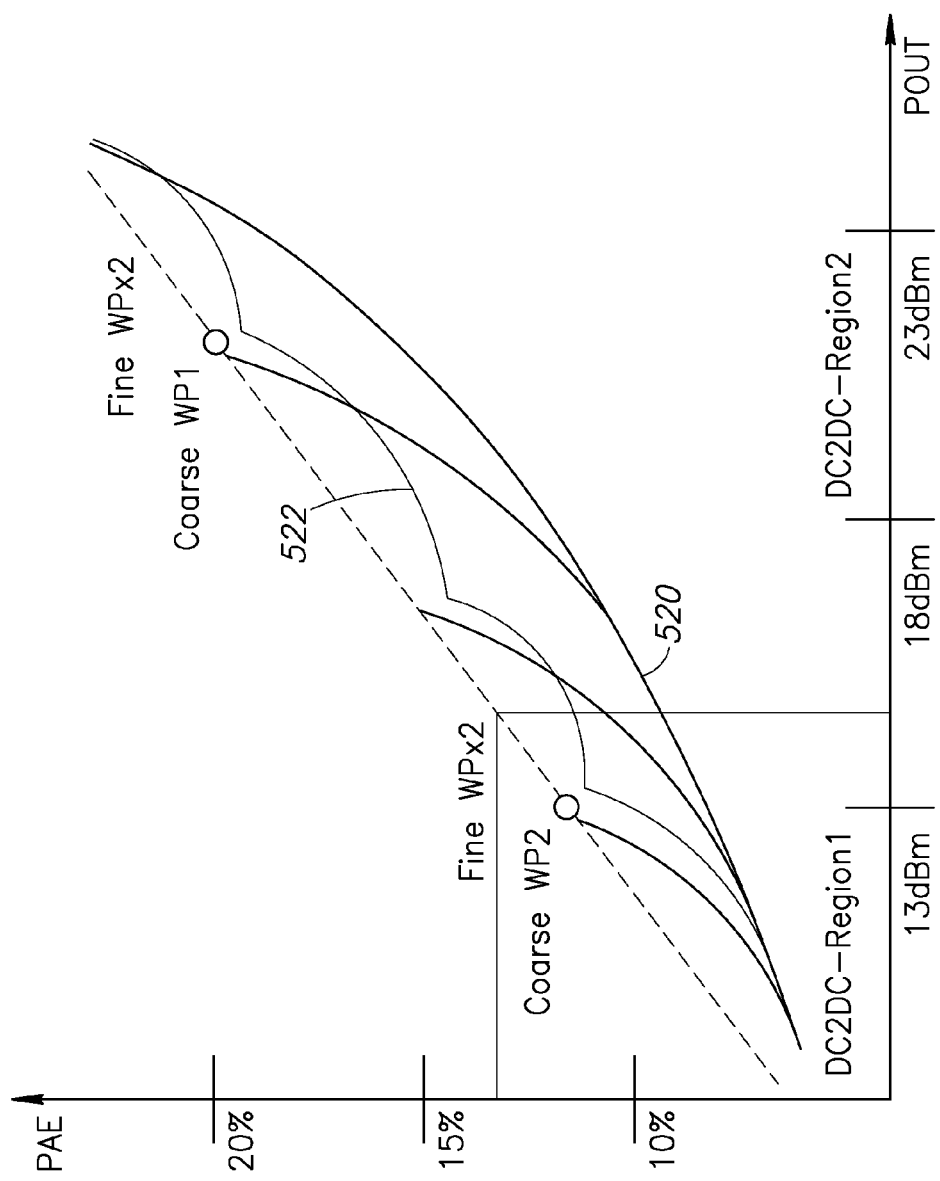
FIG. 38 is a graph illustrating the power added efficiency (PAE) as a function of output power.

A graph illustrating the power added efficiency (PAE) as a function of output power is shown in FIG. 38. Trace 520 represents the PAE versus output power for a traditional power amplifier operating at various coarse and fine working backoff points. Trace 522 represents the PAE versus output power for the power amplifier and FEM circuit of the present invention effectively exhibiting multiple backoff points by employing the high/low sub-amplifier technique in combination with a synchronous DC-DC converter and trim cell based envelope tracking system.

Figure 39:
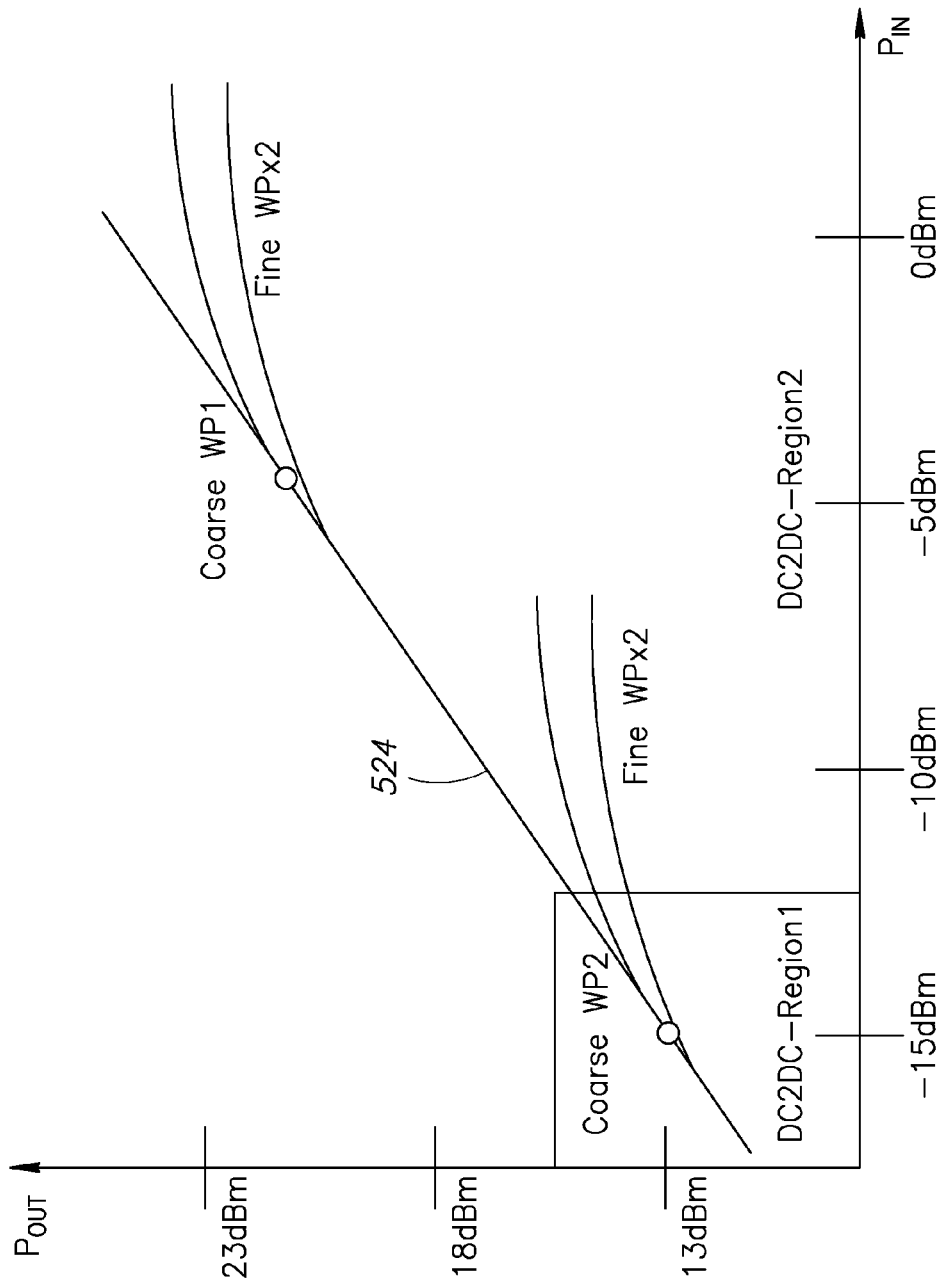
FIG. 39 is a graph illustrating the output power as a function of input power.

A graph illustrating the output power as a function of input power is shown in FIG. 39. Trace 524 represents output power versus input power with multiple DC2DC working regions, coarse and fine working points selected in accordance with average input power via the envelope tracking system described supra.

A graph illustrating the AM2AM and AM2PM response of the power amplifier circuit is shown in FIG. 40.

Figure 42:
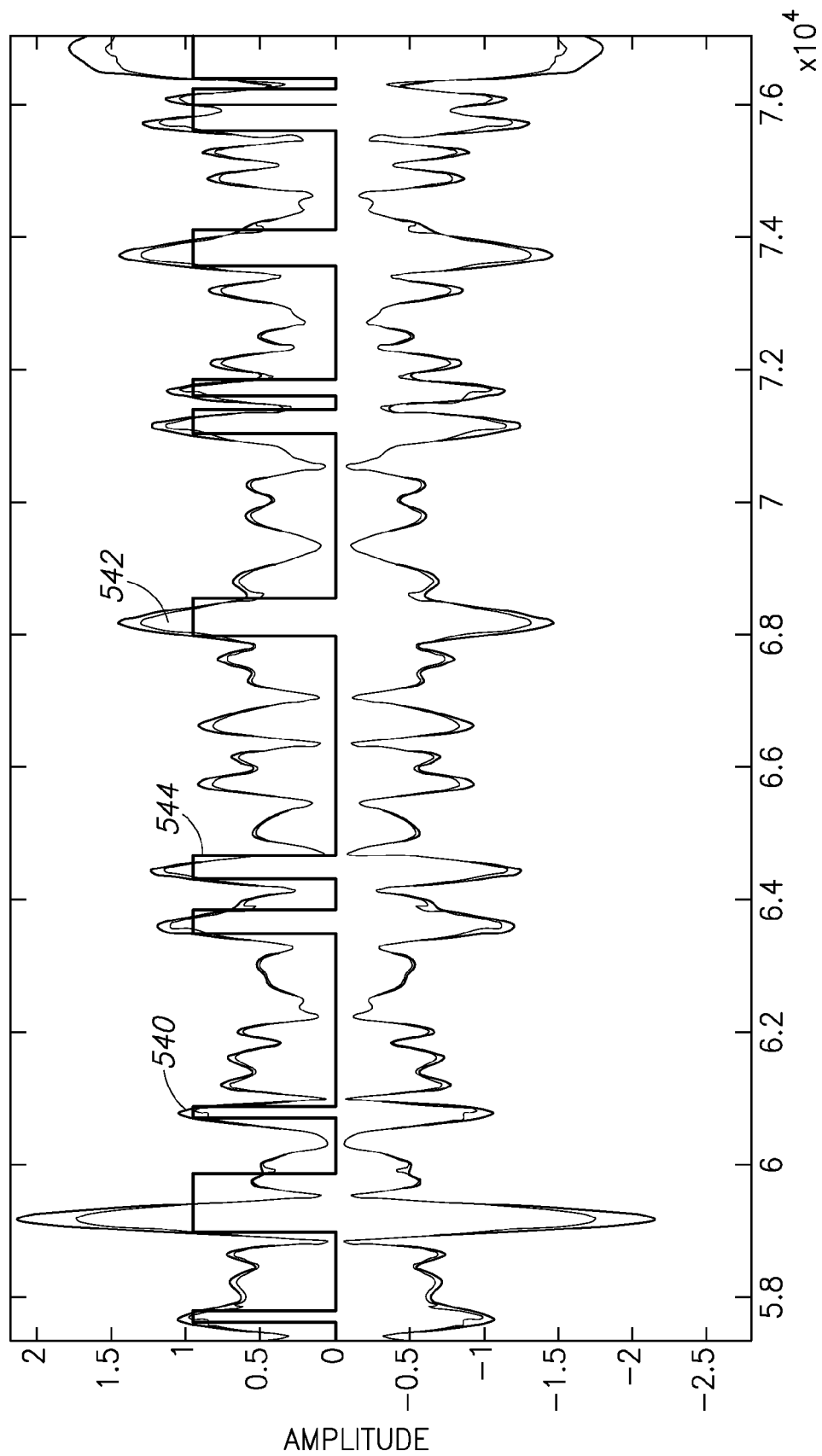
FIG. 42 is a graph illustrating the RF signal before and after power amplifier backoff dynamic backoff working regions.

A graph illustrating the RF signal before and after power amplifier backoff dynamic backoff working regions is shown in FIG. 42. Trace 540 represents the example RF signal at the input to the power amplifier of the present invention. Trace 542 represents the RF signal after the power amplifier. Trace 544 represents the dynamic backoff regions employed in an example embodiment.

Figure 43:
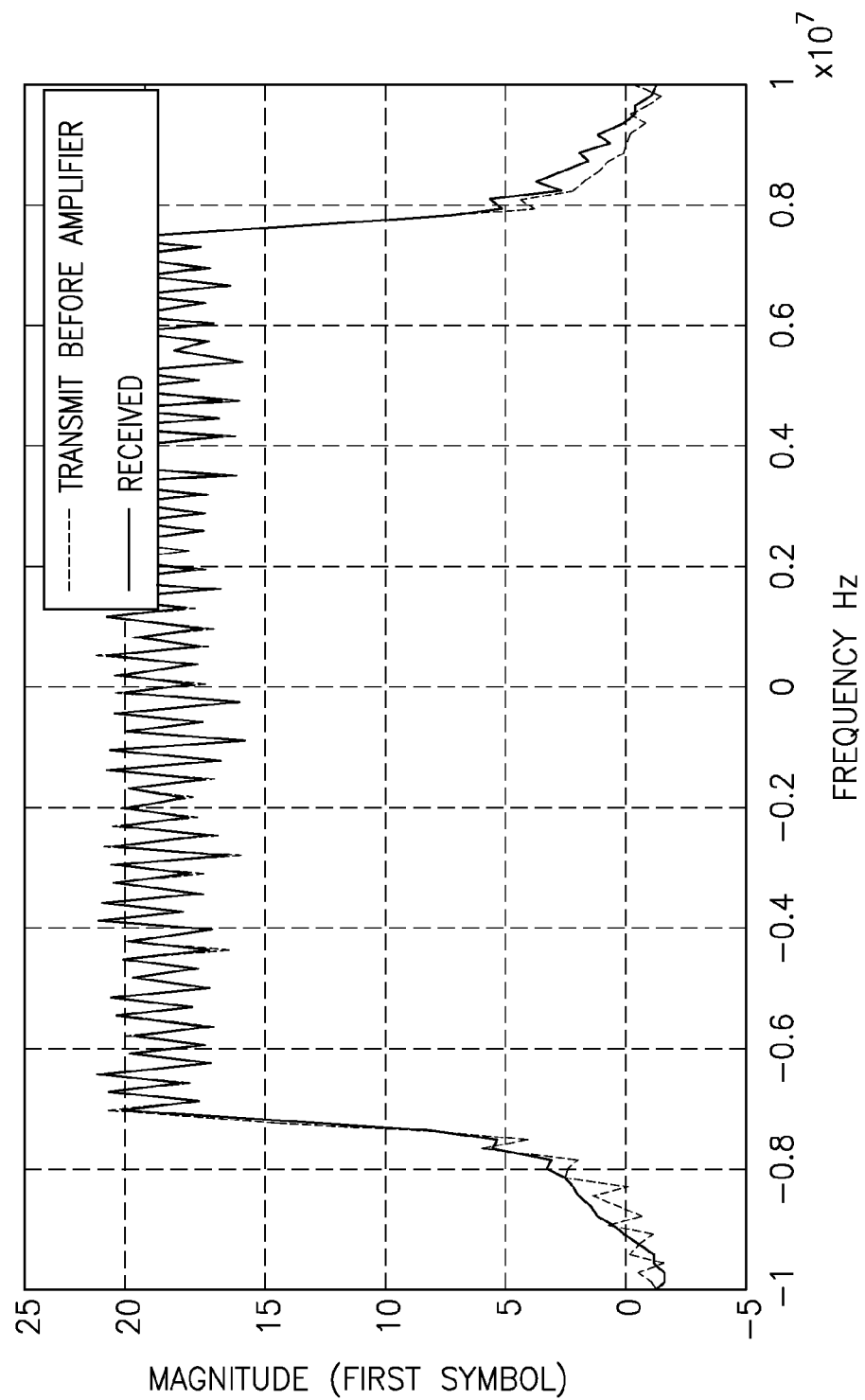
FIG. 43 is a graph illustrating the spectrum of the power amplifier for QAM64.
Figure 44:
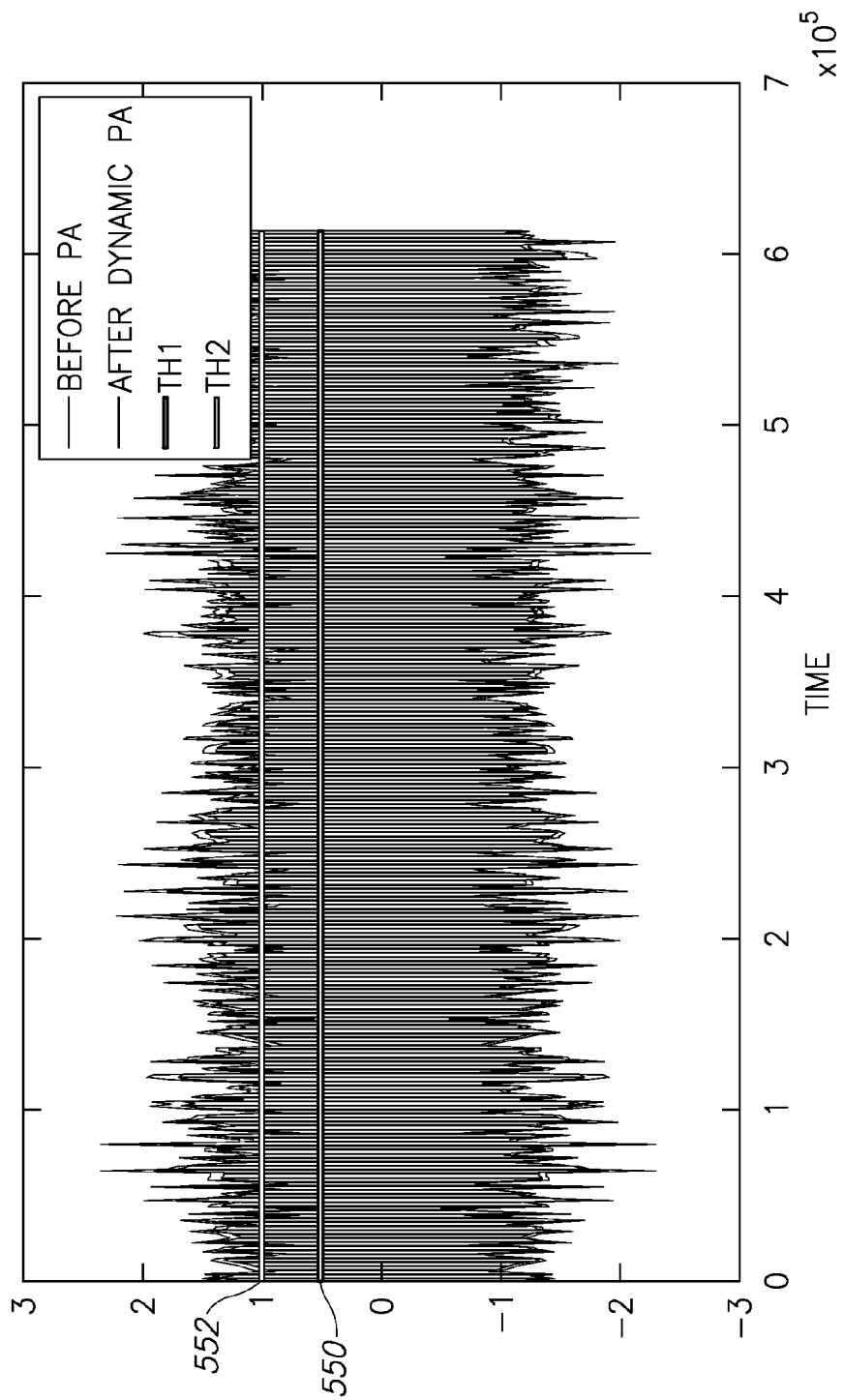
FIG. 44 is a graph illustrating the time domain RF OFDM signal before and after dynamic backoff for QAM64.
Figure 45:
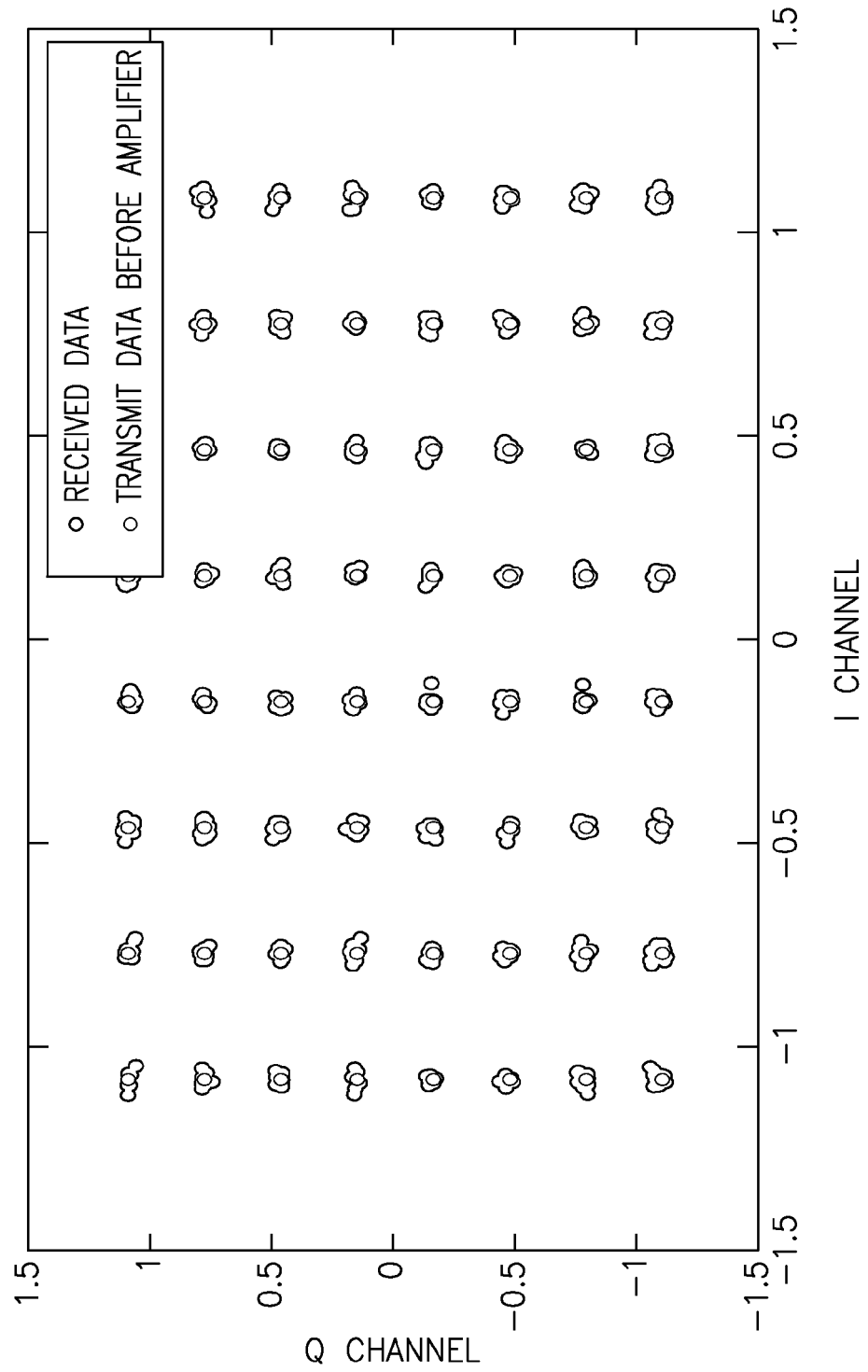
FIG. 45 is a graph illustrating the receive and transmit constellation for QAM64.

A graph illustrating the spectrum of the power amplifier for QAM64 is shown in FIG. 43. The dashed trace represents the transmit signal before the power amplifier while the solid trace represents the received signal. A graph illustrating the time domain RF OFDM signal before and after dynamic backoff for QAM64 is shown in FIG. 44. The thin solid line represents the signal before the power amplifier while the bold solid line represents the signal after the dynamic backoff power amplifier. The bolded double line represents the first backoff threshold TH1 while the thin double line represents the second backoff threshold TH2. A graph illustrating the receive and transmit constellation for QAM64 is shown in FIG. 45. The thin dots represent the transmitted data before the power amplifier while the bold dots represent the received data.

Figure 46:
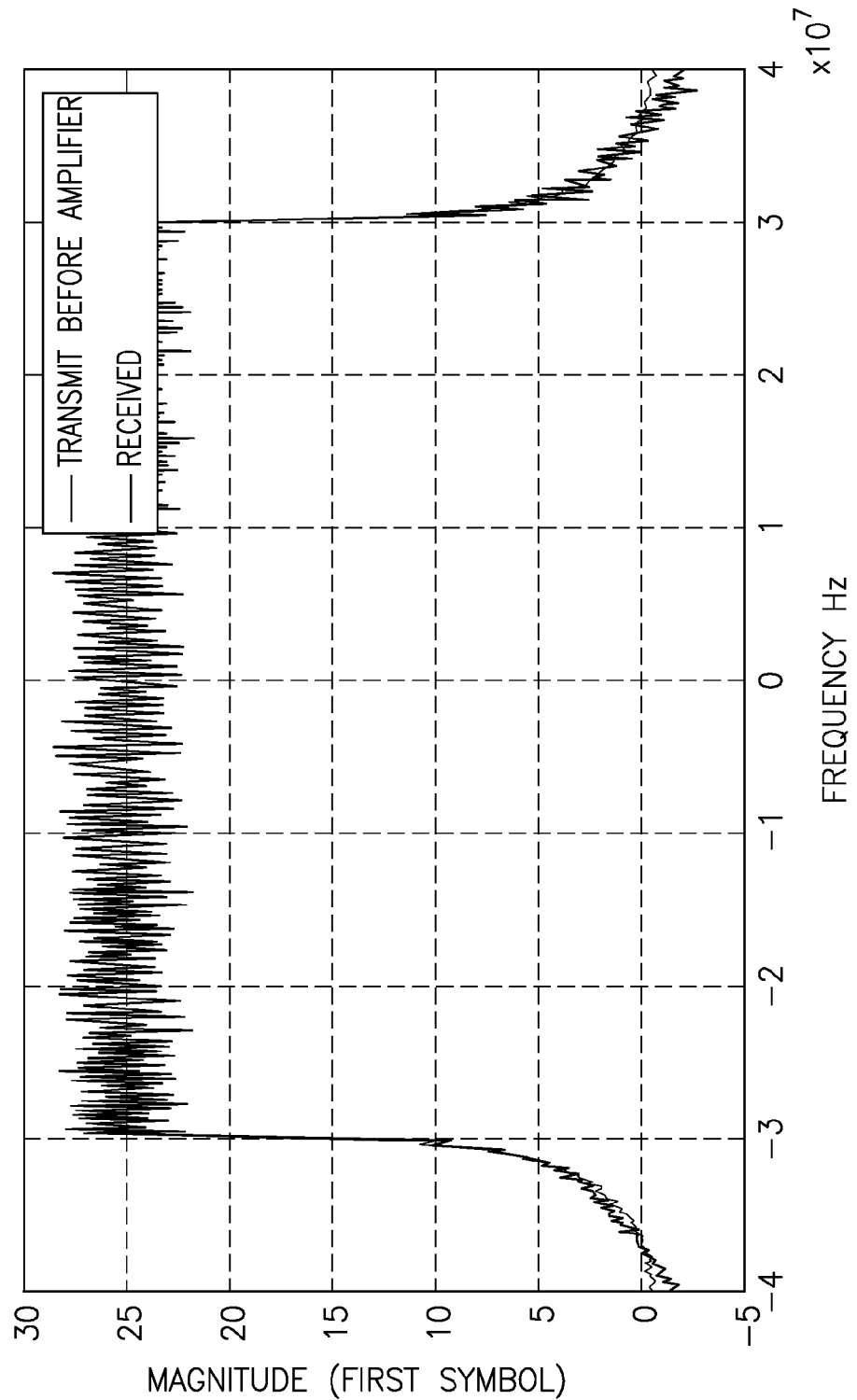
FIG. 46 is a graph illustrating the spectrum of the power amplifier for QAM256.
Figure 47:
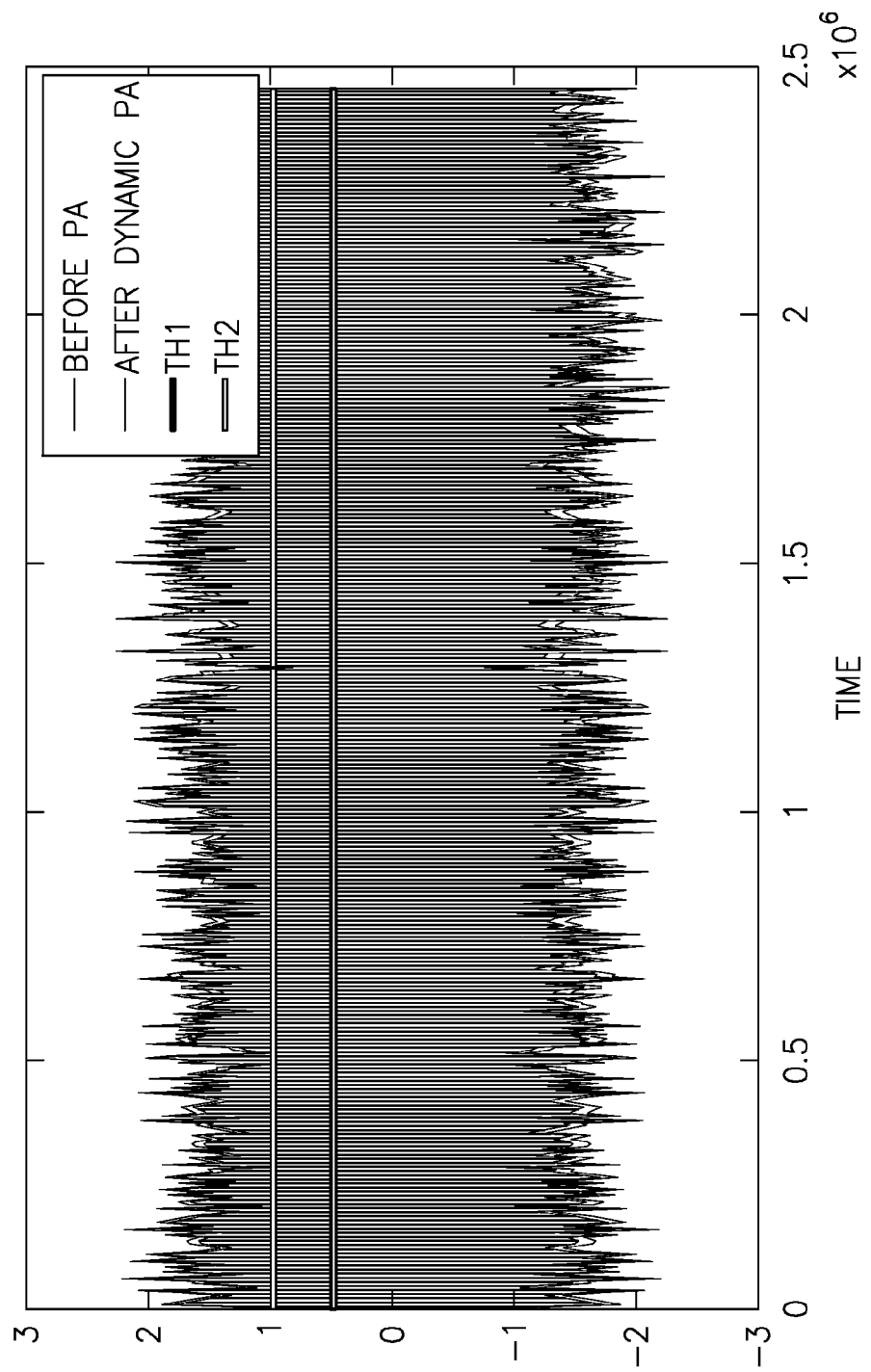
FIG. 47 is a graph illustrating the time domain RF OFDM signal before and after dynamic backoff for QAM256.
Figure 48:
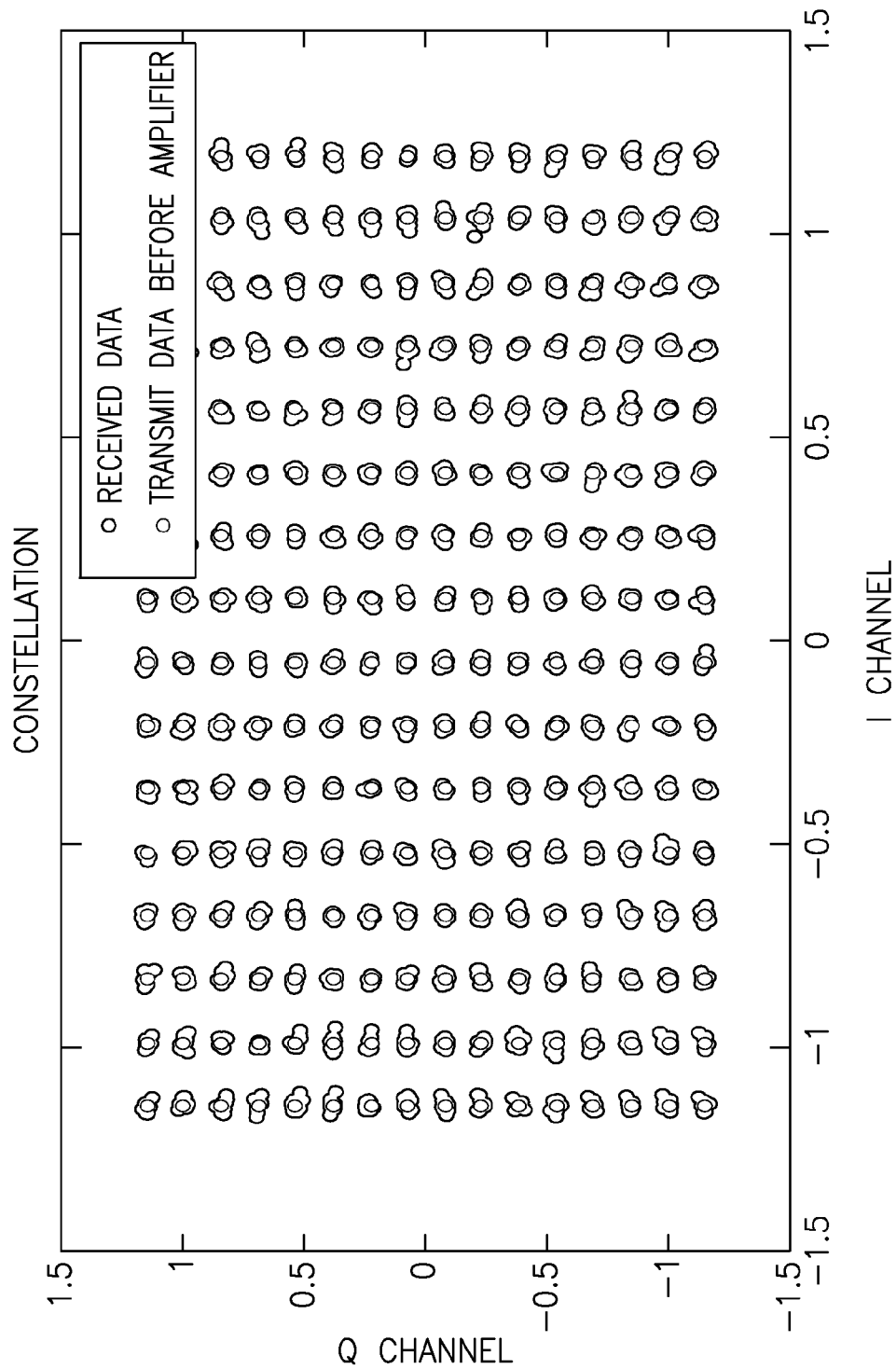
FIG. 48 is a graph illustrating the receive and transmit constellation for QAM256.

A graph illustrating the spectrum of the power amplifier for QAM256 is shown in FIG. 46. The dashed trace represents the transmit signal before the power amplifier while the solid trace represents the received signal. A graph illustrating the time domain RF OFDM signal before and after dynamic backoff for QAM256 is shown in FIG. 47. The thin solid line represents the signal before the power amplifier while the bold solid line represents the signal after the dynamic backoff power amplifier. The bolded double line represents the first backoff threshold TH1 while the thin double line represents the second backoff threshold TH2. A graph illustrating the receive and transmit constellation for QAM256 is shown in FIG. 48. The thin dots represent the transmitted data before the power amplifier while the bold dots represent the received data.

Figure 49:
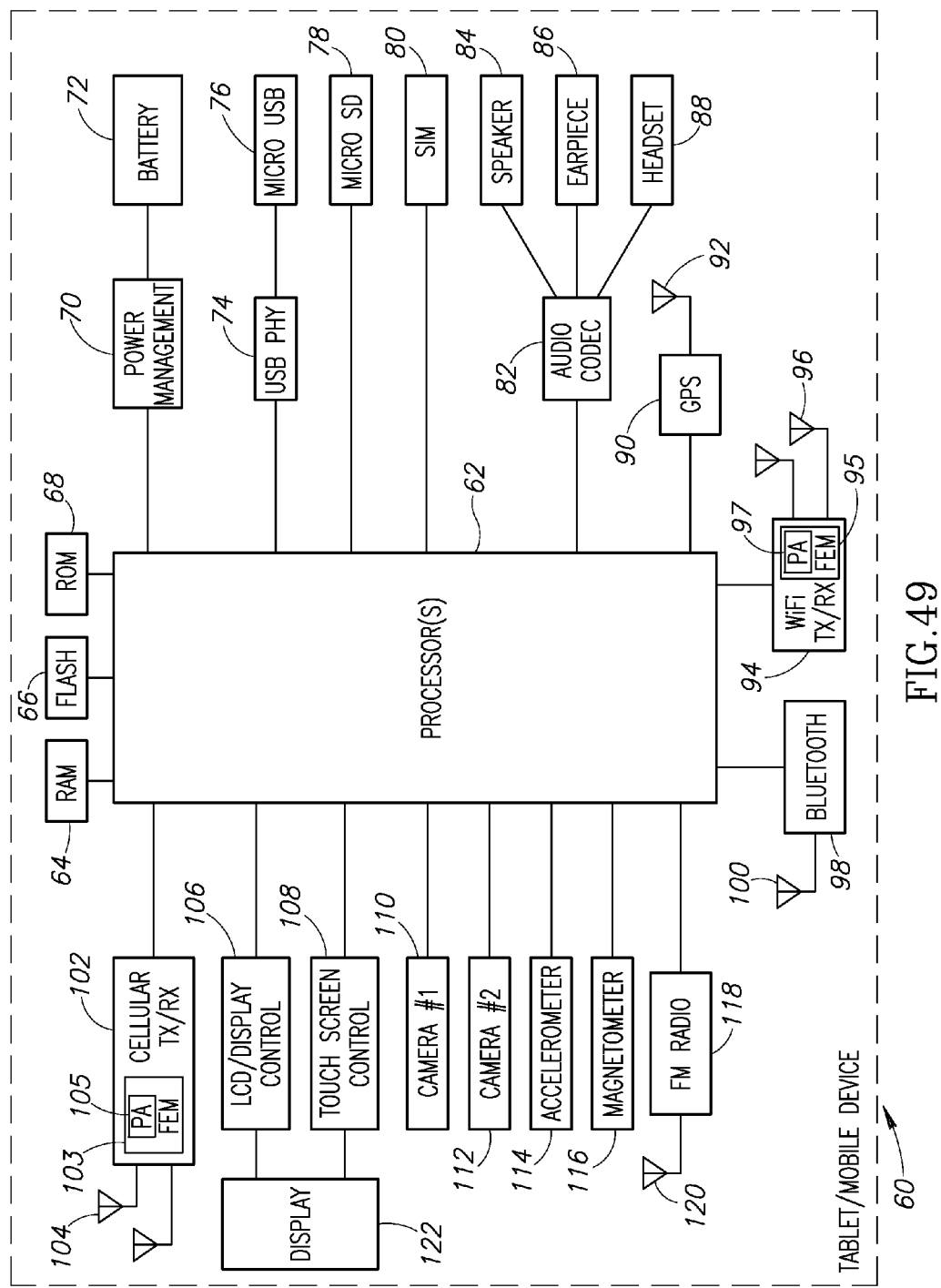
FIG. 49 is a high level block diagram illustrating an example wireless device incorporating the FEM circuit of the present invention.

A high level block diagram illustrating an example wireless device incorporating the FEM circuit of the present invention is shown in FIG. 49. The tablet/mobile device is preferably a two-way communication device having voice and/or data communication capabilities. In addition, the device optionally has the capability to communicate with other computer systems via the Internet. Note that the device may comprise any suitable wired or wireless device such as multimedia player, mobile communication device, cellular phone, cordless phone, smartphone, PDA, PNA, Bluetooth device, tablet computing device such as the iPad, Galaxy, etc. For illustration purposes only, the device is shown as a mobile device, such as a cellular based telephone, cordless phone, smartphone or superphone. Note that this example is not intended to limit the scope of the mechanism as the invention can be implemented in a wide variety of communication devices. It is further appreciated the mobile device shown is intentionally simplified to illustrate only certain components, as the mobile device may comprise other components and subsystems beyond those shown.

The mobile device, generally referenced 60, comprises one or more processors 62 which may comprise a baseband processor, CPU, microprocessor, DSP, etc., optionally having both analog and digital portions. The mobile device may comprise a plurality of radios 102 (e.g., cellular, cordless phone, etc.), FEM circuit 103 with power amplifier 105 constructed in accordance with the present invention and associated one or more antennae 104. Radios for the wireless link and any number of other wireless standards and Radio Access Technologies (RATs) may be included. Examples include, but are not limited to, Digital Enhanced Cordless Telecommunications (DECT), Code Division Multiple Access (CDMA), Personal Communication Services (PCS), Global System for Mobile Communication (GSM)/GPRS/EDGE 3G; WCDMA; WiMAX for providing WiMAX wireless connectivity when within the range of a WiMAX wireless network; Bluetooth for providing Bluetooth wireless connectivity when within the range of a Bluetooth wireless network; 802.11 WLAN for providing wireless connectivity when in a hot spot or within the range of an ad hoc, infrastructure or mesh based wireless LAN (WLAN) network; near field communications; UWB; GPS receiver for receiving GPS radio signals transmitted from one or more orbiting GPS satellites, FM transceiver provides the user the ability to listen to FM broadcasts as well as the ability to transmit audio over an unused FM station at low power, such as for playback over a car or home stereo system having an FM receiver, digital broadcast television, etc.

The mobile device may also comprise internal volatile storage 64 (e.g., RAM) and persistent storage 68 (e.g., ROM) and flash memory 66. Persistent storage 68 also stores applications executable by processor(s) 62 including the related data files used by those applications to allow device 60 to perform its intended functions. Several optional user-interface devices include trackball/thumbwheel which may comprise a depressible thumbwheel/trackball that is used for navigation, selection of menu choices and confirmation of action, keypad/keyboard such as arranged in QWERTY fashion for entering alphanumeric data and a numeric keypad for entering dialing digits and for other controls and inputs (the keyboard may also contain symbol, function and command keys such as a phone send/end key, a menu key and an escape key), headset 88, earpiece 86 and/or speaker 84, microphone(s) and associated audio codec or other multimedia codecs, vibrator for alerting a user, one or more cameras and related circuitry 110, 112, display(s) 122 and associated display controller 106 and touchscreen control 108. Serial ports include a micro USB port 76 and related USB PHY 74 and micro SD port 78. Other interface connections may include SPI, SDIO, PCI, USD, etc. for providing a serial link to a user's PC or other device. SIM/RUIM card 80 provides the interface to a user's SIM or RUIM card for storing user data such as address book entries, user identification, etc.

Portable power is provided by the battery 72 coupled to power management circuitry 70. External power is provided via USB power or an AC/DC adapter connected to the power management circuitry which is operative to manage the charging and discharging of the battery. In addition to a battery and AC/DC external power source, additional optional power sources each with its own power limitations, include: a speaker phone, DC/DC power source, and any bus powered power source (e.g., USB device in bus powered mode).

Operating system software executed by the processor 62 is preferably stored in persistent storage (i.e. ROM 68), or flash memory 66, but may be stored in other types of memory devices. In addition, system software, specific device applications, or parts thereof, may be temporarily loaded into volatile storage 64, such as random access memory (RAM). Communications signals received by the mobile device may also be stored in the RAM.

The processor 62, in addition to its operating system functions, enables execution of software applications on the device 60. A predetermined set of applications that control basic device operations, such as data and voice communications, may be installed during manufacture. Additional applications (or apps) may be downloaded from the Internet and installed in memory for execution on the processor. Alternatively, software may be downloaded via any other suitable protocol, such as SDIO, USB, network server, etc.

Other components of the mobile device include an accelerometer 114 for detecting motion and orientation of the device, magnetometer 116 for detecting the earth's magnetic field, FM radio 118 and antenna 120, Bluetooth radio 98 and antenna 100, 802.11 (including standards 'a', 'b', 'g', 'n', 'ac' for example) based Wi-Fi radio 94 (including FEM circuit 95 with power amplifier 97 constructed in accordance with the present invention and one or more antennae 96) and GPS 90 and antenna 92.

In accordance with the invention, the mobile device 60 is adapted to implement the electronic catalog system as hardware, software or as a combination of hardware and software. In one embodiment, implemented as a software task, the program code operative to implement the electronic catalog system is executed as one or more tasks running on processor 62 and either (1) stored in one or more memories 64, 66, 68 or (2) stored in local memory within the processor 62 itself.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A transmit/receive switch, comprising:
    a transmit (TX) port that belongs to a chip, wherein the TX port is for coupling to a radio frequency (RF) transmit signal provided from a power amplifier of the chip;
    a receive (RX) port that belongs to the chip, wherein the RX port is for outputting to a low noise amplifier of the chip an RF receive signal ;
    an antenna port that belongs to the chip for coupling to an antenna that is external to the chip;
    an inductance that is coupled in series with said antenna port and said RX port; wherein the inductance comprises a wire bond that is connected to a dummy pad of the chip; wherein the wire bond has a wire bond inductance that is utilized by the transmit/receive switch when operating in a transmit mode and when operating in a receive mode; and
    a series combination of capacitance and a field effect transistor (FET) switch coupled in parallel across said inductance, wherein said FET switch having source, drain and gate terminals, the gate terminal operative to receive a control signal for controlling said FET switch.

2. The transmit/receive switch according to claim 1, wherein said switch is rendered conductive in the transmit mode thereby establishing a high impedance parallel resonant circuit of said inductance and said capacitance.

3. The transmit/receive switch according to claim 1, wherein the RF transmit signal is blocked from said RX port by operation of a high impedance parallel resonant circuit of said inductance and said capacitance when said switch is rendered conductive in the transmit mode.

4. The transmit/receive switch according to claim 1, wherein said switch is rendered nonconductive in the receive mode thereby coupling said antenna port and said receive port through said inductance.

5. The transmit/receive switch according to claim 1, further comprising a resistance in series between said transmit port and said antenna port.

6. The transmit/receive switch according to claim 1, wherein said FET switch is fabricated using a semiconductor technology selected from the group consisting of complementary metal oxide semiconductor (CMOS), Gallium Arsenide (GaAs), Silicon Germanium (SiGe) and Gallium Nitride (GaN).

7. The transmit/receive switch according to claim 1, wherein said transmit/receive switch is adapted to transmit and receive signals conforming to a wireless standard selected from the group consisting of 802.11 WLAN, LTE, WiMAX, HDTV, 3G cellular, 4G cellular and DECT.

8. A transmit/receive switch, comprising:
    a transmit (TX) port for coupling to a radio frequency (RF) transmit signal;
    a receive (RX) port for coupling to an RF receive signal;
    an antenna port for coupling to an antenna;
    a first transformer balun operative to couple the RF receive signal from said antenna port to said RX port;
    a capacitance in series with said first transformer balun;
    a field effect transistor (FET) switch coupled in parallel across a primary winding of said first transformer balun; and
    a second transformer balun operative to couple the RF transmit signal from said TX port to said antenna port.

9. The transmit/receive switch according to claim 8, wherein said FET switch is rendered conductive in a transmit mode thereby grounding the input to a low noise amplifier (LNA) coupled to said RX port.

10. The transmit/receive switch according to claim 8, wherein said FET switch is rendered conductive in a transmit mode thereby transferring said RF transmit signal from said TX port to said antenna port while blocking the RF transmit signal from said entering said RX port.

11. The transmit/receive switch according to claim 8, wherein said FET switch is rendered conductive in a transmit mode whereby the combined impedance of said capacitance, said FET switch in a conductive state and the reflected impedance of a low noise amplifier (LNA) coupled to said RX port presents a relatively high impedance to said RF transmit signal.

12. The transmit/receive switch according to claim 8, further comprising a matching network coupled between said TX port and a power amplifier circuit.

13. The transmit/receive switch according to claim 8, further comprising a matching network coupled between said RX port and a low noise amplifier.

14. The transmit/receive switch according to claim 8, wherein said FET switch is rendered nonconductive in a receive mode thereby coupling said antenna port and said receive port through said first transformer balun.

15. The transmit/receive switch according to claim 8, further comprising a tuned tank circuit coupled to said first transformer balun for impedance matching to a low noise amplifier (LNA) coupled to said RX port.

16. The transmit/receive switch according to claim 8, wherein said transmit/receive switch is fabricated using a semiconductor technology selected from the group consisting of complementary metal oxide semiconductor (CMOS), Gallium Arsenide (GaAs), Silicon Germanium (SiGe) and Gallium Nitride (GaN).

17. The transmit/receive switch according to claim 8, wherein said transmit/receive switch is adapted to transmit and receive signals conforming to a wireless standard selected from the group consisting of 802.11 WLAN, LTE, WiMAX, HDTV, 3G cellular, 4G cellular and DECT.

18. A transmit/receive switch, comprising: a transmit (TX) port that belongs to a chip, wherein the TX port is for coupling to a radio frequency (RF) transmit signal provided from a power amplifier of the chip; a receive (RX) port that belongs to the chip, wherein the RX port is for outputting to a low noise amplifier of the chip an RF receive signal; an antenna port that belongs to the chip for coupling to an antenna that is external to the chip; an inductance that is coupled in series with said antenna port and said RX port; wherein the inductance comprises a wire bond that is connected to a dummy pad of the chip; wherein the wire bond has a wire bond inductance that is forms with the capacitance a parallel resonant circuit when the transmit/receive switch operates in a transmit mode; and a series combination of capacitance and a field effect transistor (FET) switch coupled in parallel across said inductance, wherein said FET switch having source, drain and gate terminals, the gate terminal operative to receive a control signal for controlling said FET switch.

\* \* \* \* \*